(12) United States Patent
Masuoka et al.

(10) Patent No.: US 8,642,426 B2
(45) Date of Patent: Feb. 4, 2014

(54) SEMICONDUCTOR DEVICE AND PRODUCTION METHOD THEREFOR

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

(*) Notice: Subject to any disclaimer, the term of this patent is extended or adjusted under 35 U.S.C. 154(b) by 0 days.

(21) Appl. No.: 13/534,615

(22) Filed: Jun. 27, 2012

(65) Prior Publication Data

US 2012/0264265 A1    Oct. 18, 2012

Related U.S. Application Data

(62) Division of application No. 12/729,977, filed on Mar. 23, 2010, now Pat. No. 8,319,293.

(60) Provisional application No. 61/211,737, filed on Apr. 2, 2009.

(30) Foreign Application Priority Data

Mar. 25, 2009   (JP) ................................ 2009-073973

(51) Int. Cl.
  *H01L 21/336*   (2006.01)
  *H01L 21/8238*  (2006.01)
  *H01L 21/8249*  (2006.01)
  *H01L 21/31*    (2006.01)
  *H01L 21/469*   (2006.01)

(52) U.S. Cl.
  USPC ........... 438/268; 438/199; 438/783; 438/234; 438/200

(58) Field of Classification Search
  USPC ......... 438/268, 199–204, 233, 289, 206, 156, 438/212, 231, 300, 153, 188, 783, 163, 234
  See application file for complete search history.

(56) References Cited

U.S. PATENT DOCUMENTS 4,670,768 A  *  6/1987  Sunami et al. ................. 257/331
5,427,962 A      6/1995  Sasaki et al.
(Continued)

FOREIGN PATENT DOCUMENTS

EP    0 020 929 A1    1/1981
EP    0 334 927 B1   12/1993
(Continued)

OTHER PUBLICATIONS

Chen, Yijian et al., "Vertical integrated-gate CMOS for ultra-dense IC," Microelectronic Engineering, vol. 83, 2006, pp. 1745-1748.
(Continued)

*Primary Examiner* — Chuong A. Luu
(74) *Attorney, Agent, or Firm* — Brinks Gilson & Lione

(57) ABSTRACT

It is an object to allow an inverter to be made up using a single island-shaped semiconductor, so as to provide a semiconductor device comprising a highly-integrated SGT-based CMOS inverter circuit. The object is achieved by a semiconductor device which comprises an island-shaped semiconductor layer, a first gate dielectric film surrounding a periphery of the island-shaped semiconductor layer, a gate electrode surrounding a periphery of the first gate dielectric film, a second gate dielectric film surrounding a periphery of the gate electrode, a tubular semiconductor layer surrounding a periphery of the second gate dielectric film, a first first-conductive-type high-concentration semiconductor layer disposed on top of the island-shaped semiconductor layer, a second first-conductive-type high-concentration semiconductor layer disposed underneath the island-shaped semiconductor layer, a first second-conductive-type high-concentration semiconductor layer disposed on top of the tubular semiconductor layer, and a second second-conductive-type high-concentration semiconductor layer disposed underneath the tubular semiconductor layer.

8 Claims, 55 Drawing Sheets

(56) References Cited

U.S. PATENT DOCUMENTS

| | | | |
|---|---|---|---|
| 5,480,838 A * | 1/1996 | Mitsui | 438/270 |
| 5,550,084 A | 8/1996 | Anjum et al. | |
| 5,599,725 A | 2/1997 | Dorleans et al. | |
| 5,656,842 A | 8/1997 | Iwamatsu et al. | |
| 5,696,008 A | 12/1997 | Tamaki et al. | |
| 5,773,329 A | 6/1998 | Kuo | |
| 5,994,735 A | 11/1999 | Maeda et al. | |
| 6,235,568 B1 | 5/2001 | Murthy et al. | |
| 6,323,528 B1 | 11/2001 | Yamazaki et al. | |
| 6,373,099 B1 * | 4/2002 | Kikuchi et al. | 257/331 |
| 6,461,900 B1 | 10/2002 | Sundaresan et al. | |
| 6,653,181 B2 | 11/2003 | Hergenrother et al. | |
| 6,867,084 B1 | 3/2005 | Chiu et al. | |
| 8,039,893 B2 | 10/2011 | Masuoka et al. | |
| 2001/0002715 A1 | 6/2001 | Armacost et al. | |
| 2002/0017687 A1 | 2/2002 | Yamazaki et al. | |
| 2002/0164858 A1 | 11/2002 | Sayama et al. | |
| 2005/0212063 A1 | 9/2005 | Nakano et al. | |
| 2006/0261406 A1 | 11/2006 | Chen | |
| 2008/0062756 A1 | 3/2008 | Mayor et al. | |
| 2009/0146194 A1 | 6/2009 | Moselund et al. | |
| 2009/0189222 A1 | 7/2009 | Shino | |
| 2010/0213525 A1 | 8/2010 | Masuoka et al. | |
| 2010/0219482 A1 | 9/2010 | Masuoka et al. | |
| 2010/0244140 A1 | 9/2010 | Masuoka et al. | |
| 2010/0308422 A1 | 12/2010 | Masuoka et al. | |
| 2011/0062521 A1 | 3/2011 | Masuoka et al. | |

FOREIGN PATENT DOCUMENTS

| | | |
|---|---|---|
| EP | 0 721 221 | 7/1996 |
| EP | 1 507 294 A2 | 2/2005 |
| EP | 2 061 075 | 5/2009 |
| EP | 2 234 150 A2 | 9/2010 |
| EP | 2 259 315 A2 | 12/2010 |
| EP | 2 259 315 A3 | 12/2010 |
| JP | 60-070757 A | 4/1985 |
| JP | 62-045058 A | 2/1987 |
| JP | 02-066969 A | 3/1990 |
| JP | 02-188966 A | 7/1990 |
| JP | 03-225873 A | 10/1991 |
| JP | 05-291518 | 11/1993 |
| JP | 08-051203 A | 2/1996 |
| JP | 2001-028399 A | 1/2001 |
| JP | 2004-319808 A | 11/2004 |
| JP | 2005-310921 A | 11/2005 |
| JP | 2007-250652 A | 9/2007 |
| JP | 2008-066562 A | 3/2008 |
| JP | 2008-205168 A | 9/2008 |
| JP | 2008-300558 A | 12/2008 |
| JP | 2009-038226 A | 2/2009 |
| JP | 2010-283181 A | 12/2010 |
| WO | WO 2009/057194 A1 | 5/2009 |
| WO | WO 2009/060934 | 5/2009 |
| WO | WO 2009/096464 A1 | 8/2009 |
| WO | WO 2009/096470 A1 | 8/2009 |

OTHER PUBLICATIONS

Takato, H. et al., "High Performance CMOS Surrounding Gate Transistor (SGT) for Ultra High Density LSIs," IEEE Electron Devices Meeting, Technical Digest, 1998, pp. 222-225 IEDM.

Watanabe, Shigeyoshi et al., "A Novel Circuit Technology with Surrounding Gate Transistors (SGT's) for Ultra High Density DRAM's," IEEE Journal of Solid-State Circuits, vol. 30, No. 9, Sep. 1995, pp. 960-971.

Wolf, S., "Silicon Processing for the VLSI Era," vol. 3, "The Submicron MOSFET," Lattice Press, Sunset Beach, CA, USA, 1995, Sec. 4.1.1: Basics of MOSFET Operation, pp. 136-138.

Office Action from co-pending U.S. Appl. No. 12/794,088, dated May 23, 2012, 20 pages.

Office Action from co-pending U.S. Appl. No. 12/882,698, dated Jul. 9, 2012, 29 pages.

European Search Report for European Application No. 10005813, dated May 3, 2011, 4 pages.

European Search Report for European Application No. 10009573, dated Feb. 24, 2012, 10 pages.

European Search Report for European Application No. 10003151, dated Mar. 5, 2012, 9 pages.

Korean Office Action (with English language translation) for Korean Patent Application No. KR2010-52973, dated Aug. 4, 2011, 5 pages.

Korean Office Action (with English language translation) for Korean Patent Application No. KR2010-52973, dated Nov. 22, 2011, 5 pages.

Notice of Allowance for U.S. Appl. No. 12/729,977, dated Oct. 9, 2012, 8 pages.

Office Action for U.S. Appl. No. 12/794,088, dated Oct. 15, 2012, 22 pages.

Office Action for U.S. Appl. No. 12/882,698, dated Oct. 5, 2012, 17 pages.

Office Action for U.S. Appl. No. 12/854,564, dated Apr. 23, 2013, 14 pages.

Notice of Allowance for U.S. Appl. No. 12/729,977, dated Jun. 5, 2012, 10 pages.

Office Action for U.S. Appl. No. 12/854,564, dated Dec. 4, 2012, 16 pages.

Notice of Allowance for U.S. Appl. No. 12/882,698, dated Feb. 21, 2013, 8 pages.

Search Report for European Patent Application Serial No. 10 00 8387, dated Jun. 28, 2013, 6 pages.

Notice of Allowance for U.S. Appl. No. 12/854,564, dated Jul. 10, 2013, 13 pages.

* cited by examiner

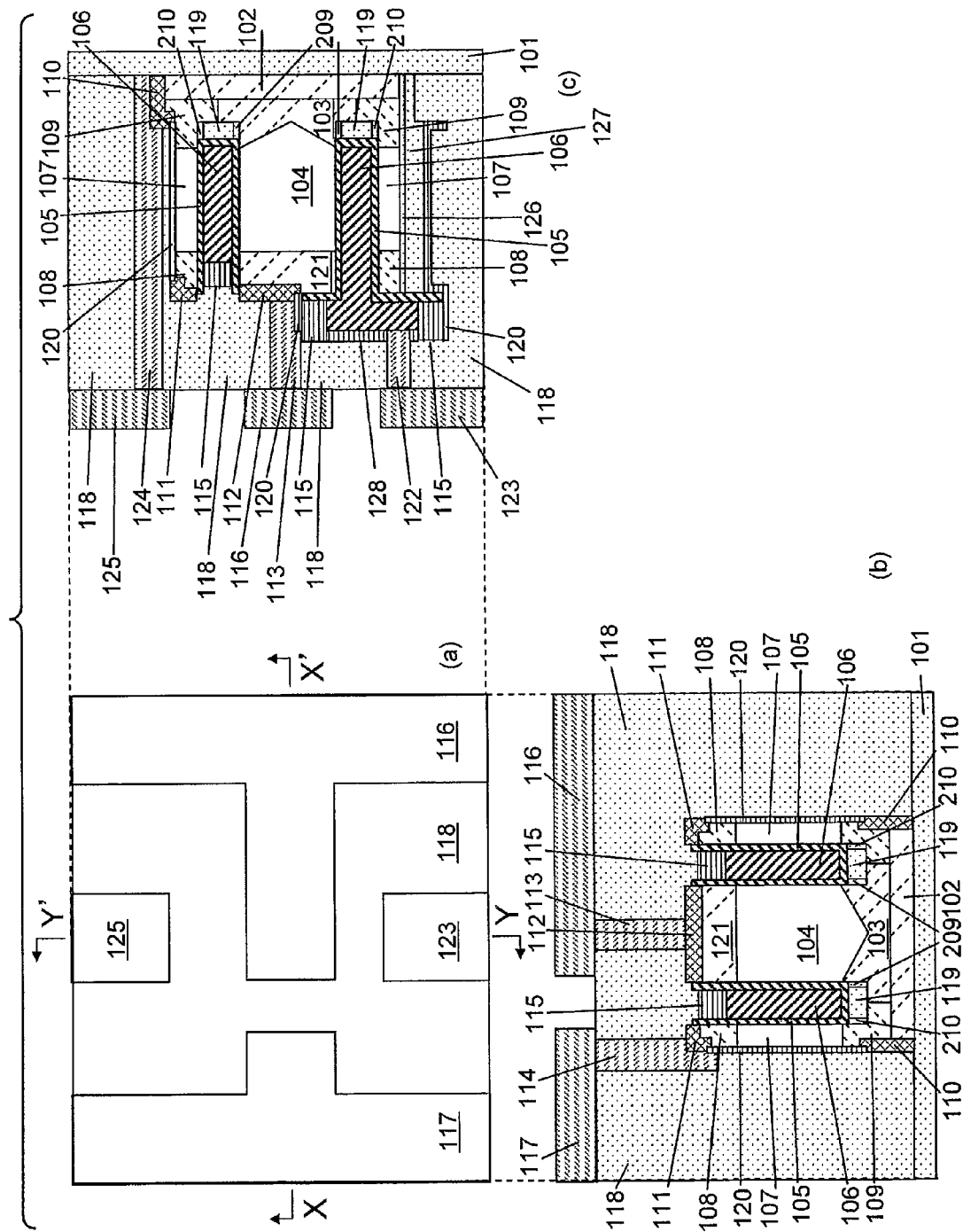

SEMICONDUCTOR DEVICE AND PRODUCTION METHOD THEREFOR

RELATED APPLICATIONS

This application is a divisional application of U.S. application Ser. No. 12/729,977 filed on Mar. 23, 2010 now U.S. Pat. No. 8,319,293, which claims the benefit of the filing date of Provisional U.S. Patent Application Ser. No. 61/211,737 filed on Apr. 2, 2009 pursuant to 35 U.S.C. §119(e), and also claims priority under 35 U.S.C. §119(a) to JP2009-073973 filed on Mar. 25, 2009. The entire contents of these applications are hereby incorporated by reference.

BACKGROUND OF THE INVENTION

1. Field of the Invention

The present invention relates to a semiconductor device.

2. Description of the Related Art

A degree of integration in a semiconductor device, particularly in an integrated circuit using a MOS transistor, has been increasing year by year. Along with the increase in the degree of integration, miniaturization of the MOS transistor used therein has progressed to a nano region. The progress in miniaturization of the MOS transistor, which constitutes an inverter circuit as a basic circuitry for digital circuits, gives rise to a problem, such as difficulty in suppressing a leak current, which causes deterioration in reliability due to hot carrier effects and poses an impediment to sufficiently reducing a circuit occupancy area while meeting a requirement of ensuring a necessary current magnitude. With a view to solving this problem, there have been proposed a surrounding gate transistor (SGT) having a structure in which a source, a gate and a drain are arranged in a direction perpendicular to a substrate, wherein the gate is formed to surround an island-shaped semiconductor layer, and a CMOS inverter circuit using the SGT (SGT-based CMOS inverter) (see, for example, the following Non-Patent Document 1).

FIG. 1 is a circuit diagram showing an inverter. The inverter comprises a pMOS transistor and an nMOS transistor. In the inverter circuit, the pMOS transistor is required to have a gate width two times greater than that of the nMOS transistor, because a hole mobility is one-half of an electron mobility. Therefore, a conventional SGT-based CMOS inverter is made up using two pMOS SGTs and one nMOS SGT. In other words, the conventional SGT-based CMOS inverter circuit is made up using a total of three island-shaped semiconductors.

Non-Patent Document 1: S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Novel Circuit Technology with Surrounding Gate Transistors (SGT's) for Ultra High Density DRAM's," IEEE JSSC, Vol. 30, No. 9, 1995

SUMMARY OF THE INVENTION

It is therefore an object of the present invention to allow an inverter to be made up using a single island-shaped semiconductor, so as to provide a semiconductor device comprising a highly-integrated SGT-based CMOS inverter circuit.

In order to achieve the above object, according to a first aspect of the present invention, there is provided a semiconductor device which comprises: a first island-shaped semiconductor layer; a first gate dielectric film located on and in contact with at least a part of a periphery of the first island-shaped semiconductor layer; a gate electrode having one surface in contact with the first gate dielectric film; a second gate dielectric film in contact with the other surface of the gate electrode; a second semiconductor layer in contact with the second gate dielectric film; a first first-conductive-type high-concentration semiconductor layer disposed on top of the first island-shaped semiconductor layer; a second first-conductive-type high-concentration semiconductor layer disposed underneath the first island-shaped semiconductor layer; a first second-conductive-type high-concentration semiconductor layer disposed on top of the second semiconductor layer; and a second second-conductive-type high-concentration semiconductor layer disposed underneath the second semiconductor layer.

According to a second aspect of the present invention, there is provided a semiconductor device which comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first first-conductive-type high-concentration semiconductor layer disposed on top of the island-shaped semiconductor layer; a second first-conductive-type high-concentration semiconductor layer disposed underneath the island-shaped semiconductor layer; a first second-conductive-type high-concentration semiconductor layer disposed on top of the tubular semiconductor layer; and a second second-conductive-type high-concentration semiconductor layer disposed underneath the tubular semiconductor layer;

According to a third aspect of the present invention, there is provided a semiconductor device which comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first first-conductive-type high-concentration semiconductor layer disposed on top of the island-shaped semiconductor layer; a second first-conductive-type high-concentration semiconductor layer disposed underneath the island-shaped semiconductor layer; a first second-conductive-type high-concentration semiconductor layer disposed on top of the tubular semiconductor layer; a second second-conductive-type high-concentration semiconductor layer disposed underneath the tubular semiconductor layer; a third first-conductive-type high-concentration semiconductor layer disposed underneath the second first-conductive-type high-concentration semiconductor layer and the second second-conductive-type high-concentration semiconductor layer; a first semiconductor-metal compound layer formed in a part of sidewalls of the second second-conductive-type high-concentration semiconductor layer and the third first-conductive-type high-concentration semiconductor layer; a second semiconductor-metal compound layer formed in an upper portion of the first first-conductive-type high-concentration semiconductor layer; and a third semiconductor-metal compound layer formed in an upper portion of the first second-conductive-type high-concentration semiconductor layer.

According to a fourth aspect of the present invention, there is provided a semiconductor device which comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first n+-type semiconductor layer disposed on top of the island-shaped semiconductor layer; a second n+-type semiconductor layer disposed underneath the island-shaped semiconductor layer; a first p+-type semiconductor layer disposed on top of the tubular semiconductor layer; and a second p+-type semiconductor layer disposed underneath the tubular semiconductor layer.

According to a fifth aspect of the present invention, there is provided a semiconductor device which comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first n+-type semiconductor layer disposed on top of the island-shaped semiconductor layer; a second n+-type semiconductor layer disposed underneath the island-shaped semiconductor layer; a first p+-type semiconductor layer disposed on top of the tubular semiconductor layer; a second p+-type semiconductor layer disposed underneath the tubular semiconductor layer; a third n+-type semiconductor layer disposed underneath the second n+-type semiconductor layer and the second p+-type semiconductor layer; a first semiconductor-metal compound layer formed in a part of sidewalls of the second p+-type semiconductor layer and the third n+-type semiconductor layer; a second semiconductor-metal compound layer formed in an upper portion of the first n+-type semiconductor layer; and a third semiconductor-metal compound layer formed in an upper portion of the first p+-type semiconductor layer.

Preferably, the semiconductor device according to the fourth or fifth aspect of the present invention satisfies the following relation: Wp≈2Wn, wherein Wp is an inner circumferential length of the tubular semiconductor layer, and Wn is an outer circumferential length of the island-shaped semiconductor layer.

Preferably, the semiconductor device according to the fourth or fifth aspect of the present invention satisfies the following relation: Rp≈2Rn, wherein Rp is an inner radius of the tubular semiconductor layer, and Rn is a radius of the island-shaped semiconductor layer.

Preferably, the semiconductor device according to the fourth or fifth aspect of the present invention satisfies the following relation: Lp≈Ln, wherein Lp is a channel length of the tubular semiconductor layer, and Ln is a channel length of the island-shaped semiconductor layer.

In the semiconductor device according to the fourth or fifth aspect of the present invention, it is preferable that the first gate dielectric film is a dielectric film allowing an nMOS transistor to function as an enhancement type, wherein the nMOS transistor comprises the island-shaped semiconductor layer, the first gate dielectric film surrounding the periphery of the island-shaped semiconductor layer, the gate electrode surrounding the periphery of the first gate dielectric film, the first n+-type semiconductor layer disposed on top of the island-shaped semiconductor layer and the second n+-type semiconductor layer disposed underneath the island-shaped semiconductor layer, and the second gate dielectric film is a dielectric film allowing a pMOS transistor to function as an enhancement type, wherein the pMOS transistor comprises the gate electrode, the second gate dielectric film surrounding the periphery of the gate electrode, the tubular semiconductor layer surrounding the periphery of the second gate dielectric film, the first p+-type semiconductor layer disposed on top of the tubular semiconductor layer and the second p+-type semiconductor layer disposed underneath the tubular semiconductor layer. Further, it is preferable that the gate electrode is made of a material allowing each of the nMOS transistor and the pMOS transistor to function as an enhancement type.

Preferably, in the semiconductor device according to the fifth aspect of the present invention, each of the first to third semiconductor-metal compound layers is a silicon-metal compound layer.

In the semiconductor device according to the fourth or fifth aspect of the present invention, it is preferable that the island-shaped semiconductor layer is an island-shaped silicon layer, and the tubular semiconductor layer is a tubular silicon layer. Further, it is preferable that each of the first and second n+-type semiconductor layers or each of the first to third n+-type semiconductor layers is an n+-type silicon layer, and each of the first and second p+-type semiconductor layers is a p+-type silicon layer.

More preferably, the island-shaped semiconductor layer is a p-type or non-doped island-shaped silicon layer, and the tubular semiconductor layer is an n-type or non-doped tubular silicon layer.

According to a fifth aspect of the present invention, there is provided a method of producing the above semiconductor device. The method comprises the step of implanting arsenic into a p-type or non-doped silicon layer formed on an oxide film, to form the third n+-type silicon layer.

Preferably, the method according to a fifth aspect of the present invention further comprises the steps of: forming a resist for forming the n-type silicon layer, on the p-type or non-doped silicon layer; implanting phosphorus into the p-type or non-doped silicon layer to form the n-type silicon layer in a part of the p-type or non-doped silicon layer; stripping away the resist; and subjecting the silicon layers to a heat treatment.

Preferably, the method according to a fifth aspect of the present invention further comprises the steps of: depositing an oxide film on the p-type or non-doped silicon layer or on the p-type or non-doped silicon layer and the n-type silicon layer; depositing a nitride film on the oxide film; forming a resist for forming the island-shaped silicon layer; etching the nitride film and the oxide film to form a nitride film-based hard mask for forming the island-shaped silicon layer; stripping away the resist; depositing an oxide film; etching the oxide film to form an oxide film-based sidewall which defines a position of a gate-forming region to be subsequently formed; depositing an nitride film; and etching the nitride film to form a nitride film-based sidewall which defines a position of the tubular silicon layer to be subsequently formed.

Preferably, the above method further comprises the steps of: after the step of etching the nitride film, forming a resist for forming an output terminal region; etching the n-type or non-doped silicon layer to form an output terminal region; stripping away the resist; etching away the oxide film-based sidewall; and etching the p-type or non-doped silicon layer and the n-type or non-doped silicon layer to form the island-shaped silicon layer and the tubular silicon layer.

Preferably, the method further comprises the steps of: after the step of etching the p-type or non-doped silicon layer and the n-type or non-doped silicon layer, stripping away the nitride film and the oxide film; depositing an oxide film; etching the oxide film to form an oxide film-based sidewall for protecting a channel during ion implantation in a subsequent step; forming a resist for forming the first n+-type silicon layer and the second n+-type silicon layer; implanting arsenic into the island-shaped silicon layer to form the first n+-type silicon layer and the second n+-type silicon layer; stripping away the resist; forming a resist for forming the first p+-type silicon layer and the second p+-type silicon layer;

implanting boron into the tubular silicon layer to form the first p+-type silicon layer and the second p+-type silicon layer; stripping away the resist; and subjecting the first and second n+-type silicon layers and the first and second p+-type silicon layers to a heat treatment.

Preferably, the method further comprises the steps of: after the step of subjecting the first and second n+-type silicon layers and the first and second p+-type silicon layers to a heat treatment, depositing an oxide film and then flattening and etching-back the oxide film to expose the first n+-type silicon layer and the first p+-type silicon layer; forming a resist for etching the oxide film in the gate-forming region; etching the oxide film in the gate-forming region; stripping away the resist; depositing a high-k film comprising a hafnium oxide film to be formed as the first and second gate dielectric films; depositing a metal film comprising a titanium nitride film or a tantalum nitride film to be formed as the gate electrode, and then flattening the metal film; depositing a nitride film; forming a resist for forming a gate pad; etching the nitride film; stripping away the resist; etching the metal film to form the gate electrode; depositing a nitride film; etching the nitride film to form a nitride film-based sidewall; and etching the high-k film to form the first and second gate dielectric films.

Preferably, the method further comprises the steps of: after the step of etching the nitride film, forming a resist for etching the oxide film; dry-etching the oxide film; stripping away the resist; wet-etching the oxide film to expose the second p+-type silicon layer; depositing a nitride film; etching the nitride film to form a nitride film-based sidewall; wet-etching the oxide film to expose the third n+-type silicon layer; and depositing a metal comprising nickel or cobalt and then subjecting the metal film to a heat treatment, whereafter an unreacted metal film is removed, whereby the first silicon-metal compound layer, the second silicon-metal compound layer, and the third silicon-metal compound layer, are formed, respectively, in a part of sidewalls of the second p+-type silicon layer and the third n+-type silicon layer, an upper portion of the first n+-type silicon layer, and an upper portion of the first p+-type silicon layer.

Preferably, the method further comprises the steps of: after the step of depositing a metal, forming an oxide film as an interlayer film; forming a first contact hole, a second contact hole and a third contact hole on the second silicon-metal compound layer, the third silicon-metal compound layer and the gate electrode, respectively; forming a fourth contact hole to expose the first silicon-metal compound layer; depositing a metal comprising tungsten to form four contacts; and forming an input terminal, an output terminal, a Vss power supply line and a Vdd power supply line.

As above, the semiconductor device according to the first aspect of the present invention comprises: a first island-shaped semiconductor layer; a first gate dielectric film located on and in contact with at least a part of a periphery of the first island-shaped semiconductor layer; a gate electrode having one surface in contact with the first gate dielectric film; a second gate dielectric film in contact with the other surface of the gate electrode; a second semiconductor layer in contact with the second gate dielectric film; a first first-conductive-type high-concentration semiconductor layer disposed on top of the first island-shaped semiconductor layer; a second first-conductive-type high-concentration semiconductor layer disposed underneath the first island-shaped semiconductor layer; a first second-conductive-type high-concentration semiconductor layer disposed on top of the second semiconductor layer; and a second second-conductive-type high-concentration semiconductor layer disposed underneath the second semiconductor layer. This makes it possible to provide a semiconductor device comprising a highly-integrated SGT-based CMOS inverter circuit.

The semiconductor device according to the second aspect of the present invention comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first first-conductive-type high-concentration semiconductor layer disposed on top of the island-shaped semiconductor layer; a second first-conductive-type high-concentration semiconductor layer disposed underneath the island-shaped semiconductor layer; a first second-conductive-type high-concentration semiconductor layer disposed on top of the tubular semiconductor layer; and a second second-conductive-type high-concentration semiconductor layer disposed underneath the tubular semiconductor layer. This also makes it possible to provide a semiconductor device comprising a highly-integrated SGT-based CMOS inverter circuit.

The semiconductor device according to the third aspect of the present invention comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first first-conductive-type high-concentration semiconductor layer disposed on top of the island-shaped semiconductor layer; a second first-conductive-type high-concentration semiconductor layer disposed underneath the island-shaped semiconductor layer; a first second-conductive-type high-concentration semiconductor layer disposed on top of the tubular semiconductor layer; a second second-conductive-type high-concentration semiconductor layer disposed underneath the tubular semiconductor layer; a third first-conductive-type high-concentration semiconductor layer disposed underneath the second first-conductive-type high-concentration semiconductor layer and the second second-conductive-type high-concentration semiconductor layer; a first semiconductor-metal compound layer formed in a part of sidewalls of the second second-conductive-type high-concentration semiconductor layer and the third first-conductive-type high-concentration semiconductor layer; a second semiconductor-metal compound layer formed in an upper portion of the first first-conductive-type high-concentration semiconductor layer; and a third semiconductor-metal compound layer formed in an upper portion of the first second-conductive-type high-concentration semiconductor layer. This also makes it possible to provide a semiconductor device comprising a highly-integrated SGT-based CMOS inverter circuit.

The semiconductor device according to the fourth aspect of the present invention comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first n+-type semiconductor layer disposed on top of the island-shaped semiconductor layer; a second n+-type semiconductor layer disposed underneath the island-shaped semiconductor layer; a first p+-type semiconductor layer disposed on top of the tubular semiconductor layer; and a second p+-type semiconductor layer disposed underneath the tubular semiconductor layer. This also makes it possible to provide a semiconductor device comprising a highly-integrated SGT-based CMOS inverter circuit.

The semiconductor device according to the fifth aspect of the present invention comprises: an island-shaped semiconductor layer; a first gate dielectric film surrounding a periphery of the island-shaped semiconductor layer; a gate electrode surrounding a periphery of the first gate dielectric film; a second gate dielectric film surrounding a periphery of the gate electrode; a tubular semiconductor layer surrounding a periphery of the second gate dielectric film; a first n+-type semiconductor layer disposed on top of the island-shaped semiconductor layer; a second n+-type semiconductor layer disposed underneath the island-shaped semiconductor layer; a first p+-type semiconductor layer disposed on top of the tubular semiconductor layer; a second p+-type semiconductor layer disposed underneath the tubular semiconductor layer; a third n+-type semiconductor layer disposed underneath the second n+-type semiconductor layer and the second p+-type semiconductor layer; a first semiconductor-metal compound layer formed in a part of sidewalls of the second p+-type semiconductor layer and the third n+-type semiconductor layer; a second semiconductor-metal compound layer formed in an upper portion of the first n+-type semiconductor layer; and a third semiconductor-metal compound layer formed in an upper portion of the first p+-type semiconductor layer. This also makes it possible to provide a semiconductor device comprising a highly-integrated SGT-based CMOS inverter circuit.

In a preferred embodiment of the present invention, the semiconductor device satisfies the following relation: $Wp \approx 2Wn$, wherein Wp is an inner circumferential length of the tubular semiconductor layer, and Wn is an outer circumferential length of the island-shaped semiconductor layer. This also makes it possible to provide a semiconductor device comprising a highly-integrated SGT-based CMOS inverter circuit wherein a pMOS transistor has a gate width which is two times greater than that of an nMOS transistor.

In a preferred embodiment of the present invention, the semiconductor device satisfies the following relation: $Rp \approx 2Rn$, wherein Rp is an inner radius of the tubular semiconductor layer, and Rn is a radius of the island-shaped semiconductor layer. This also makes it possible to provide a semiconductor device comprising a highly-integrated SGT-based CMOS inverter circuit wherein a pMOS transistor has a gate width which is two times greater than that of an nMOS transistor.

In a preferred embodiment of the present invention, the semiconductor device satisfies the following relation: $Lp \approx Ln$, wherein Lp is a channel length of the tubular semiconductor layer, and Ln is a channel length of the island-shaped semiconductor layer. This makes it possible to provide a semiconductor device comprising a highly-integrated SGT-based CMOS inverter circuit.

In a preferred embodiment of the present invention, the first gate dielectric film is a dielectric film allowing an nMOS transistor to function as an enhancement type, wherein the nMOS transistor comprises the island-shaped semiconductor layer, the first gate dielectric film surrounding the periphery of the island-shaped semiconductor layer, the gate electrode surrounding the periphery of the first gate dielectric film, the first n+-type semiconductor layer disposed on top of the island-shaped semiconductor layer and the second n+-type semiconductor layer disposed underneath the island-shaped semiconductor layer, and the second gate dielectric film is a dielectric film allowing a pMOS transistor to function as an enhancement type, wherein the pMOS transistor comprises the gate electrode, the second gate dielectric film surrounding the periphery of the gate electrode, the tubular semiconductor layer surrounding the periphery of the second gate dielectric film, the first p+-type semiconductor layer disposed on top of the tubular semiconductor layer and the second p+-type semiconductor layer disposed underneath the tubular semiconductor layer. Further, the gate electrode is made of a material allowing each of the nMOS transistor and the pMOS transistor to function as an enhancement type. This makes it possible to form each of the nMOS transistor and the pMOS transistor as an enhancement type.

The method according to the fifth aspect of the present invention comprises the step of implanting arsenic into a p-type or non-doped silicon layer formed on an oxide film, to form the third n+-type silicon layer. This makes it possible to form the third n+-type silicon layer.

In a preferred embodiment of the present invention, the method further comprises the steps of: forming a resist for forming the n-type silicon layer, on the p-type or non-doped silicon layer; implanting phosphorus into the p-type or non-doped silicon layer to form the n-type silicon layer in a part of the p-type or non-doped silicon layer; stripping away the resist; and subjecting the silicon layers to a heat treatment. This makes it possible to form the n-type silicon layer.

In a preferred embodiment of the present invention, the method further comprises the steps of: depositing an oxide film on the p-type or non-doped silicon layer or on the p-type or non-doped silicon layer and the n-type silicon layer; depositing a nitride film on the oxide film; forming a resist for forming the island-shaped silicon layer; etching the nitride film and the oxide film to form a nitride film-based hard mask for forming the island-shaped silicon layer; stripping away the resist; depositing an oxide film; etching the oxide film to form an oxide film-based sidewall which defines a position of a gate-forming region to be subsequently formed; depositing an nitride film; and etching the nitride film to form a nitride film-based sidewall which defines a position of the tubular silicon layer to be subsequently formed. This makes it possible to form a hard mask for forming the island-shaped silicon layer and a hard mask for forming the tubular silicon layer.

In a preferred embodiment of the present invention, the method further comprises the steps of: after the step of etching the nitride film, forming a resist for forming an output terminal region; etching the n-type or non-doped silicon layer to form an output terminal region; stripping away the resist; etching away the oxide film-based sidewall; and etching the p-type or non-doped silicon layer and the n-type or non-doped silicon layer to form the island-shaped silicon layer and the tubular silicon layer. This makes it possible to form the output terminal region, the island-shaped silicon layer and the tubular silicon layer.

In a preferred embodiment of the present invention, the method further comprises the steps of: after the step of etching the p-type or non-doped silicon layer and the n-type or non-doped silicon layer, stripping away the nitride film, the nitride film-based sidewall and the oxide film; depositing an oxide film; etching the oxide film to form an oxide film-based sidewall for protecting a channel during ion implantation in a subsequent step; forming a resist for forming the first n+-type silicon layer and the second n+-type silicon layer; implanting arsenic into the island-shaped silicon layer to form the first n+-type silicon layer and the second n+-type silicon layer; stripping away the resist; forming a resist for forming the first p+-type silicon layer and the second p+-type silicon layer; implanting boron into the tubular silicon layer to form the first p+-type silicon layer and the second p+-type silicon layer;

stripping away the resist; and subjecting the first and second n+-type silicon layers and the first and second p+-type silicon layers to a heat treatment. This makes it possible to form the first n+-type silicon layer, the second n+-type silicon layer, the first p+-type silicon layer and the second p+-type silicon layer.

In a preferred embodiment of the present invention, the method further comprises the steps of: after the step of subjecting the first and second n+-type silicon layers and the first and second p+-type silicon layers to a heat treatment, depositing an oxide film and then flattening and etching-back the oxide film to expose the first n+-type silicon layer and the first p+-type silicon layer; forming a resist for etching the oxide film in the gate-forming region; etching the oxide film in the gate-forming region; stripping away the resist; depositing a high-k film comprising a hafnium oxide film to be formed as the first and second gate dielectric films; depositing a metal film comprising a titanium nitride film or a tantalum nitride film to be formed as the gate electrode, and then flattening the metal film; depositing a nitride film; forming a resist for forming a gate pad; etching the nitride film; stripping away the resist; etching the metal film to form the gate electrode; depositing a nitride film; etching the nitride film to form a nitride film-based sidewall; and etching the high-k film to form the first and second gate dielectric films. This makes it possible to form the first and second gate dielectric films and the gate electrode.

In a preferred embodiment of the present invention, the method further comprises the steps of: after the step of etching the nitride film, forming a resist for etching the oxide film; dry-etching the oxide film; stripping away the resist; wet-etching the oxide film to expose the second p+-type silicon layer; depositing a nitride film; etching the nitride film to form a nitride film-based sidewall; wet-etching the oxide film to expose the third n+-type silicon layer; and depositing a metal comprising nickel or cobalt and then subjecting the metal film to a heat treatment, whereafter an unreacted metal film is removed, whereby the first silicon-metal compound layer, the second silicon-metal compound layer, and the third silicon-metal compound layer, are formed, respectively, in a part of sidewalls of the second p+-type silicon layer and the third n+-type silicon layer, an upper portion of the first n+-type silicon layer, and an upper portion of the first p+-type silicon layer. This makes it possible to form the first silicon-metal compound layer, the second silicon-metal compound layer, and the third silicon-metal compound layer, are formed, respectively, in a part of the sidewalls of the second p+-type silicon layer and the third n+-type silicon layer, the upper portion of the first n+-type silicon layer, and the upper portion of the first p+-type silicon layer.

In a preferred embodiment of the present invention, the method further comprises the steps of: after the step of depositing a metal, forming an oxide film as an interlayer film; forming a first contact hole, a second contact hole and a third contact hole on the second silicon-metal compound layer, the third silicon-metal compound layer and the gate electrode, respectively; forming a fourth contact hole to expose the first silicon-metal compound layer; depositing a metal comprising tungsten to form four contacts; and forming an input terminal, an output terminal, a Vss power supply line and a Vdd power supply line. This makes it possible to form the four contacts, the input terminal, the output terminal, the Vss power supply line and the Vdd power supply line.

BRIEF DESCRIPTION OF THE DRAWINGS

FIGS. 2(a) to 2(c) show a structure of a semiconductor device according to one embodiment of the present invention, wherein FIG. 2(a), FIG. 2(b) and FIG. 2(c) are a top plan view of the semiconductor device, a sectional view taken along the line X-X' in FIG. 2(a), and a sectional view taken along the line Y-Y' in FIG. 2(a).

FIGS. 4(a) to 4(c) show a step in one example of a production method for the semiconductor device according to the embodiment, wherein FIG. 4(a), FIG. 4(b) and FIG. 4(c) are a top plan view, a sectional view taken along the line X-X' in FIG. 2(a), and a sectional view taken along the line Y-Y' in FIG. 2(a).

FIGS. 5(a) to 5(c) show a step in the example of the production method for the semiconductor device according to the embodiment, wherein FIG. 5(a), FIG. 5(b) and FIG. 5(c) are a top plan view, a sectional view taken along the line X-X' in FIG. 5(a), and a sectional view taken along the line Y-Y' in FIG. 5(a).

FIGS. 6(a) to 6(c) show a step in the example of the production method for the semiconductor device according to the embodiment, wherein FIG. 6(a), FIG. 6(b) and FIG. 6(c) are a top plan view, a sectional view taken along the line X-X' in FIG. 6(a), and a sectional view taken along the line Y-Y' in FIG. 6(a).

FIGS. 7(a) to 7(c) show a step in the example of the production method for the semiconductor device according to the embodiment, wherein FIG. 7(a), FIG. 7(b) and FIG. 7(c) are a top plan view, a sectional view taken along the line X-X' in FIG. 7(a), and a sectional view taken along the line Y-Y' in FIG. 7(a).

FIGS. 8(a) to 8(c) show a step in the example of the production method for the semiconductor device according to the embodiment, wherein FIG. 8(a), FIG. 8(b) and FIG. 8(c) are a top plan view, a sectional view taken along the line X-X' in FIG. 8(a), and a sectional view taken along the line Y-Y' in FIG. 8(a).

FIGS. 9(a) to 9(c) show a step in the example of the production method for the semiconductor device according to the embodiment, wherein FIG. 9(a), FIG. 9(b) and FIG. 9(c) are a top plan view, a sectional view taken along the line X-X' in FIG. 9(a), and a sectional view taken along the line Y-Y' in FIG. 9(a).

FIGS. 10(a) to 10(c) show a step in the example of the production method for the semiconductor device according to the embodiment, wherein FIG. 10(a), FIG. 10(b) and FIG. 10(c) are a top plan view, a sectional view taken along the line X-X' in FIG. 10(a), and a sectional view taken along the line Y-Y' in FIG. 10(a).

FIGS. 11(a) to 11(c) show a step in the example of the production method for the semiconductor device according to the embodiment, wherein FIG. 11(a), FIG. 11(b) and FIG. 11(c) are a top plan view, a sectional view taken along the line X-X' in FIG. 11(a), and a sectional view taken along the line Y-Y' in FIG. 11(a).

FIGS. 12(a) to 12(c) show a step in the example of the production method for the semiconductor device according to the embodiment, wherein FIG. 12(a), FIG. 12(b) and FIG. 12(c) are a top plan view, a sectional view taken along the line X-X' in FIG. 12(a), and a sectional view taken along the line Y-Y' in FIG. 12(a).

FIGS. 13(a) to 13(c) show a step in the example of the production method for the semiconductor device according to the embodiment, wherein FIG. 13(a), FIG. 13(b) and FIG. 13(c) are a top plan view, a sectional view taken along the line X-X' in FIG. 13(a), and a sectional view taken along the line Y-Y' in FIG. 13(a).

FIGS. 14(a) to 14(c) show a step in the example of the production method for the semiconductor device according to the embodiment, wherein FIG. 14(a), FIG. 14(b) and FIG. 14(c) are a top plan view, a sectional view taken along the line X-X' in FIG. 14(a), and a sectional view taken along the line Y-Y' in FIG. 14(a).

FIGS. 15(a) to 15(c) show a step in the example of the production method for the semiconductor device according to the embodiment, wherein FIG. 15(a), FIG. 15(b) and FIG. 15(c) are a top plan view, a sectional view taken along the line X-X' in FIG. 15(a), and a sectional view taken along the line Y-Y' in FIG. 15(a).

FIGS. 16(a) to 16(c) show a step in the example of the production method for the semiconductor device according to the embodiment, wherein FIG. 16(a), FIG. 16(b) and FIG. 16(c) are a top plan view, a sectional view taken along the line X-X' in FIG. 16(a), and a sectional view taken along the line Y-Y' in FIG. 16(a).

FIGS. 17(a) to 17(c) show a step in the example of the production method for the semiconductor device according to the embodiment, wherein FIG. 17(a), FIG. 17(b) and FIG. 17(c) are a top plan view, a sectional view taken along the line X-X' in FIG. 17(a), and a sectional view taken along the line Y-Y' in FIG. 17(a).

FIGS. 18(a) to 18(c) show a step in the example of the production method for the semiconductor device according to the embodiment, wherein FIG. 18(a), FIG. 18(b) and FIG. 18(c) are a top plan view, a sectional view taken along the line X-X' in FIG. 18(a), and a sectional view taken along the line Y-Y' in FIG. 18(a).

FIGS. 19(a) to 19(c) show a step in the example of the production method for the semiconductor device according to the embodiment, wherein FIG. 19(a), FIG. 19(b) and FIG. 19(c) are a top plan view, a sectional view taken along the line X-X' in FIG. 19(a), and a sectional view taken along the line Y-Y' in FIG. 19(a).

FIGS. 20(a) to 20(c) show a step in the example of the production method for the semiconductor device according to the embodiment, wherein FIG. 20(a), FIG. 20(b) and FIG. 20(c) are a top plan view, a sectional view taken along the line X-X' in FIG. 20(a), and a sectional view taken along the line Y-Y' in FIG. 20(a).

FIGS. 21(a) to 21(c) show a step in the example of the production method for the semiconductor device according to the embodiment, wherein FIG. 21(a), FIG. 21(b) and FIG. 21(c) are a top plan view, a sectional view taken along the line X-X' in FIG. 21(a), and a sectional view taken along the line Y-Y' in FIG. 21(a).

FIGS. 22(a) to 22(c) show a step in the example of the production method for the semiconductor device according to the embodiment, wherein FIG. 22(a), FIG. 22(b) and FIG. 22(c) are a top plan view, a sectional view taken along the line X-X' in FIG. 22(a), and a sectional view taken along the line Y-Y' in FIG. 22(a).

FIGS. 23(a) to 23(c) show a step in the example of the production method for the semiconductor device according to the embodiment, wherein FIG. 23(a), FIG. 23(b) and FIG. 23(c) are a top plan view, a sectional view taken along the line X-X' in FIG. 23(a), and a sectional view taken along the line Y-Y' in FIG. 23(a).

FIGS. 24(a) to 24(c) show a step in the example of the production method for the semiconductor device according to the embodiment, wherein FIG. 24(a), FIG. 24(b) and FIG. 24(c) are a top plan view, a sectional view taken along the line X-X' in FIG. 24(a), and a sectional view taken along the line Y-Y' in FIG. 24(a).

FIGS. 25(a) to 25(c) show a step in the example of the production method for the semiconductor device according to the embodiment, wherein FIG. 25(a), FIG. 25(b) and FIG. 25(c) are a top plan view, a sectional view taken along the line X-X' in FIG. 25(a), and a sectional view taken along the line Y-Y' in FIG. 25(a).

FIGS. 26(a) to 26(c) show a step in the example of the production method for the semiconductor device according to the embodiment, wherein FIG. 26(a), FIG. 26(b) and FIG. 26(c) are a top plan view, a sectional view taken along the line X-X' in FIG. 26(a), and a sectional view taken along the line Y-Y' in FIG. 26(a).

FIGS. 27(a) to 27(c) show a step in the example of the production method for the semiconductor device according to the embodiment, wherein FIG. 27(a), FIG. 27(b) and FIG. 27(c) are a top plan view, a sectional view taken along the line X-X' in FIG. 27(a), and a sectional view taken along the line Y-Y' in FIG. 27(a).

FIGS. 28(a) to 28(c) show a step in the example of the production method for the semiconductor device according to the embodiment, wherein FIG. 28(a), FIG. 28(b) and FIG. 28(c) are a top plan view, a sectional view taken along the line X-X' in FIG. 28(a), and a sectional view taken along the line Y-Y' in FIG. 28(a).

FIGS. 29(a) to 29(c) show a step in the example of the production method for the semiconductor device according to the embodiment, wherein FIG. 29(a), FIG. 29(b) and FIG. 29(c) are a top plan view, a sectional view taken along the line X-X' in FIG. 29(a), and a sectional view taken along the line Y-Y' in FIG. 29(a).

FIGS. 30(a) to 30(c) show a step in the example of the production method for the semiconductor device according to the embodiment, wherein FIG. 30(a), FIG. 30(b) and FIG. 30(c) are a top plan view, a sectional view taken along the line X-X' in FIG. 30(a), and a sectional view taken along the line Y-Y' in FIG. 30(a).

FIGS. 31(a) to 31(c) show a step in the example of the production method for the semiconductor device according to the embodiment, wherein FIG. 31(a), FIG. 31(b) and FIG. 31(c) are a top plan view, a sectional view taken along the line X-X' in FIG. 31(a), and a sectional view taken along the line Y-Y' in FIG. 31(a).

FIGS. 32(a) to 32(c) show a step in the example of the production method for the semiconductor device according to the embodiment, wherein FIG. 32(a), FIG. 32(b) and FIG. 32(c) are a top plan view, a sectional view taken along the line X-X' in FIG. 32(a), and a sectional view taken along the line Y-Y' in FIG. 32(a).

FIGS. 33(a) to 33(c) show a step in the example of the production method for the semiconductor device according to the embodiment, wherein FIG. 33(a), FIG. 33(b) and FIG. 33(c) are a top plan view, a sectional view taken along the line X-X' in FIG. 33(a), and a sectional view taken along the line Y-Y' in FIG. 33(a).

FIGS. 34(a) to 34(c) show a step in the example of the production method for the semiconductor device according to the embodiment, wherein FIG. 34(a), FIG. 34(b) and FIG. 34(c) are a top plan view, a sectional view taken along the line X-X' in FIG. 34(a), and a sectional view taken along the line Y-Y' in FIG. 34(a).

Figure 35:
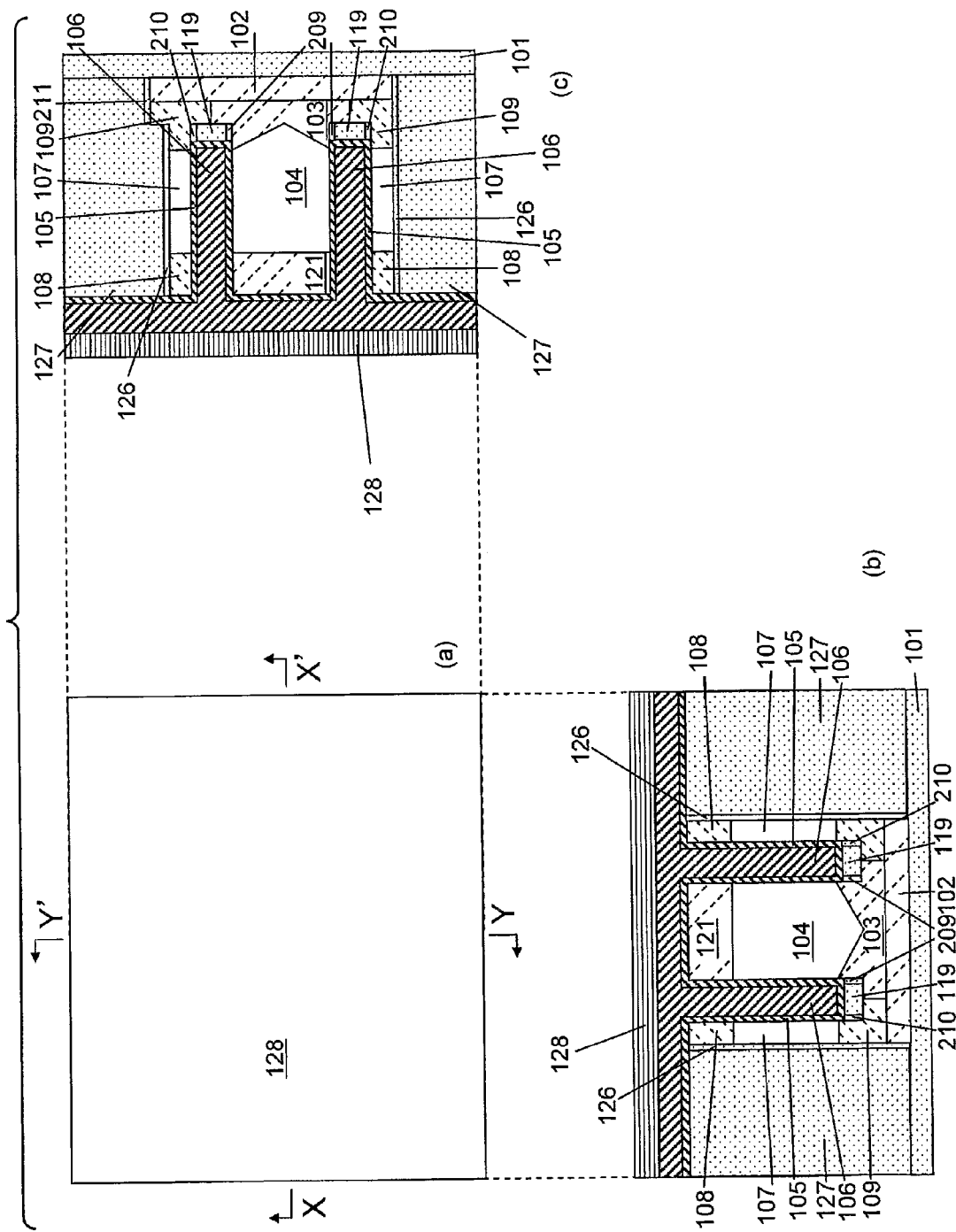
FIGS. 35(a) to 35(c) show a step in the example of the production method for the semiconductor device according to the embodiment, wherein FIG. 35(a), FIG. 35(b) and FIG.

35(c) are a top plan view, a sectional view taken along the line X-X' in FIG. 35(a), and a sectional view taken along the line Y-Y' in FIG. 35(a).

Figure 36:
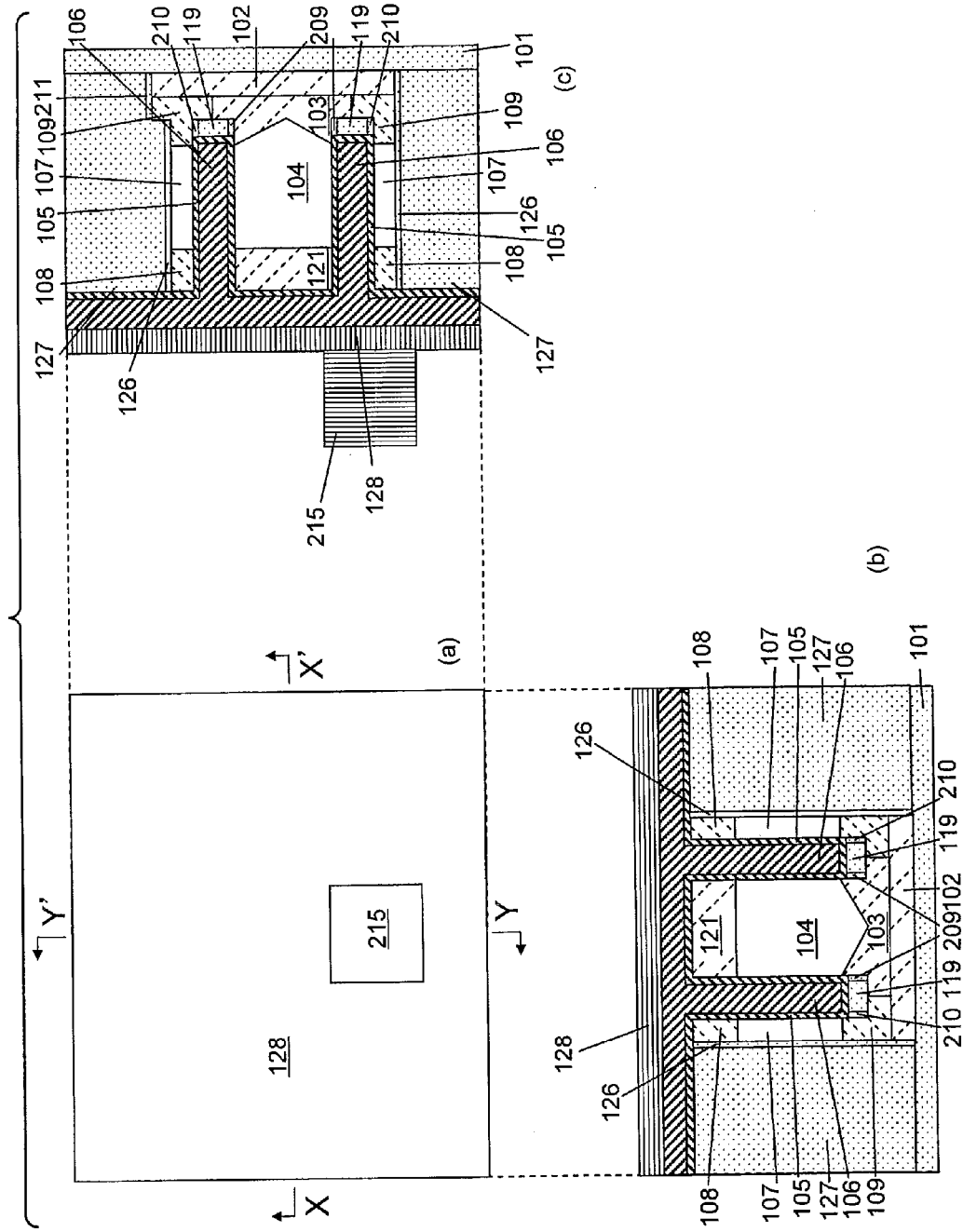

FIGS. 36(a) to 36(c) show a step in the example of the production method for the semiconductor device according to the embodiment, wherein FIG. 36(a), FIG. 36(b) and FIG. 36(c) are a top plan view, a sectional view taken along the line X-X' in FIG. 36(a), and a sectional view taken along the line Y-Y' in FIG. 36(a).

Figure 37:
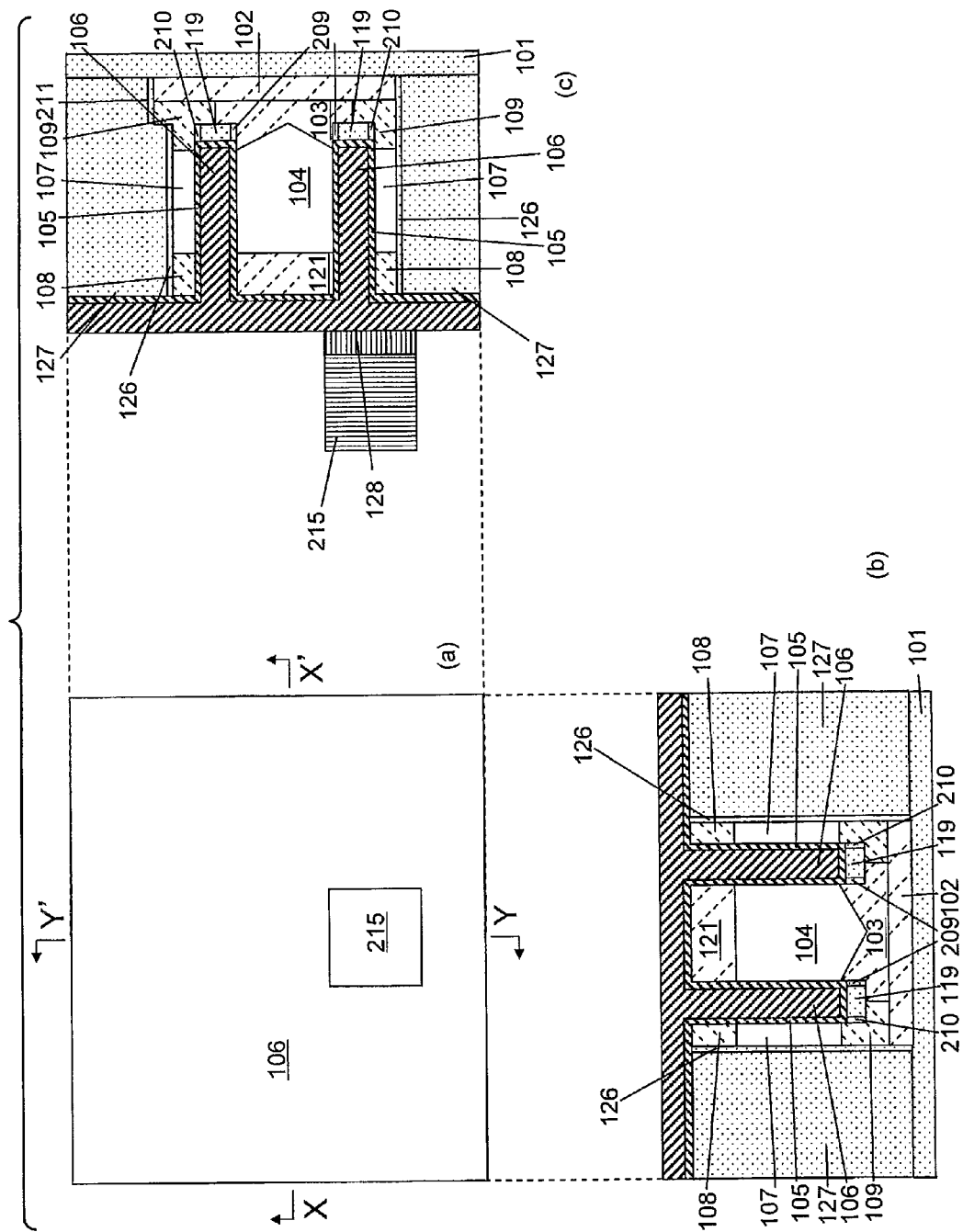

FIGS. 37(a) to 37(c) show a step in the example of the production method for the semiconductor device according to the embodiment, wherein FIG. 37(a), FIG. 37(b) and FIG. 37(c) are a top plan view, a sectional view taken along the line X-X' in FIG. 37(a), and a sectional view taken along the line Y-Y' in FIG. 37(a).

Figure 38:
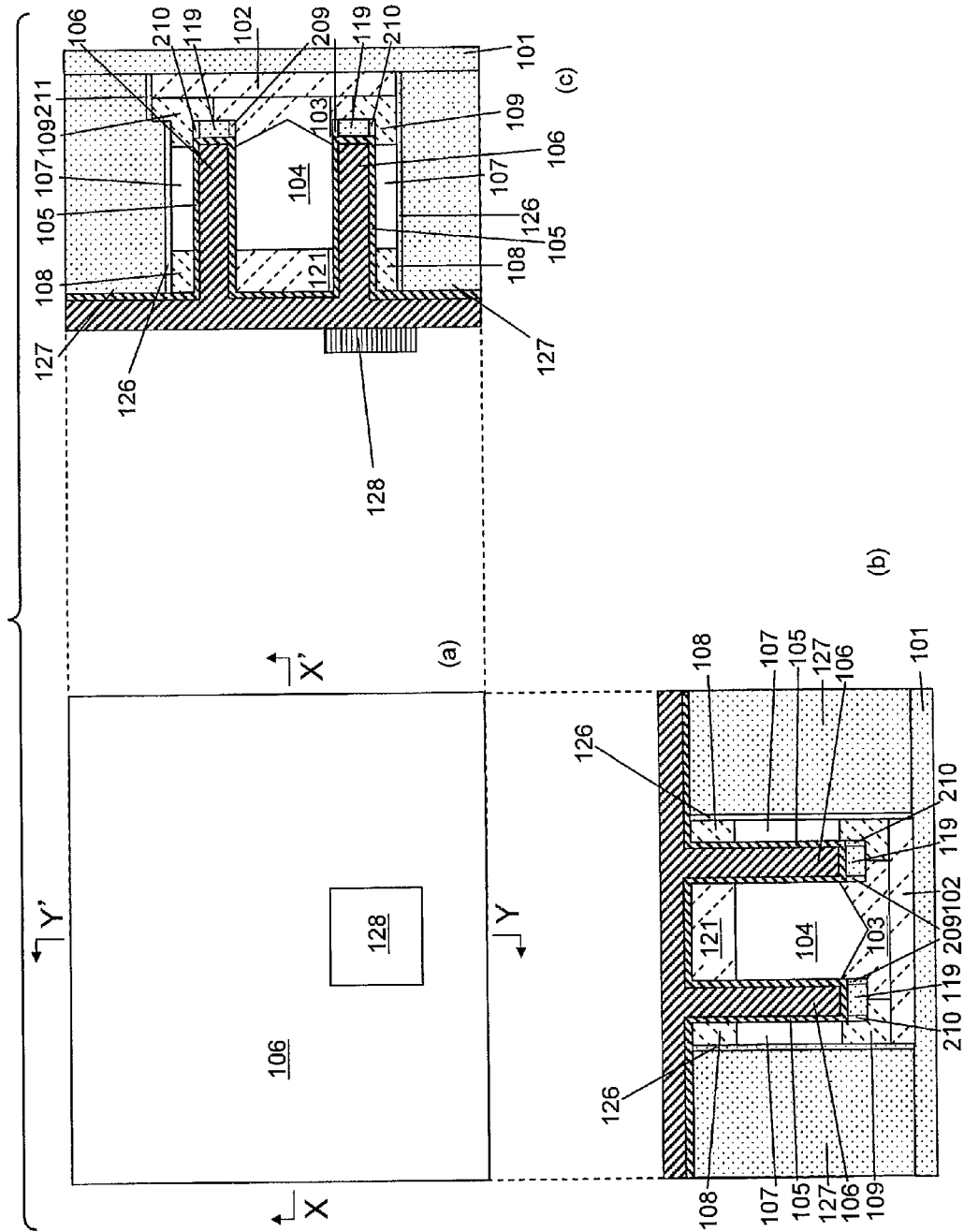

FIGS. 38(a) to 38(c) show a step in the example of the production method for the semiconductor device according to the embodiment, wherein FIG. 38(a), FIG. 38(b) and FIG. 38(c) are a top plan view, a sectional view taken along the line X-X' in FIG. 38(a), and a sectional view taken along the line Y-Y' in FIG. 38(a).

Figure 39:
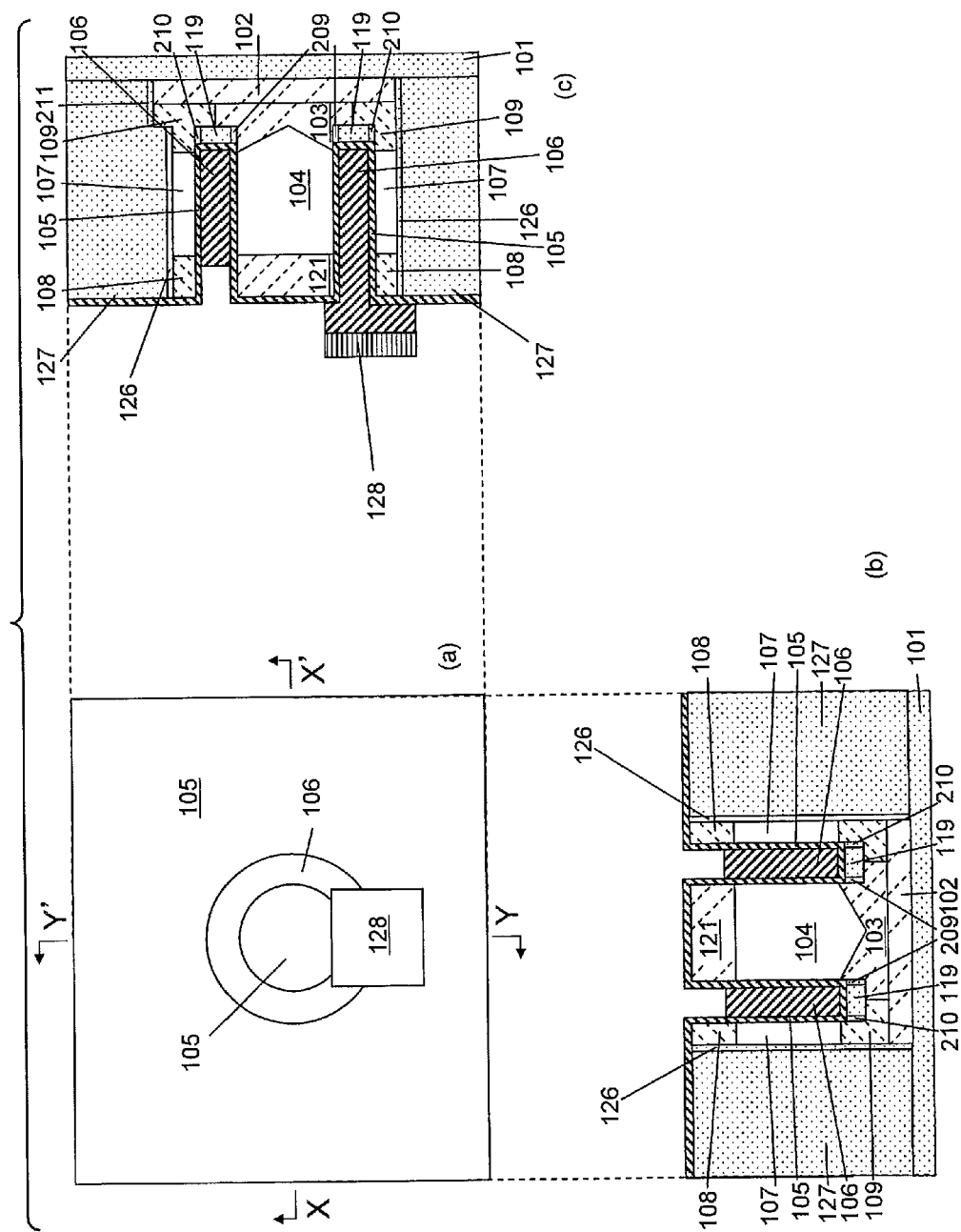

FIGS. 39(a) to 39(c) show a step in the example of the production method for the semiconductor device according to the embodiment, wherein FIG. 39(a), FIG. 39(b) and FIG. 39(c) are a top plan view, a sectional view taken along the line X-X' in FIG. 39(a), and a sectional view taken along the line Y-Y' in FIG. 39(a).

Figure 40:
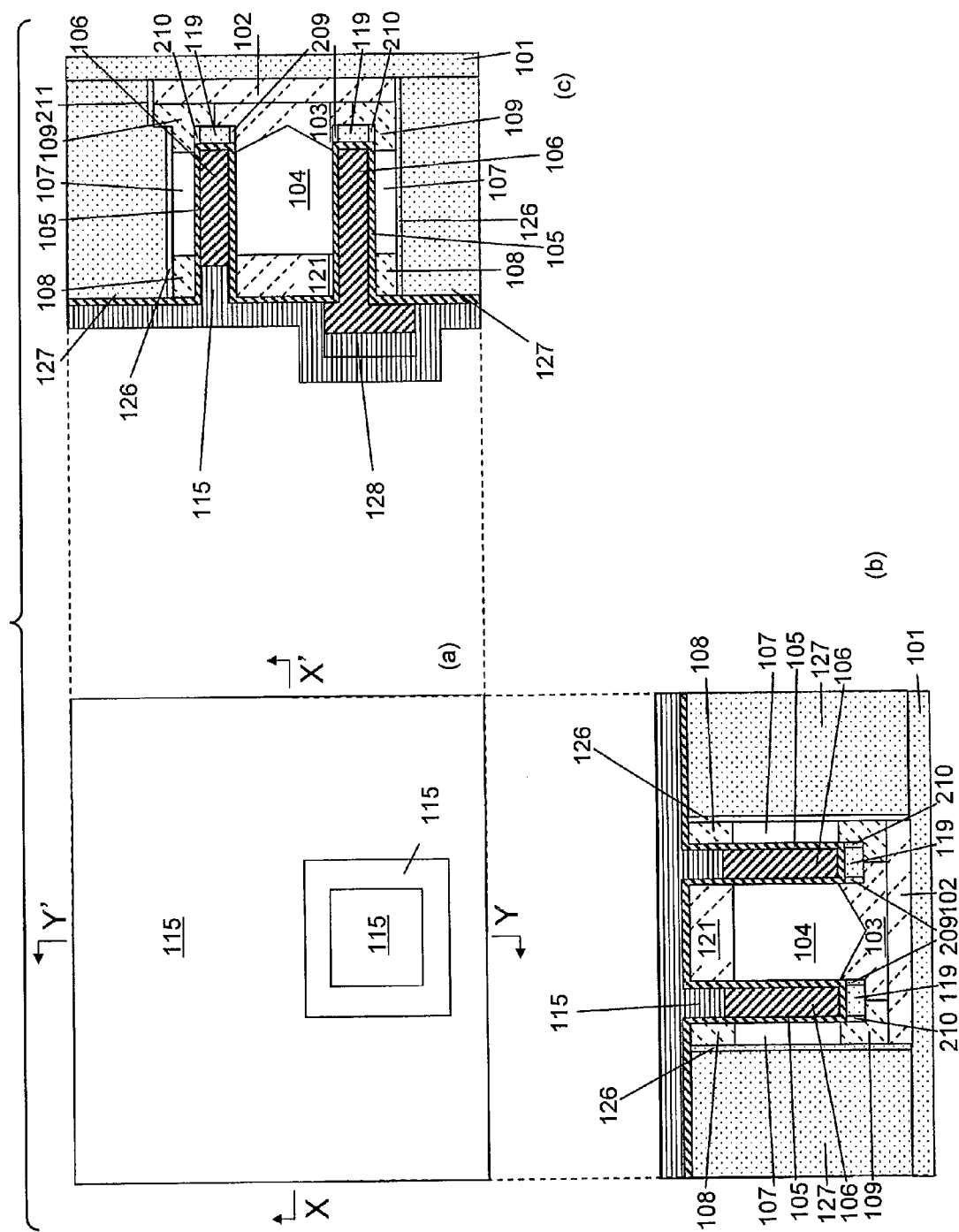

FIGS. 40(a) to 40(c) show a step in the example of the production method for the semiconductor device according to the embodiment, wherein FIG. 40(a), FIG. 40(b) and FIG. 40(c) are a top plan view, a sectional view taken along the line X-X' in FIG. 40(a), and a sectional view taken along the line Y-Y' in FIG. 40(a).

Figure 41:
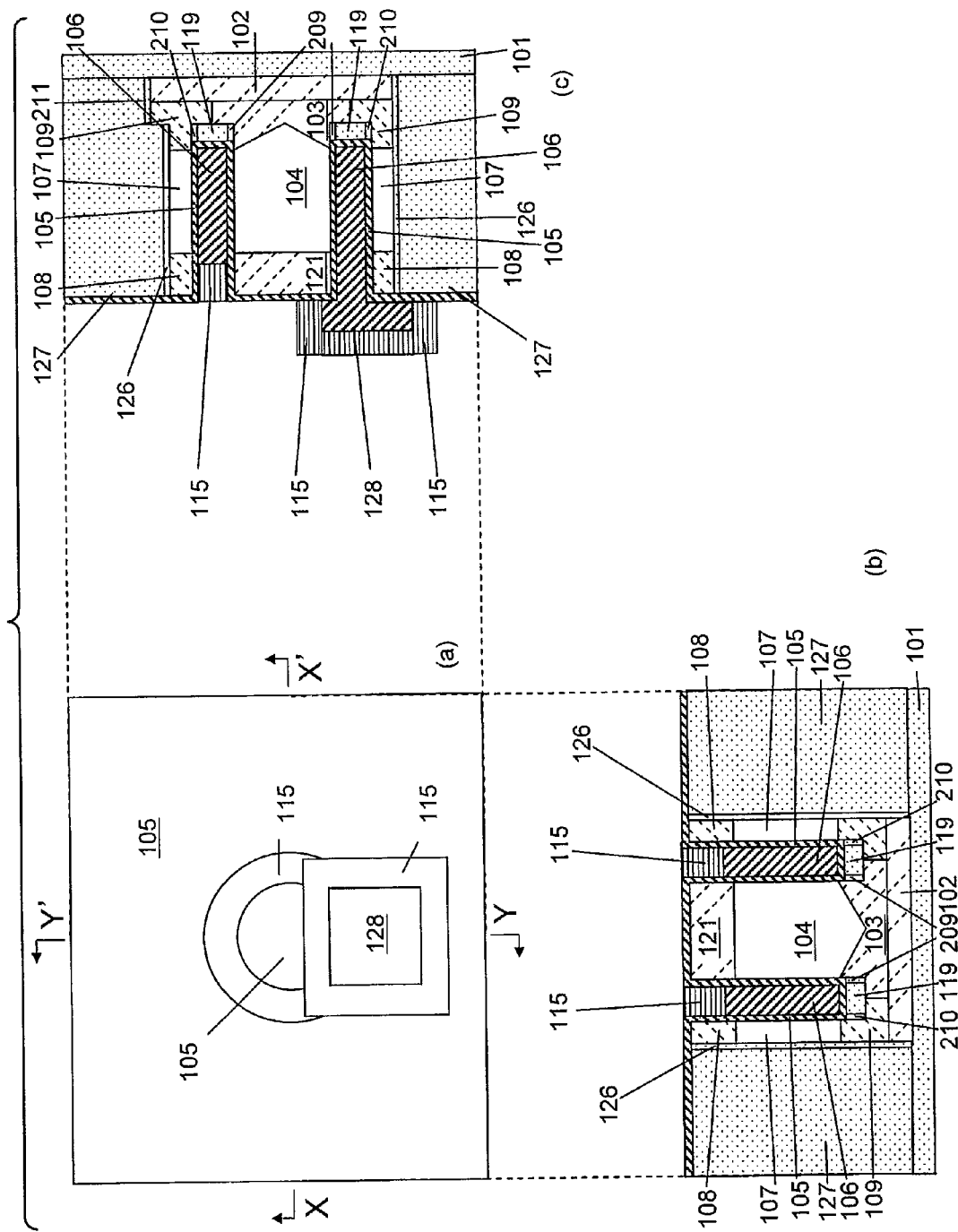

FIGS. 41(a) to 41(c) show a step in the example of the production method for the semiconductor device according to the embodiment, wherein FIG. 41(a), FIG. 41(b) and FIG. 41(c) are a top plan view, a sectional view taken along the line X-X' in FIG. 41(a), and a sectional view taken along the line Y-Y' in FIG. 41(a).

Figure 42:
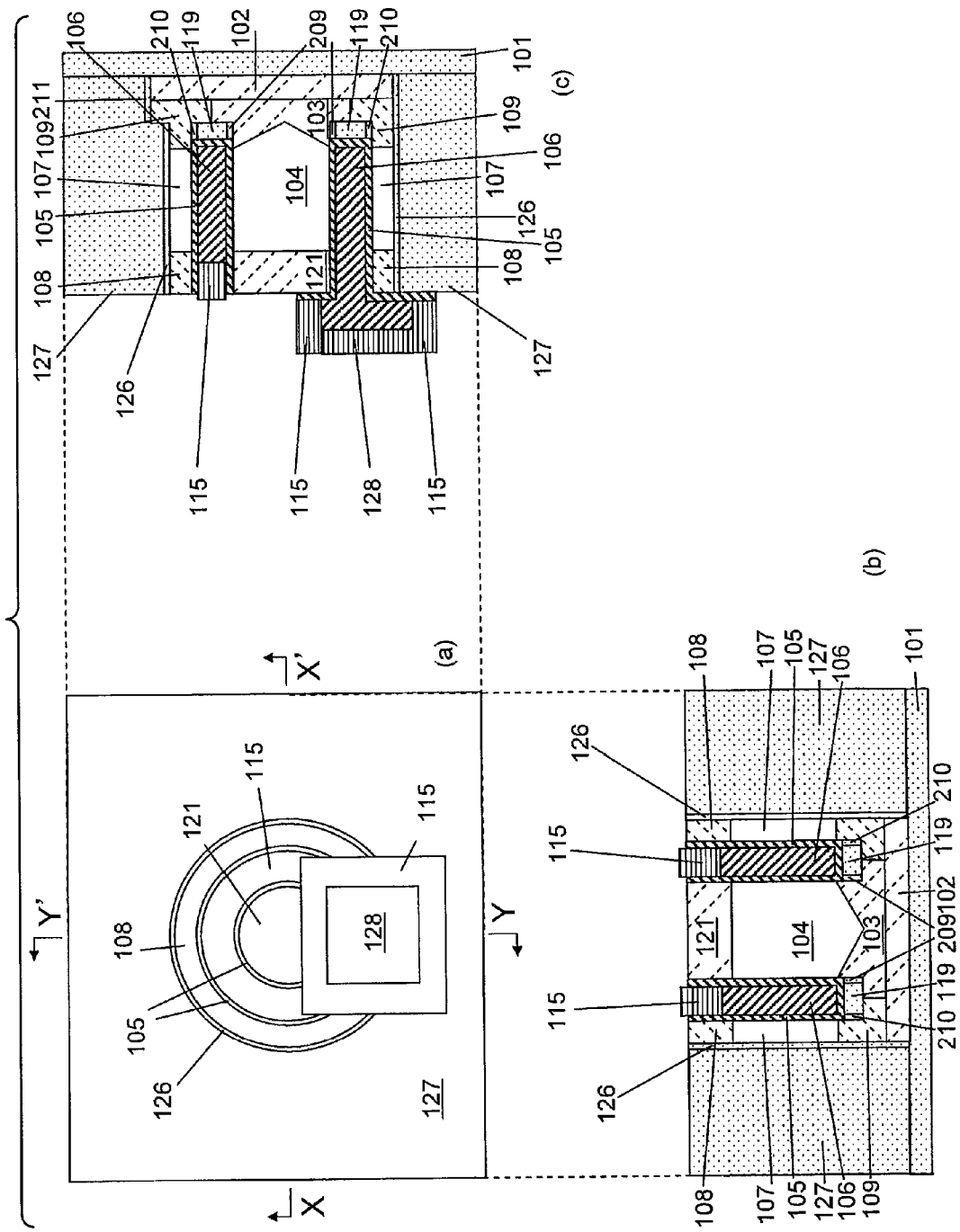

FIGS. 42(a) to 42(c) show a step in the example of the production method for the semiconductor device according to the embodiment, wherein FIG. 42(a), FIG. 42(b) and FIG. 42(c) are a top plan view, a sectional view taken along the line X-X' in FIG. 42(a), and a sectional view taken along the line Y-Y' in FIG. 42(a).

Figure 43:
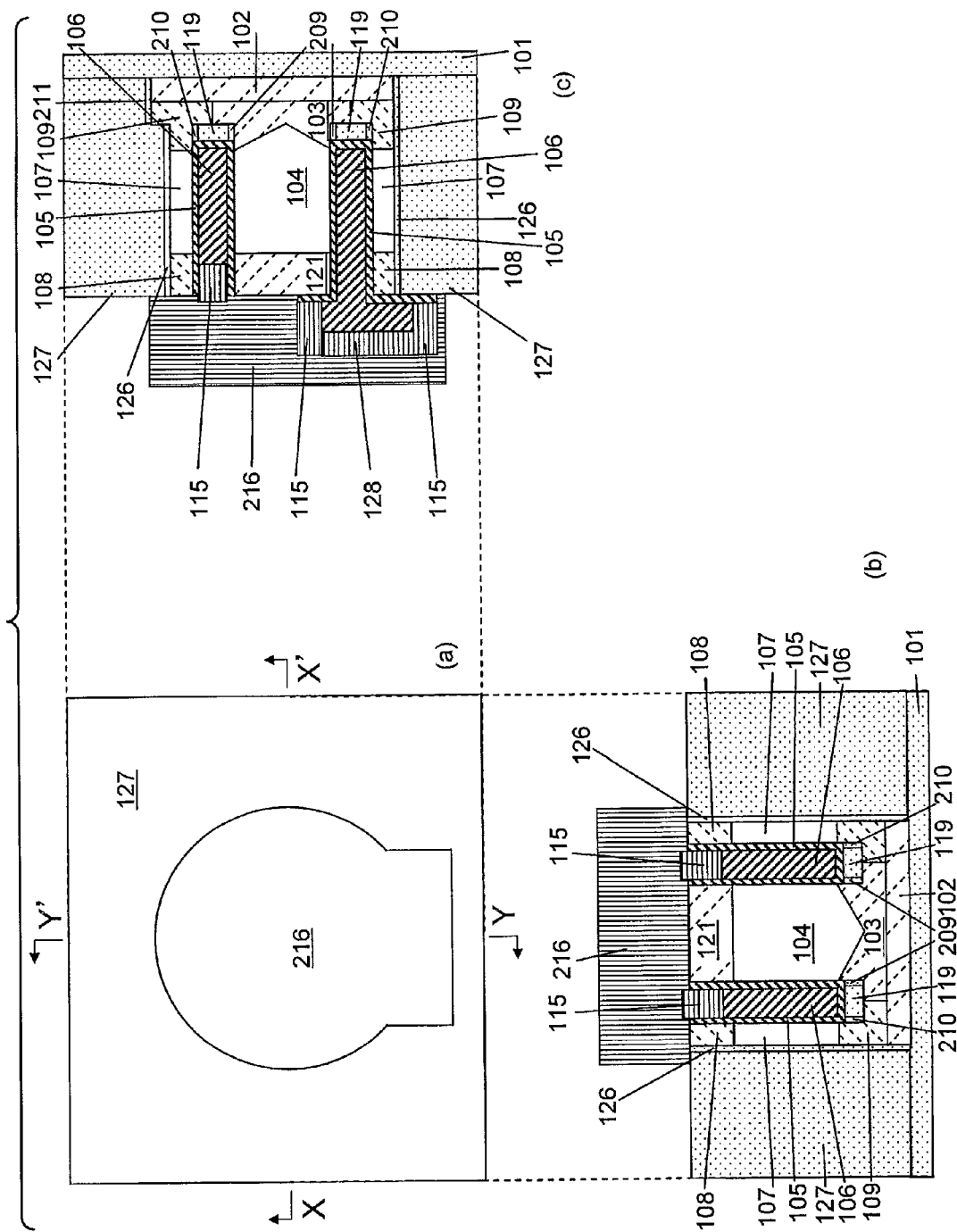

FIGS. 43(a) to 43(c) show a step in the example of the production method for the semiconductor device according to the embodiment, wherein FIG. 43(a), FIG. 43(b) and FIG. 43(c) are a top plan view, a sectional view taken along the line X-X' in FIG. 43(a), and a sectional view taken along the line Y-Y' in FIG. 43(a).

Figure 44:
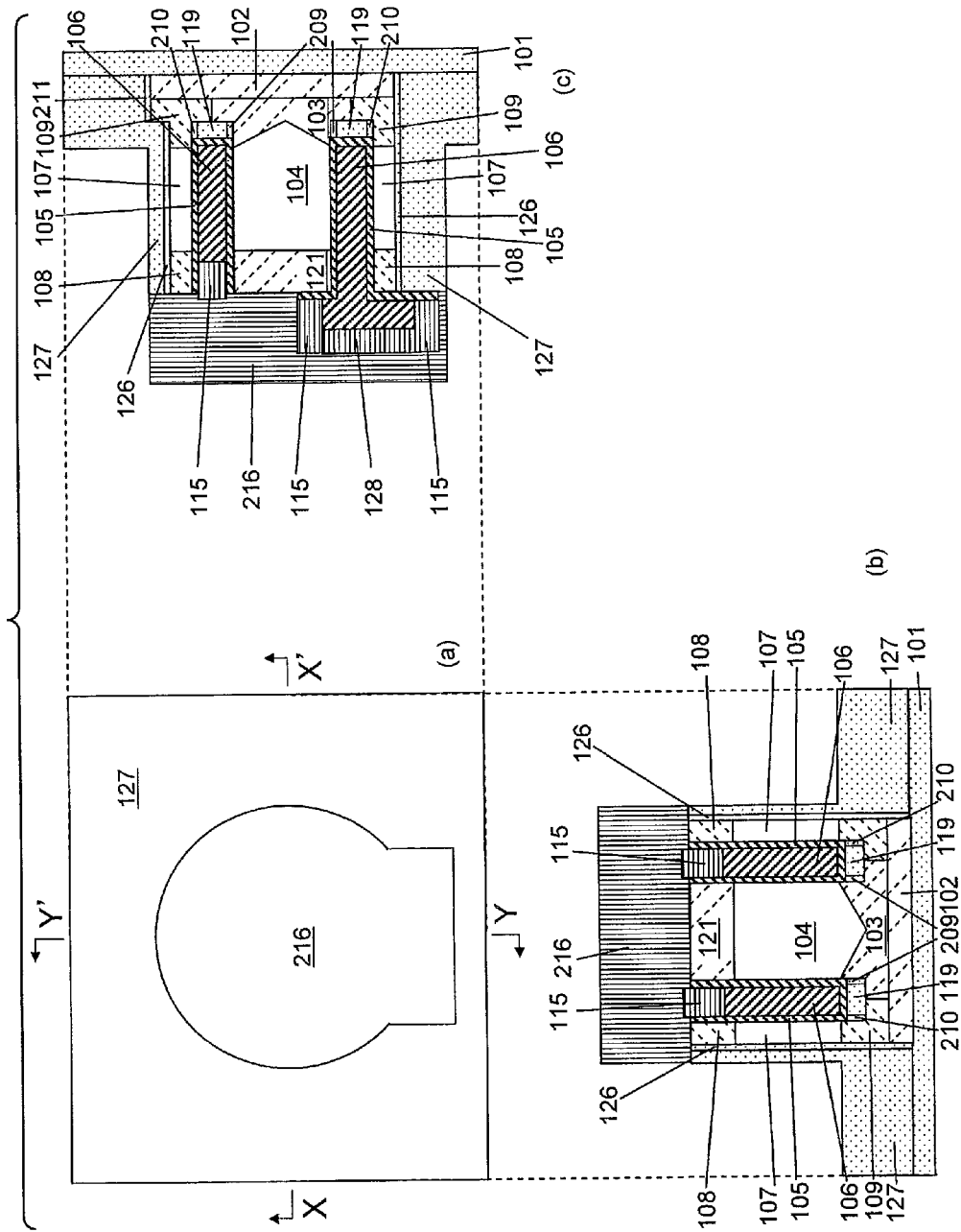

FIGS. 44(a) to 44(c) show a step in the example of the production method for the semiconductor device according to the embodiment, wherein FIG. 44(a), FIG. 44(b) and FIG. 44(c) are a top plan view, a sectional view taken along the line X-X' in FIG. 44(a), and a sectional view taken along the line Y-Y' in FIG. 44(a).

Figure 45:
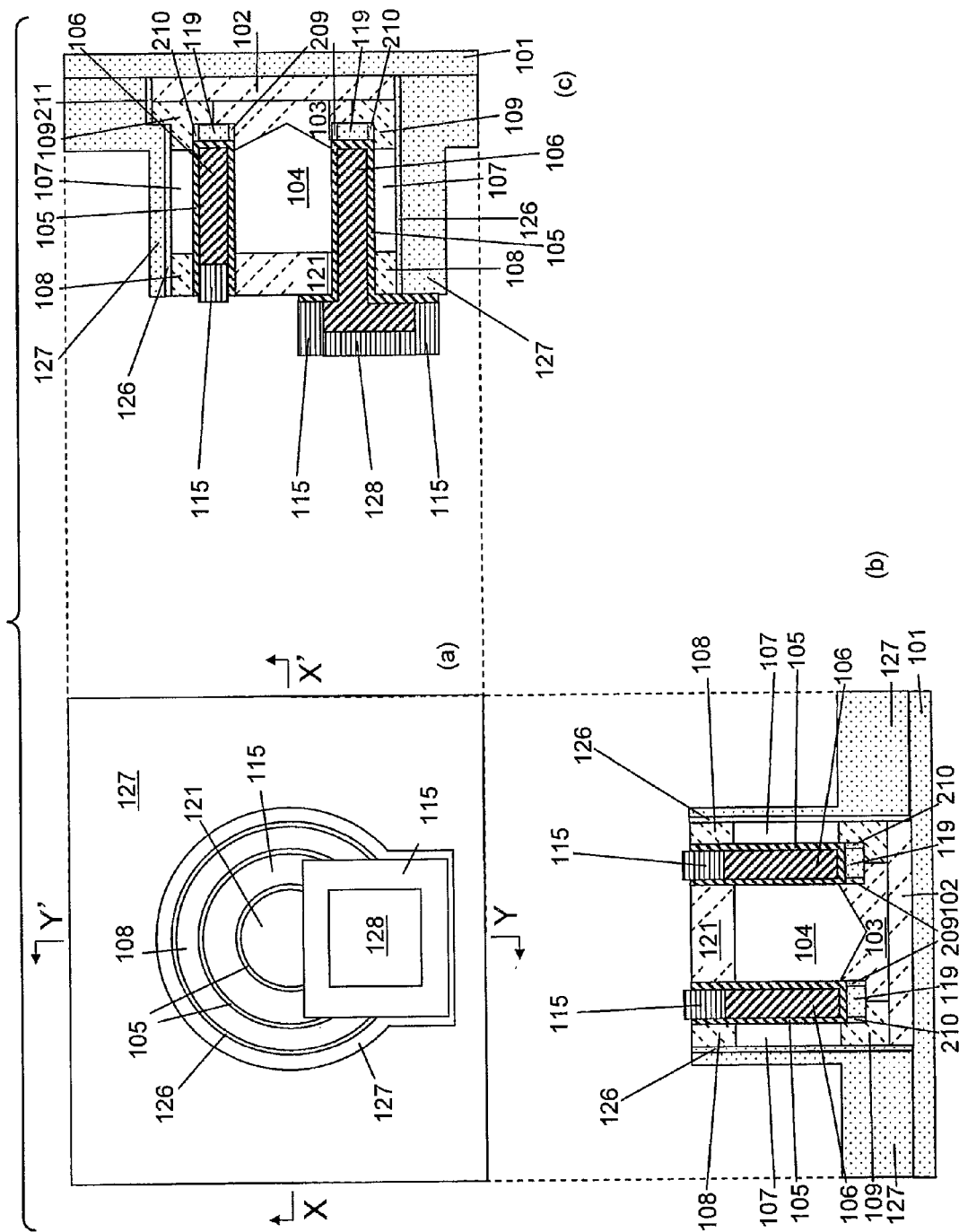

FIGS. 45(a) to 45(c) show a step in the example of the production method for the semiconductor device according to the embodiment, wherein FIG. 45(a), FIG. 45(b) and FIG. 45(c) are a top plan view, a sectional view taken along the line X-X' in FIG. 45(a), and a sectional view taken along the line Y-Y' in FIG. 45(a).

Figure 46:
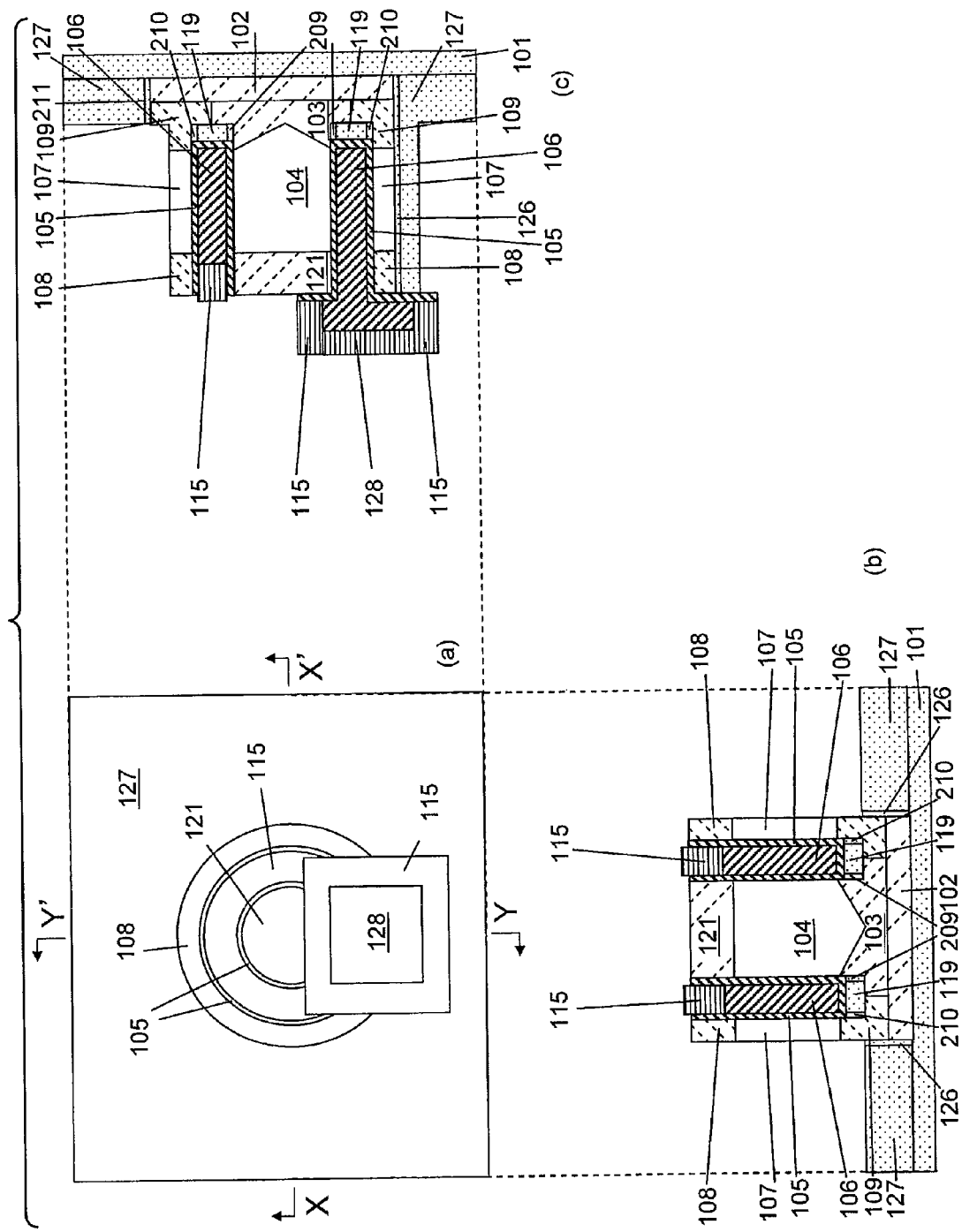

FIGS. 46(a) to 46(c) show a step in the example of the production method for the semiconductor device according to the embodiment, wherein FIG. 46(a), FIG. 46(b) and FIG. 46(c) are a top plan view, a sectional view taken along the line X-X' in FIG. 46(a), and a sectional view taken along the line Y-Y' in FIG. 46(a).

Figure 47:
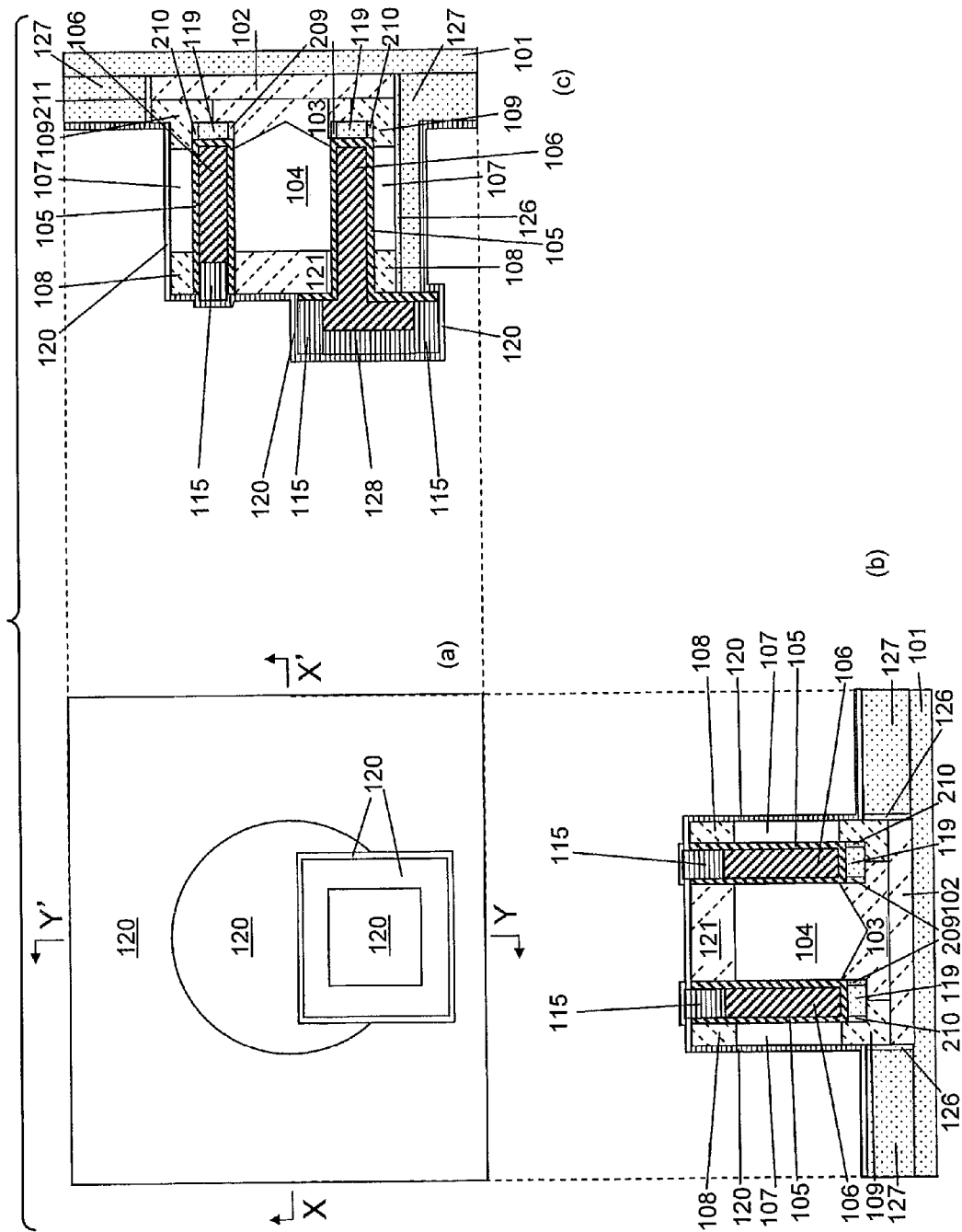

FIGS. 47(a) to 47(c) show a step in the example of the production method for the semiconductor device according to the embodiment, wherein FIG. 47(a), FIG. 47(b) and FIG. 47(c) are a top plan view, a sectional view taken along the line X-X' in FIG. 47(a), and a sectional view taken along the line Y-Y' in FIG. 47(a).

Figure 48:
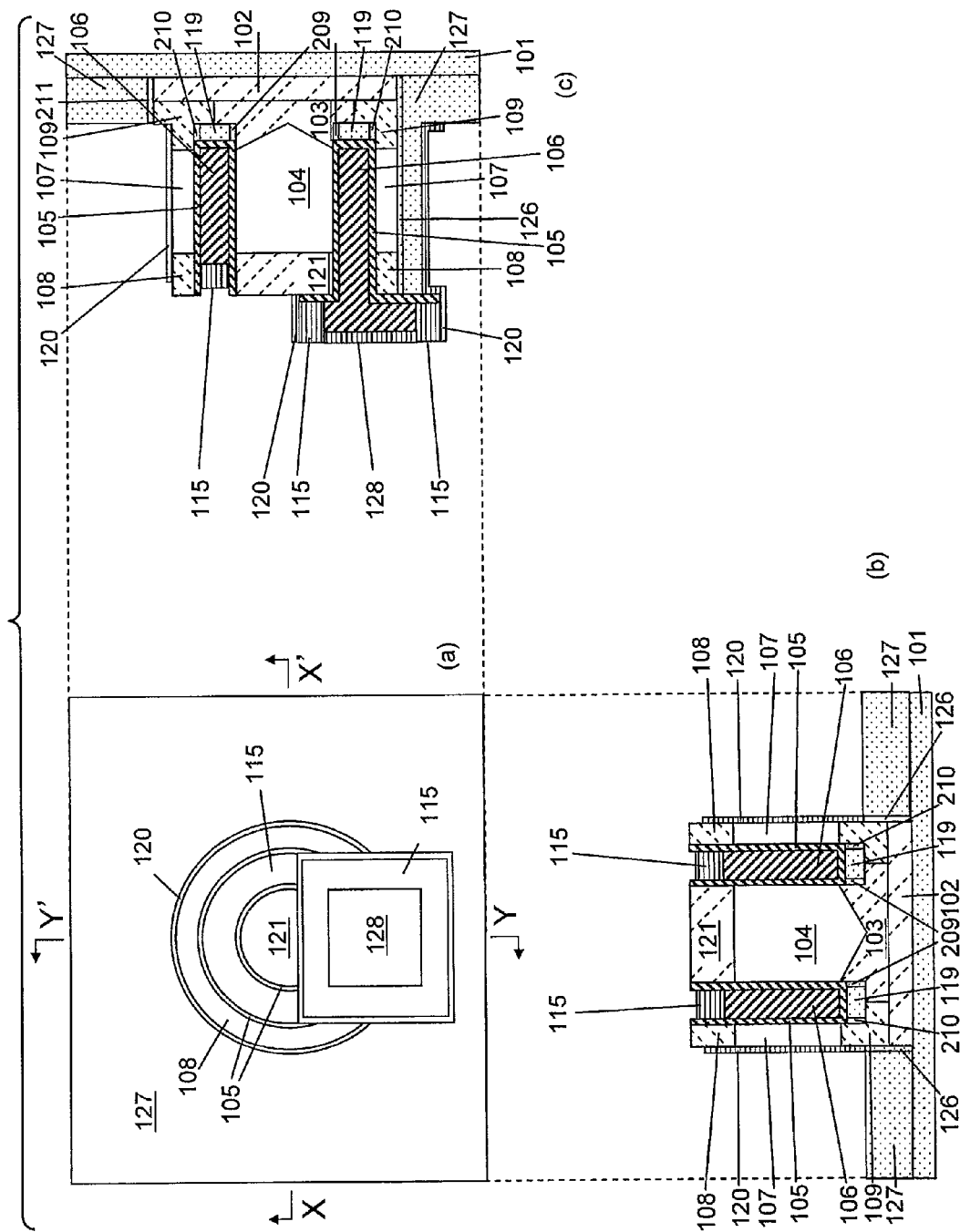

FIGS. 48(a) to 48(c) show a step in the example of the production method for the semiconductor device according to the embodiment, wherein FIG. 48(a), FIG. 48(b) and FIG. 48(c) are a top plan view, a sectional view taken along the line X-X' in FIG. 48(a), and a sectional view taken along the line Y-Y' in FIG. 48(a).

Figure 49:
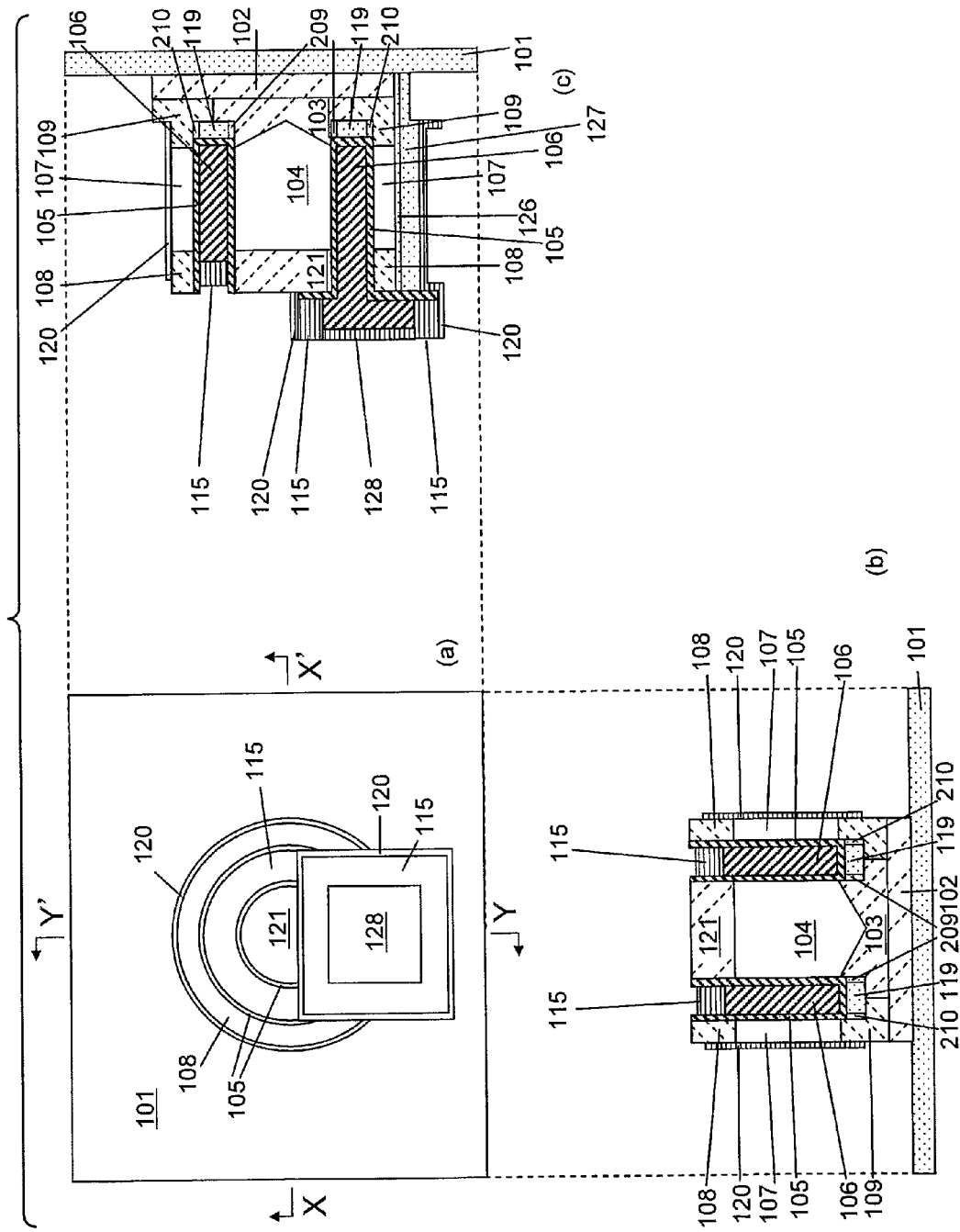

FIGS. 49(a) to 49(c) show a step in the example of the production method for the semiconductor device according to the embodiment, wherein FIG. 49(a), FIG. 49(b) and FIG. 49(c) are a top plan view, a sectional view taken along the line X-X' in FIG. 49(a), and a sectional view taken along the line Y-Y' in FIG. 49(a).

Figure 50:
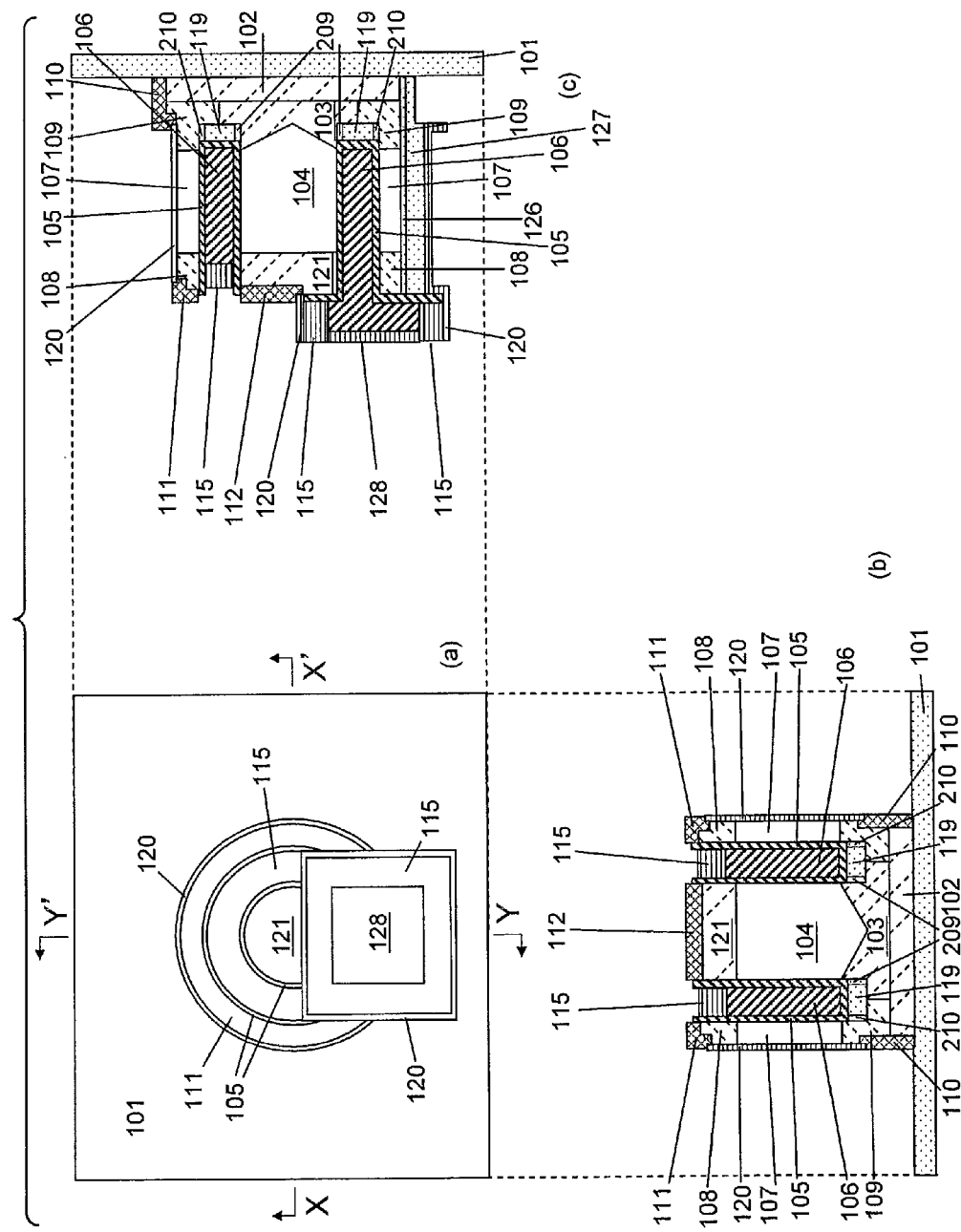

FIGS. 50(a) to 50(c) show a step in the example of the production method for the semiconductor device according to the embodiment, wherein FIG. 50(a), FIG. 50(b) and FIG. 50(c) are a top plan view, a sectional view taken along the line X-X' in FIG. 50(a), and a sectional view taken along the line Y-Y' in FIG. 50(a).

Figure 51:
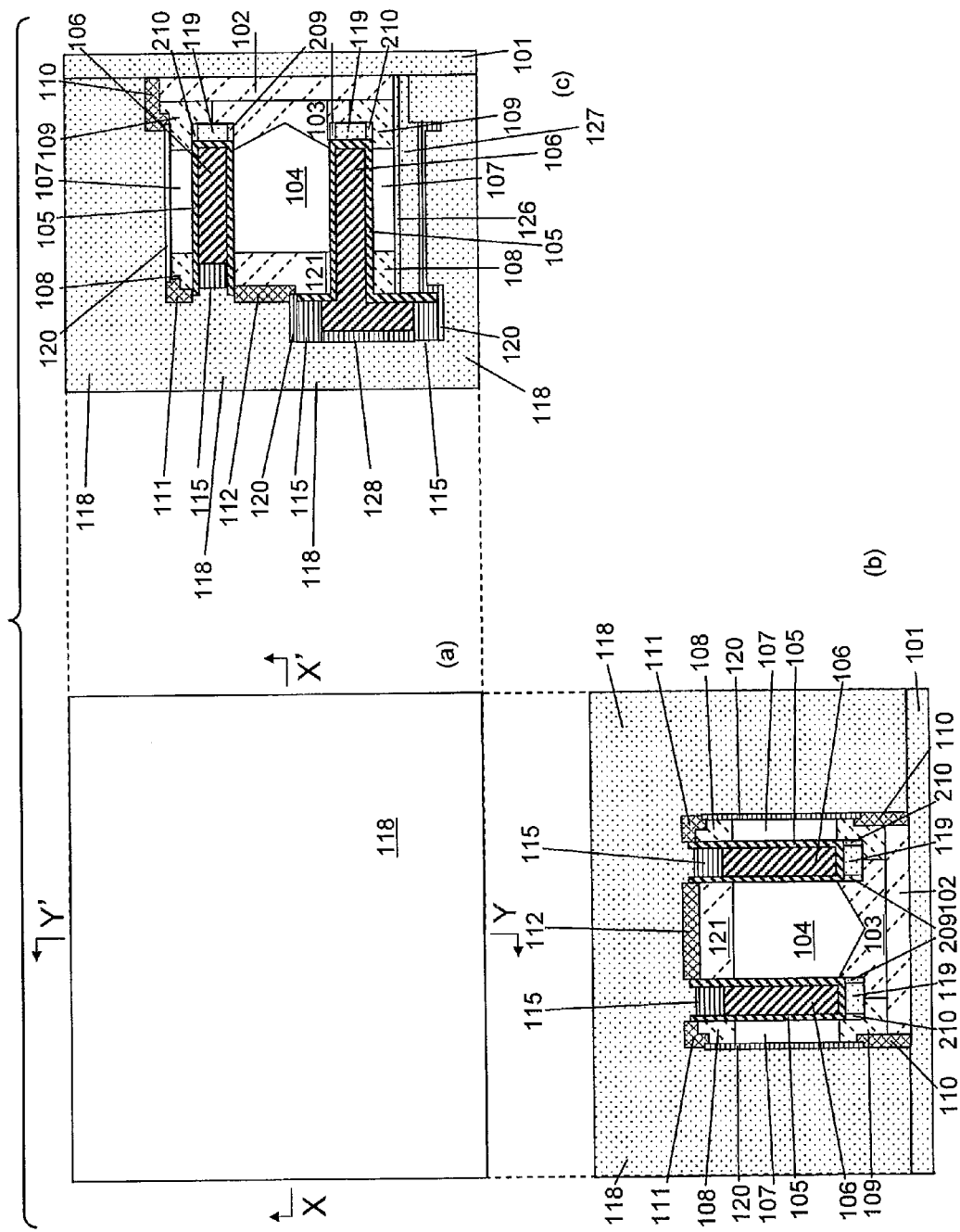

FIGS. 51(a) to 51(c) show a step in the example of the production method for the semiconductor device according to the embodiment, wherein FIG. 51(a), FIG. 51(b) and FIG. 51(c) are a top plan view, a sectional view taken along the line X-X' in FIG. 51(a), and a sectional view taken along the line Y-Y' in FIG. 51(a).

Figure 52:
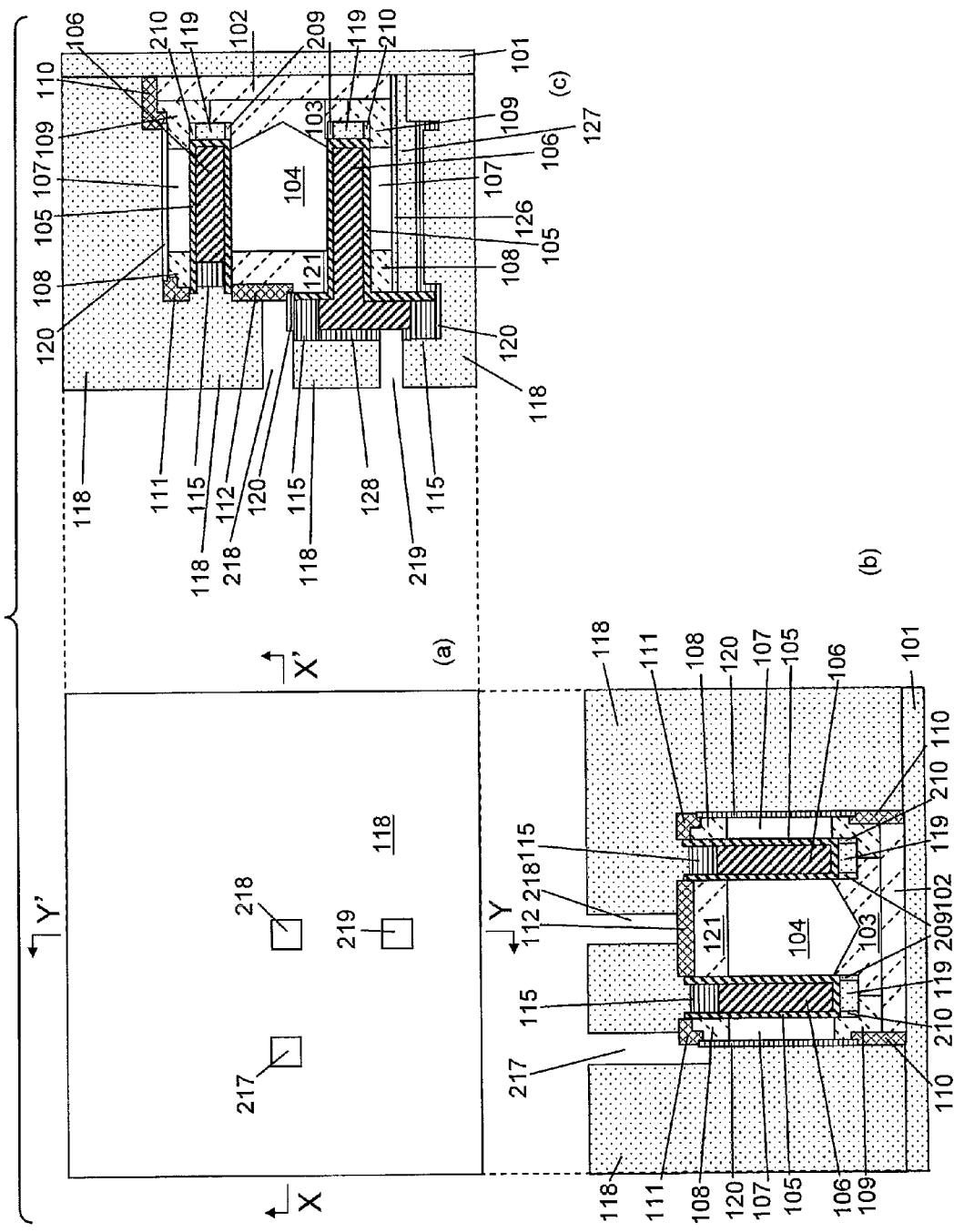

FIGS. 52(a) to 52(c) show a step in the example of the production method for the semiconductor device according to the embodiment, wherein FIG. 52(a), FIG. 52(b) and FIG. 52(c) are a top plan view, a sectional view taken along the line X-X' in FIG. 52(a), and a sectional view taken along the line Y-Y' in FIG. 52(a).

Figure 53:
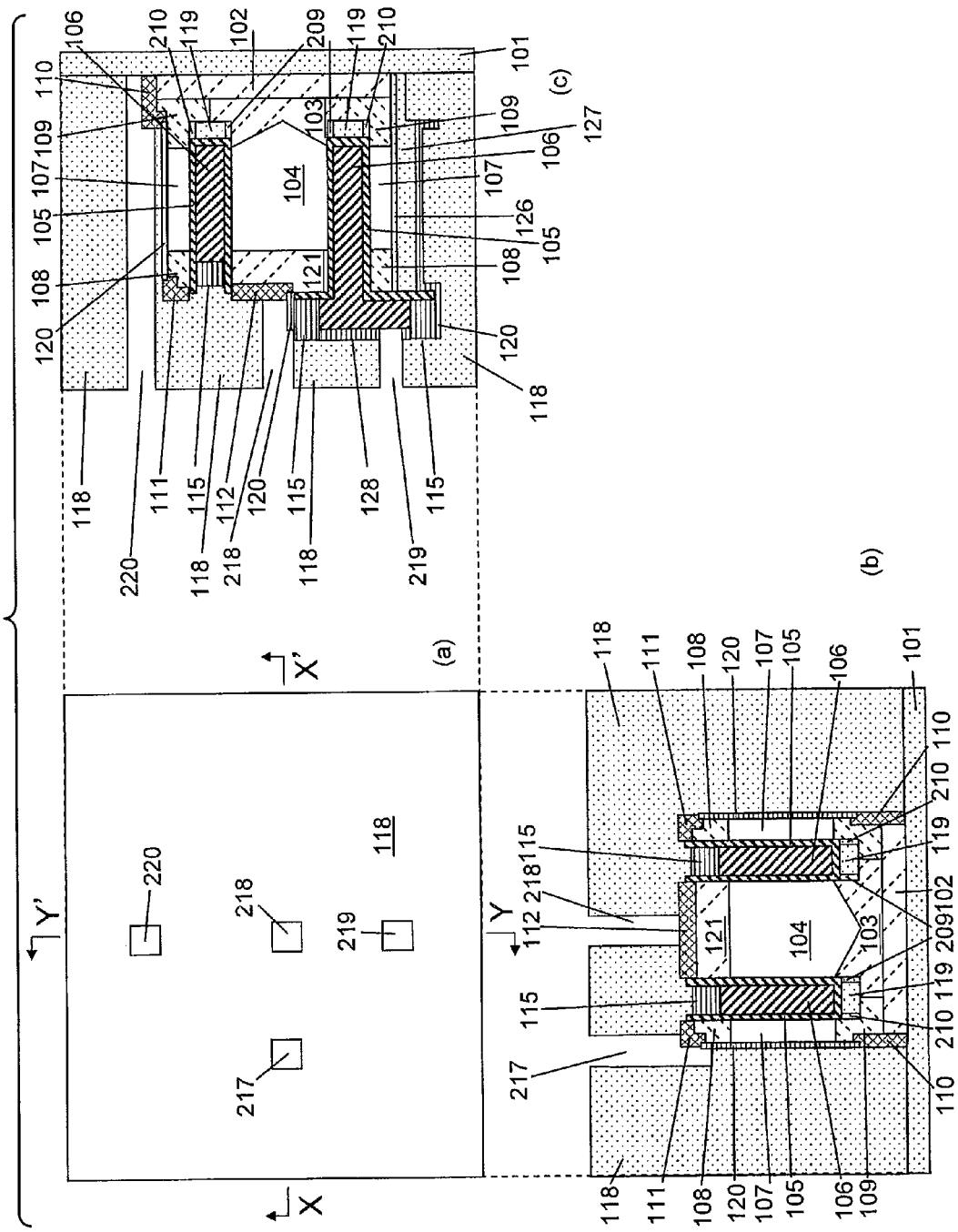

FIGS. 53(a) to 53(c) show a step in the example of the production method for the semiconductor device according to the embodiment, wherein FIG. 53(a), FIG. 53(b) and FIG. 53(c) are a top plan view, a sectional view taken along the line X-X' in FIG. 53(a), and a sectional view taken along the line Y-Y' in FIG. 53(a).

Figure 54:
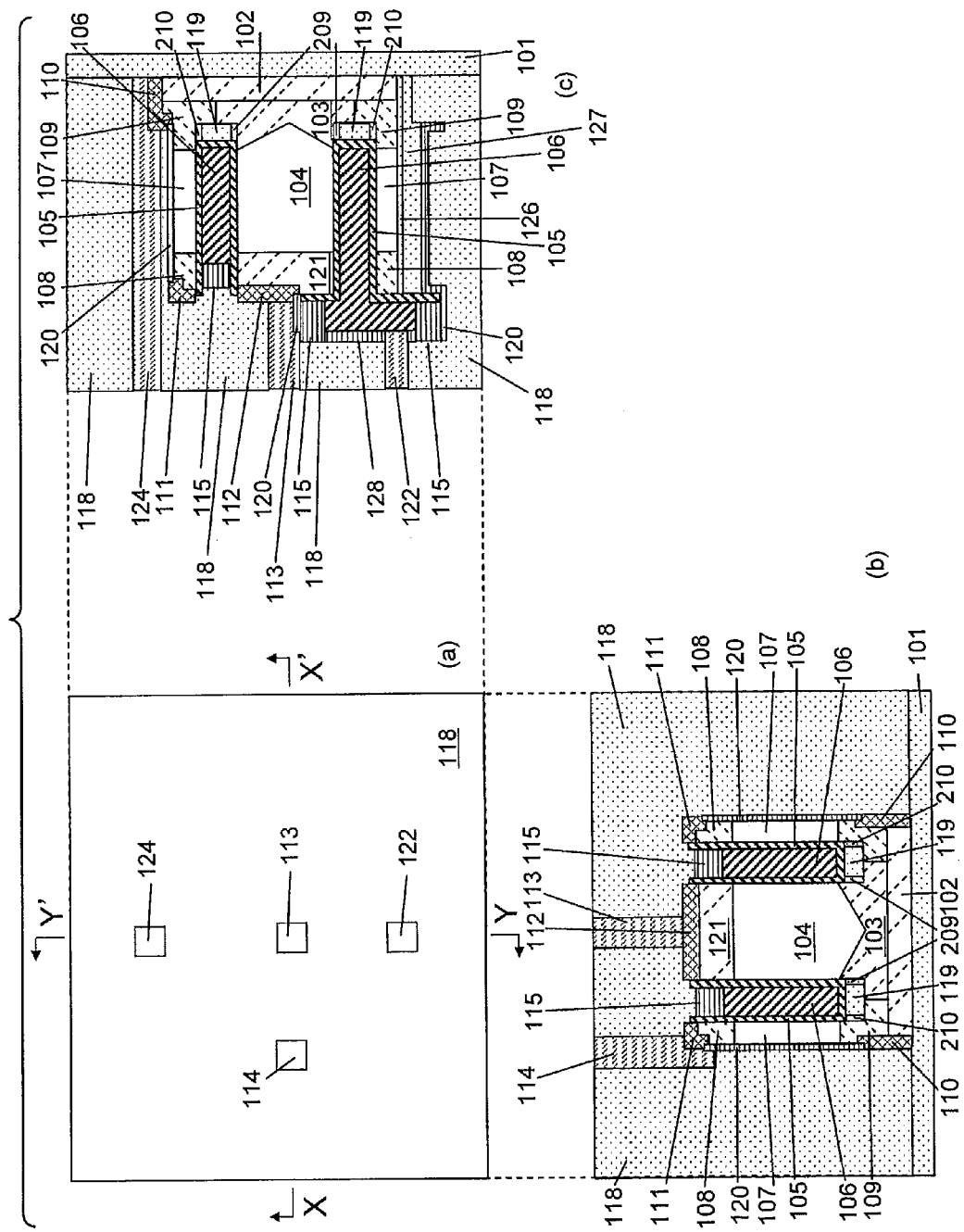

FIGS. 54(a) to 54(c) show a step in the example of the production method for the semiconductor device according to the embodiment, wherein FIG. 54(a), FIG. 54(b) and FIG. 54(c) are a top plan view, a sectional view taken along the line X-X' in FIG. 54(a), and a sectional view taken along the line Y-Y' in FIG. 54(a).

FIGS. 55(a) to 55(c) show a step in the example of the production method for the semiconductor device according to the embodiment, wherein FIG. 55(a), FIG. 55(b) and FIG. 55(c) are a top plan view, a sectional view taken along the line X-X' in FIG. 55(a), and a sectional view taken along the line Y-Y' in FIG. 55(a).

DETAILED DESCRIPTION OF THE PREFERRED EMBODIMENTS

Figure 1:
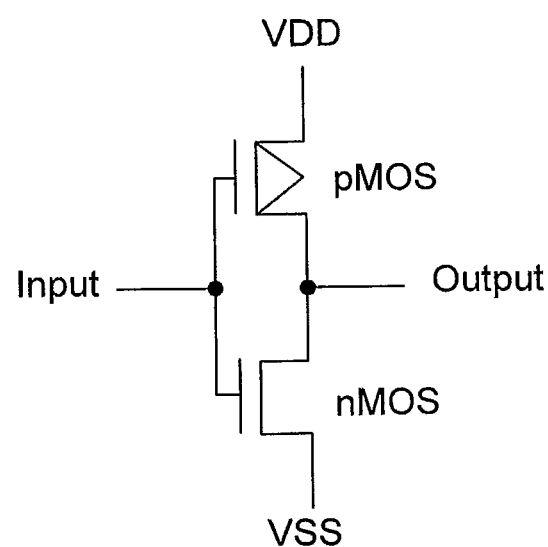
FIG. 1 is a circuit diagram showing an inverter.
Figure 2:
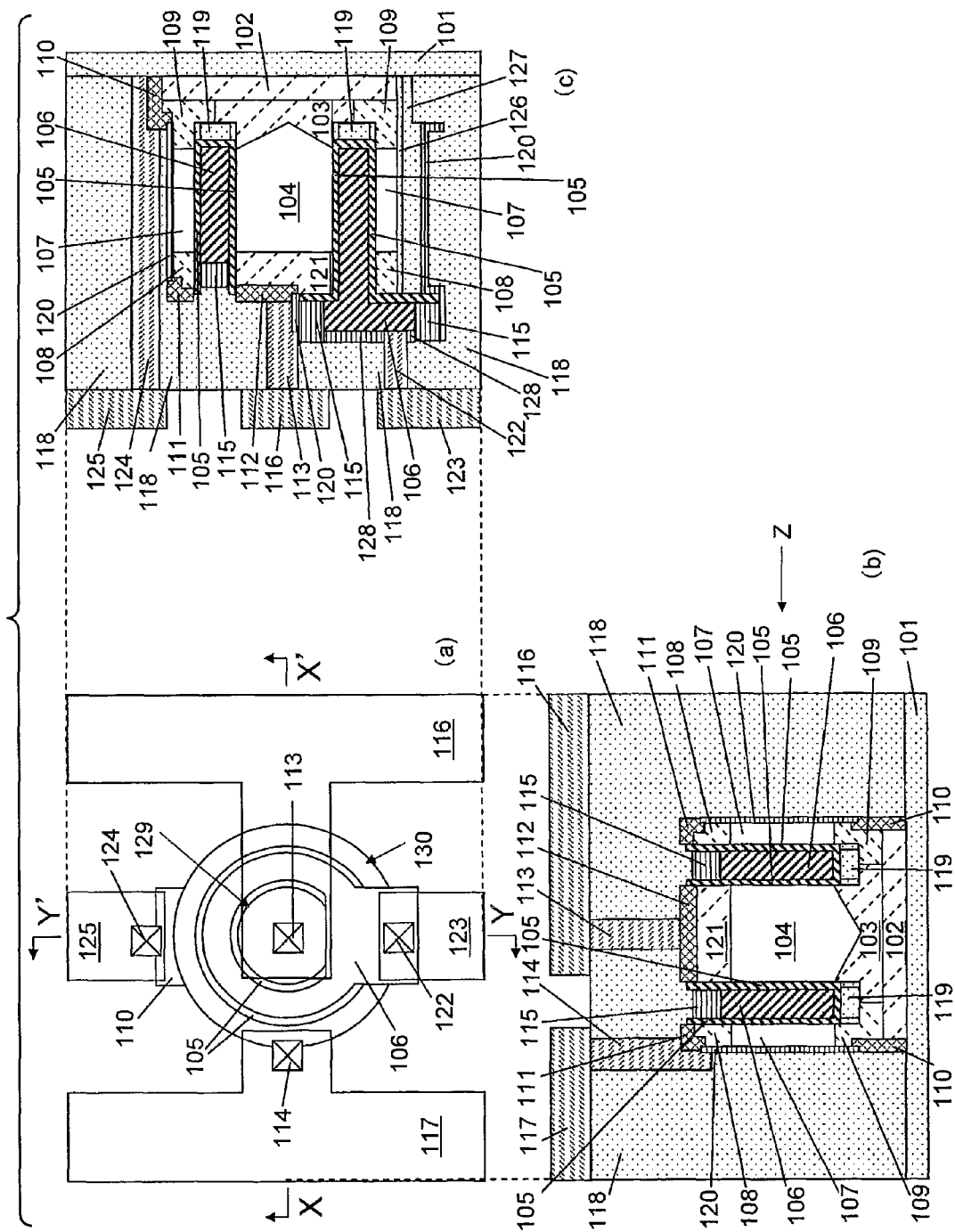
Figure 3:
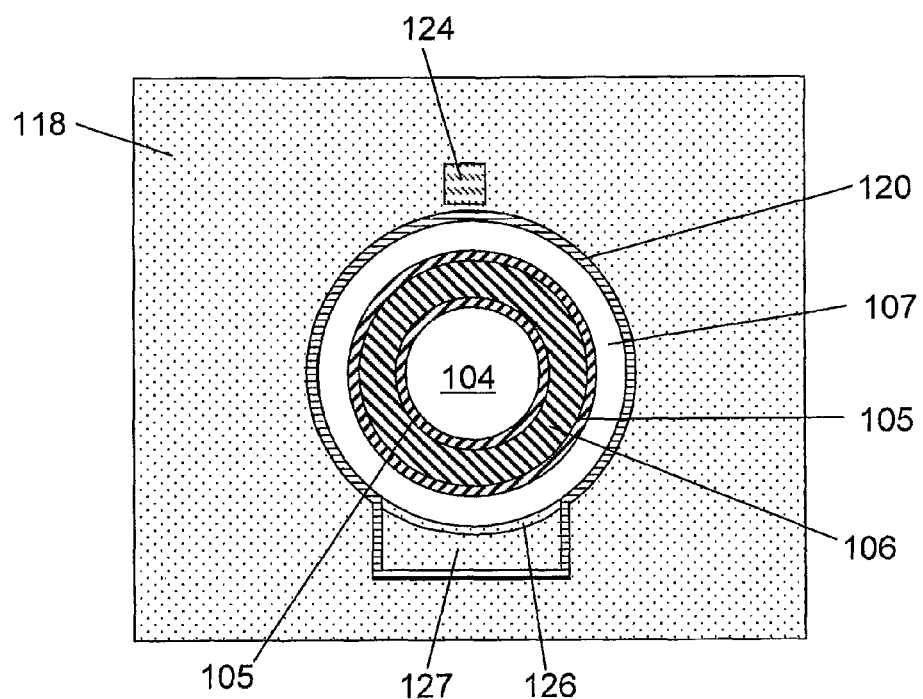
FIG. 3 is a sectional top plan view taken at the position Z in FIG. 2(b).

FIGS. 2(a), 2(b), 2(c) and 3 show a structure of a semiconductor device according to one embodiment of the present invention, wherein FIG. 2(a), FIG. 2(b), FIG. 2(c) and FIG. 3 are a top plan view of the semiconductor device, a sectional view taken along the line X-X' in FIG. 2(a), a sectional view taken along the line Y-Y' in FIG. 2(a), and a sectional top plan view taken at the position Z in FIG. 2(b).

The semiconductor device according to this embodiment comprises: an island-shaped silicon layer 104; a first gate dielectric film 105 surrounding a periphery of the island-shaped silicon layer 104; a gate electrode 106 surrounding a periphery of the first gate dielectric film 105; a second gate dielectric film 105 surrounding a periphery of the gate electrode 106; a tubular silicon layer 107 surrounding a periphery of the second gate dielectric film 105; a first n+-type silicon layer 121 disposed on top of the island-shaped silicon layer 104; a second n+-type silicon layer 103 disposed underneath the island-shaped silicon layer 104; a first p+-type silicon layer 108 disposed on top of the tubular silicon layer 107; a second p+-type silicon layer 109 disposed underneath the tubular silicon layer 107; a third n+-type silicon layer 102 disposed underneath the second n+-type silicon layer 103 and the second p+-type silicon layer 109; a first silicon-metal compound layer 110 formed in a part of sidewalls of the second p+-type silicon layer 109 and the third n+-type silicon layer 102; a second silicon-metal compound layer 112 formed in an upper portion of the first n+-type silicon layer 121; and a third silicon-metal compound layer 111 formed in an upper portion of the first p+-type silicon layer 108.

A combination of the island-shaped silicon layer 104, the first gate dielectric film 105 surrounding the periphery of the island-shaped silicon layer 104, the gate electrode 106 surrounding the periphery of the first gate dielectric film 105, the first n+-type silicon layer 121 disposed on top of the island-shaped silicon layer 104 and the second n+-type silicon layer 103 disposed underneath the island-shaped silicon layer 104, forms an nMOS SGT 129. Further, a combination of the gate electrode 106, the second gate dielectric film 105 surrounding the periphery of the gate electrode 106, the tubular silicon layer 107 surrounding the periphery of the second gate dielectric film 105, the first p+-type silicon layer 108 disposed on top of the tubular silicon layer 107 and the second p+-type silicon layer 109 disposed underneath the tubular silicon layer 107 forms a pMOS transistor.

A contact 122 is formed to be connected to the gate electrode 106, and an input terminal 123 is formed to be connected to the contact 122. A contact 124 is formed to be connected to the first silicon-metal compound layer 110, and an output terminal 125 is formed to be connected to the contact 124. A contact 113 is formed to be connected to the second silicon-metal compound layer 112, and a Vss power supply line 116 is formed to be connected to the contact 113. A contact 114 is formed to be connected to the third silicon-metal compound layer 111, and a Vdd power supply line 117 is formed to be connected to the contact 114. An oxide film 118 is formed as an interlayer film.

The semiconductor device may be designed to satisfy the following relation: Wp≈2Wn, wherein Wp is an inner circumferential length of the tubular silicon layer 107, and Wn is an outer circumferential length of the island-shaped silicon layer 104. In this case, the pMOS transistor can have a gate width which is two times greater than that of the nMOS transistor. Alternatively, the semiconductor device may be designed to satisfy the following relation: Rp≈2Rn, wherein Rp is an inner radius of the tubular silicon layer 107, and Rn is a radius of the island-shaped silicon layer 104. In this case, the pMOS transistor can also have a gate width which is two times greater than that of the nMOS transistor. In these cases, the semiconductor device is preferably designed to satisfy the following relation: Lp≈Ln, wherein Lp is a channel length of the tubular silicon layer, and Ln is a channel length of the island-shaped silicon layer.

Figure 4:
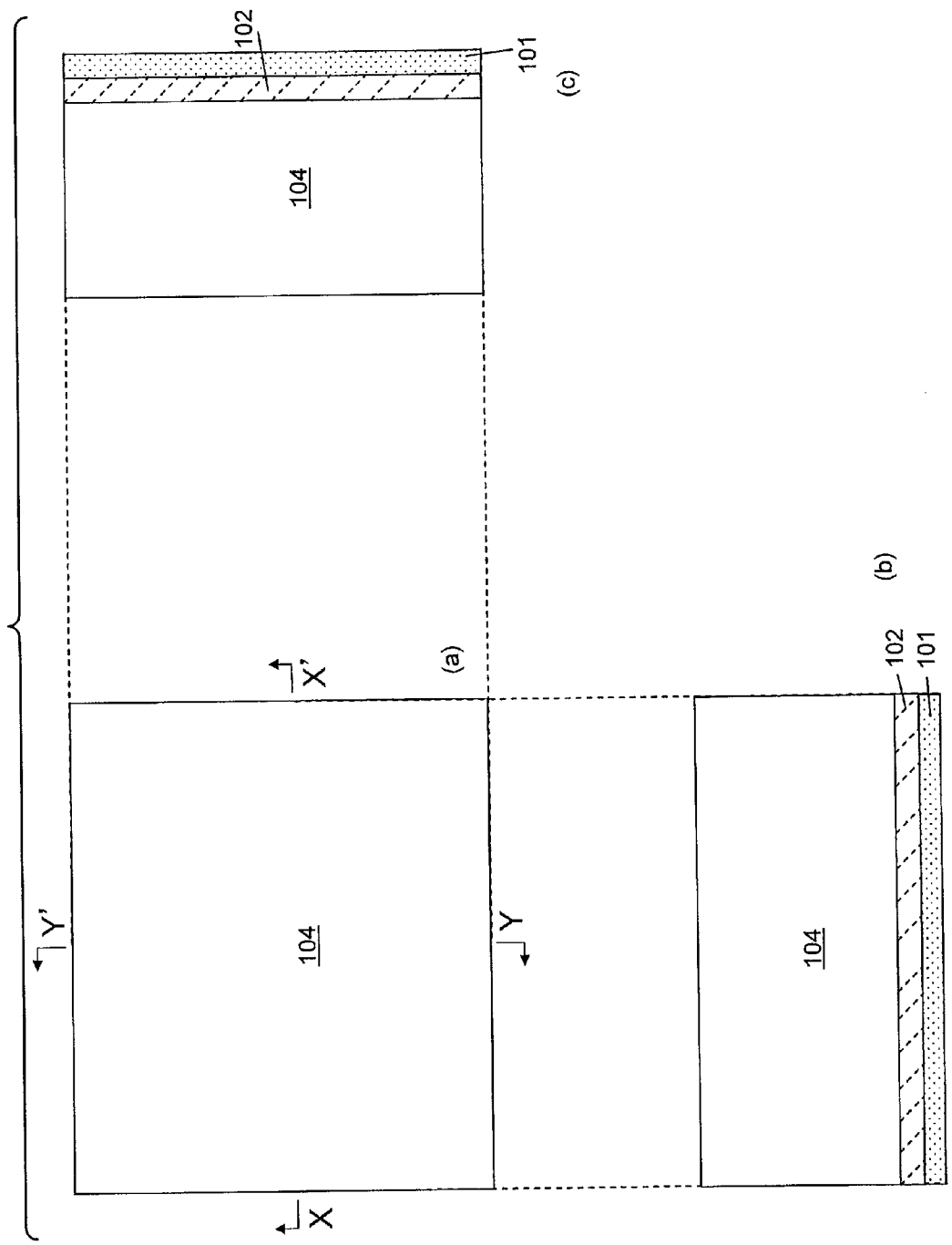
Figure 5:
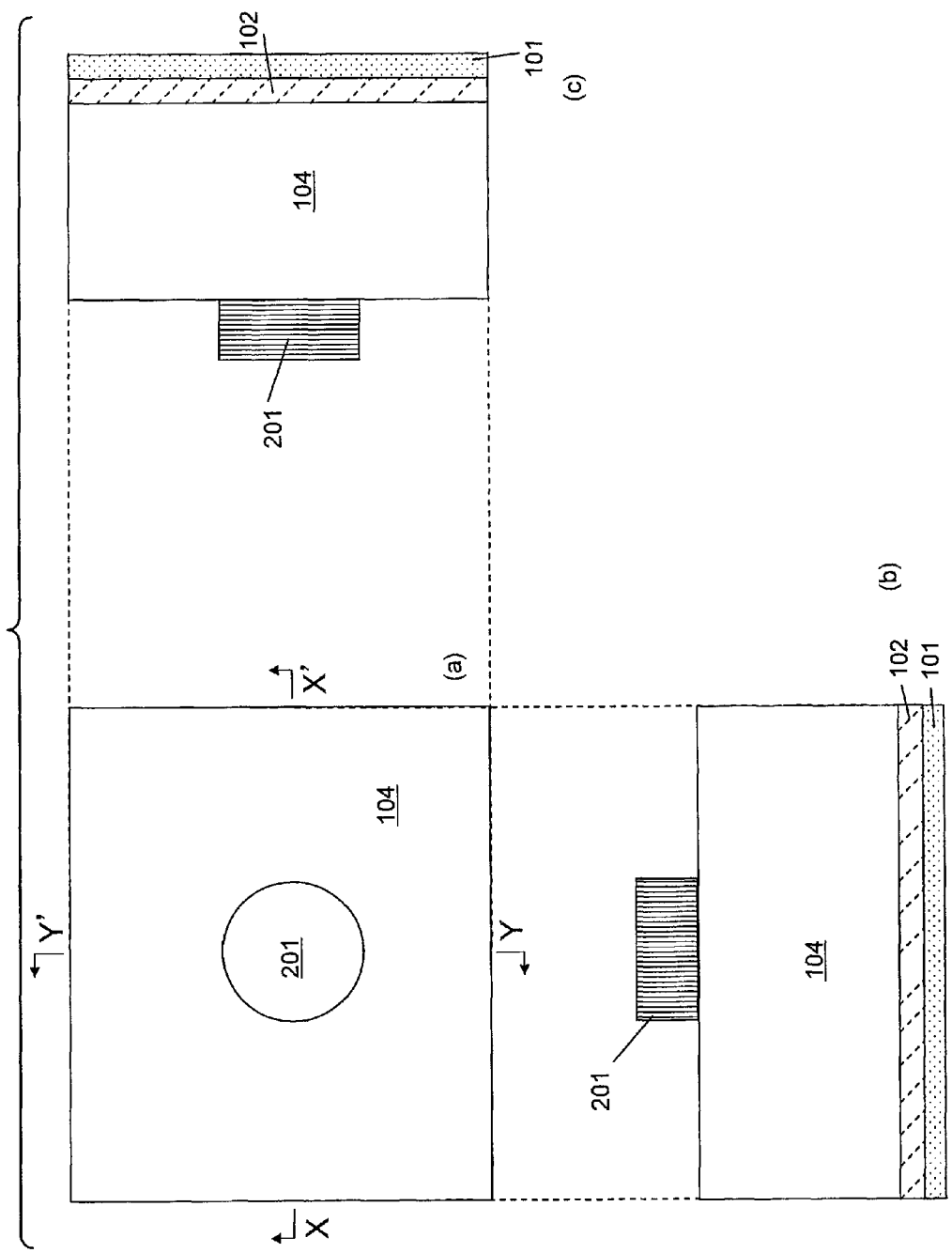

With reference to FIGS. 4(a) to 55(c), one example of a production process for forming the structure of the semiconductor device according to this embodiment will be described below. In FIGS. 4(a) to 55(c), the same elements or components are defined by a common reference numeral or code. FIGS. 4(a), 4(b) and 4(c) to FIGS. 5(a), 5(b) and 5(c) show respective steps of the production process, wherein the figure suffixed with (a) is a top plan view, and the figure suffixed with (b) and the figure suffixed with (c) are, respectively, a sectional view taken along the line X-X' in the figure suffixed with (a) and a sectional view taken along the line Y-Y' in the figure suffixed with (a).

Referring to FIGS. 4(a) to 4(c), arsenic (As) is implanted into a p-type or non-doped silicon layer 104 formed on an oxide layer 101 to form a third n+-type silicon layer 102 therein.

Referring to FIGS. 5(a) to 5(c), a resist 201 for forming an n-type silicon layer is formed. In cases where an after-mentioned non-doped silicon layer 107 is used, this step is unnecessary.

Figure 6:
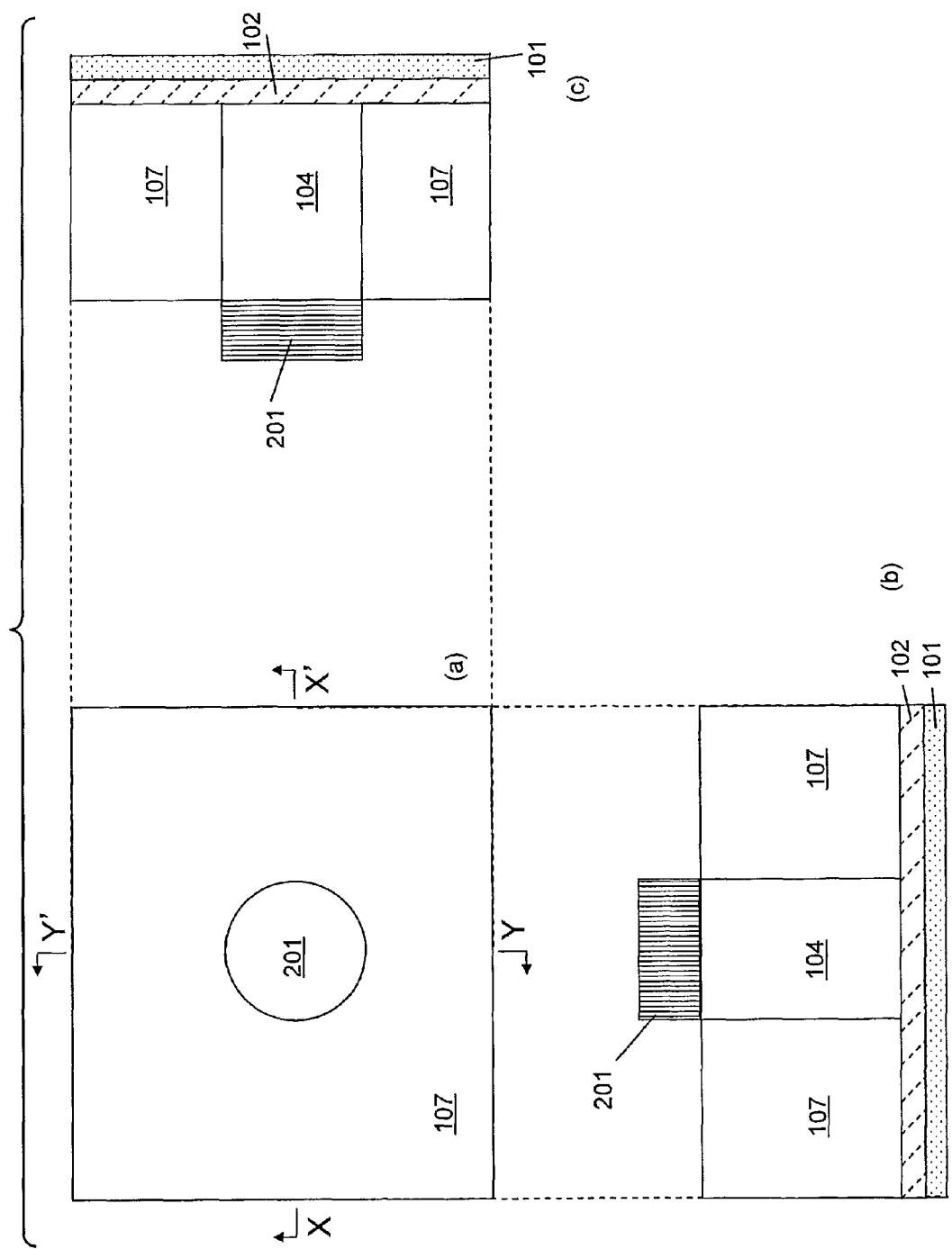

Referring to FIGS. 6(a) to 6(c), phosphorus (P) is implanted into the p-type or non-doped silicon layer 104 to form an n-type silicon layer 107. In cases where a non-doped silicon layer 107 is used, this step is unnecessary.

Figure 7:
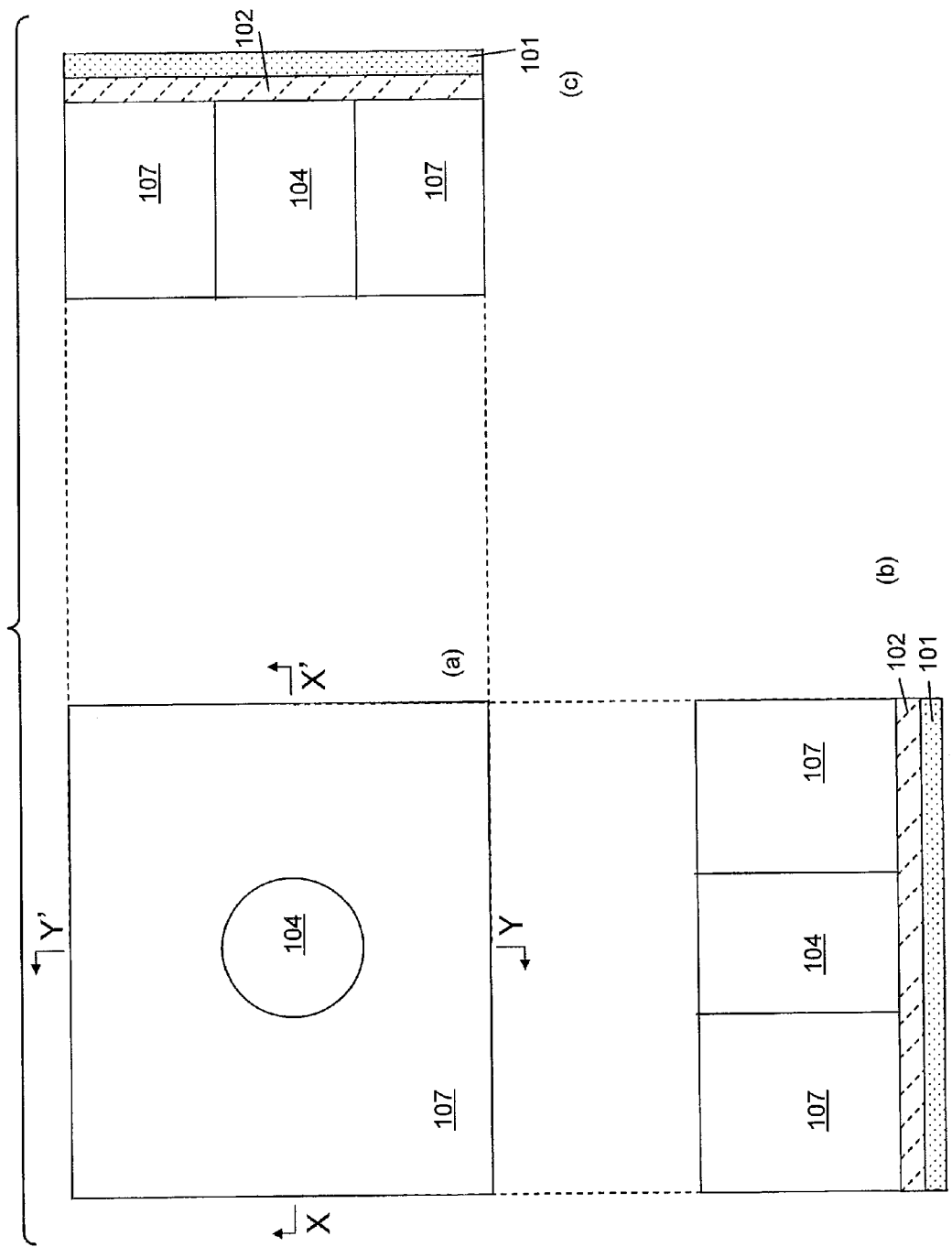

Referring to FIGS. 7(a) to 7(c), the resist 201 is stripped away, and then the silicon layers 104, 107 are subjected to a heat treatment. In cases where the non-doped silicon layer 107 is used, this step is unnecessary.

Figure 8:
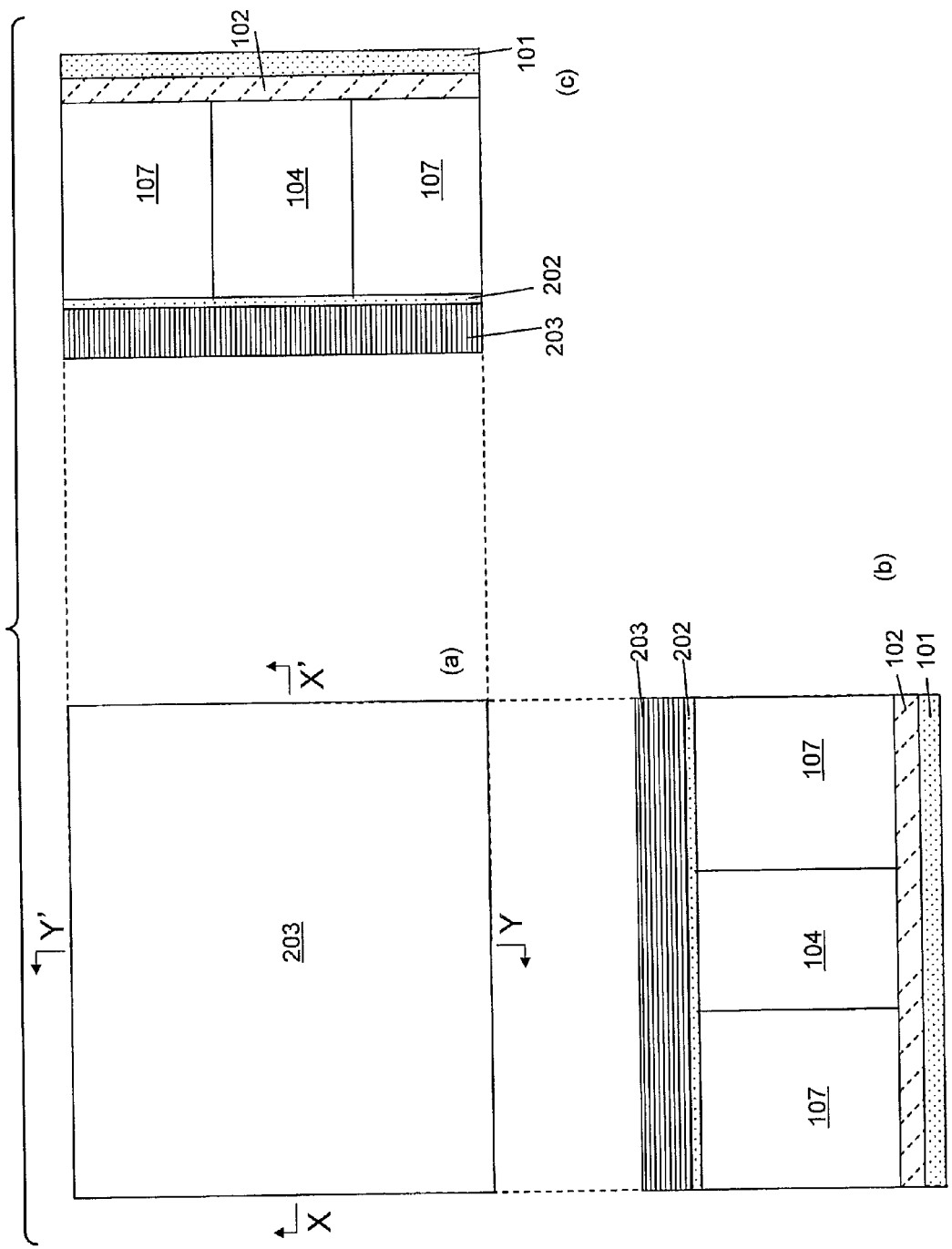

Referring to FIGS. 8(a) to 8(c), an oxide film 202 is deposited, and then a nitride film 203 is deposited.

Figure 9:
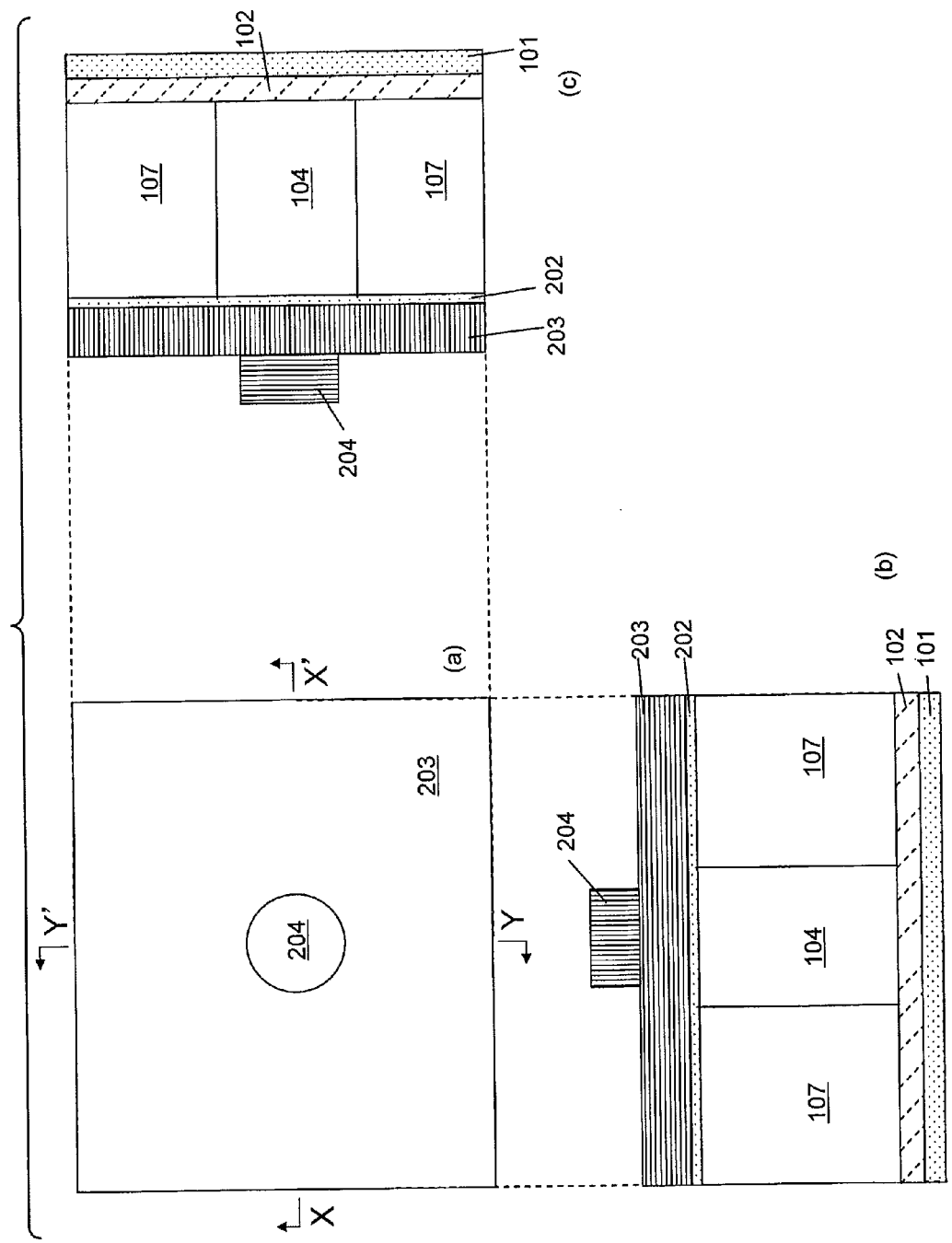

Referring to FIGS. 9(a) to 9(c), a resist 204 for forming an island-shaped silicon layer is formed.

Figure 10:
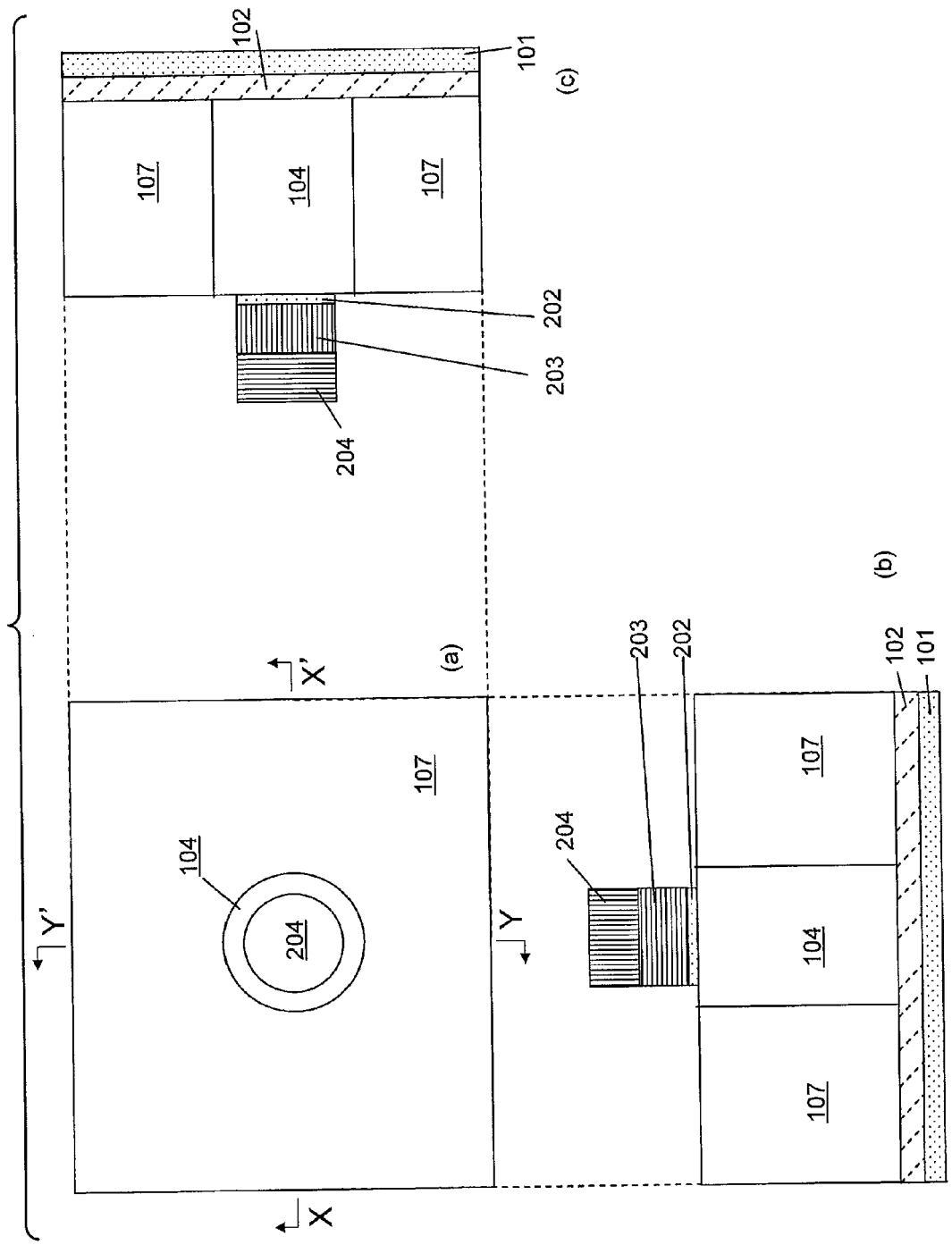

Referring to FIGS. 10(a) to 10(c), the nitride film 203 and the oxide film 202 are etched.

Figure 11:
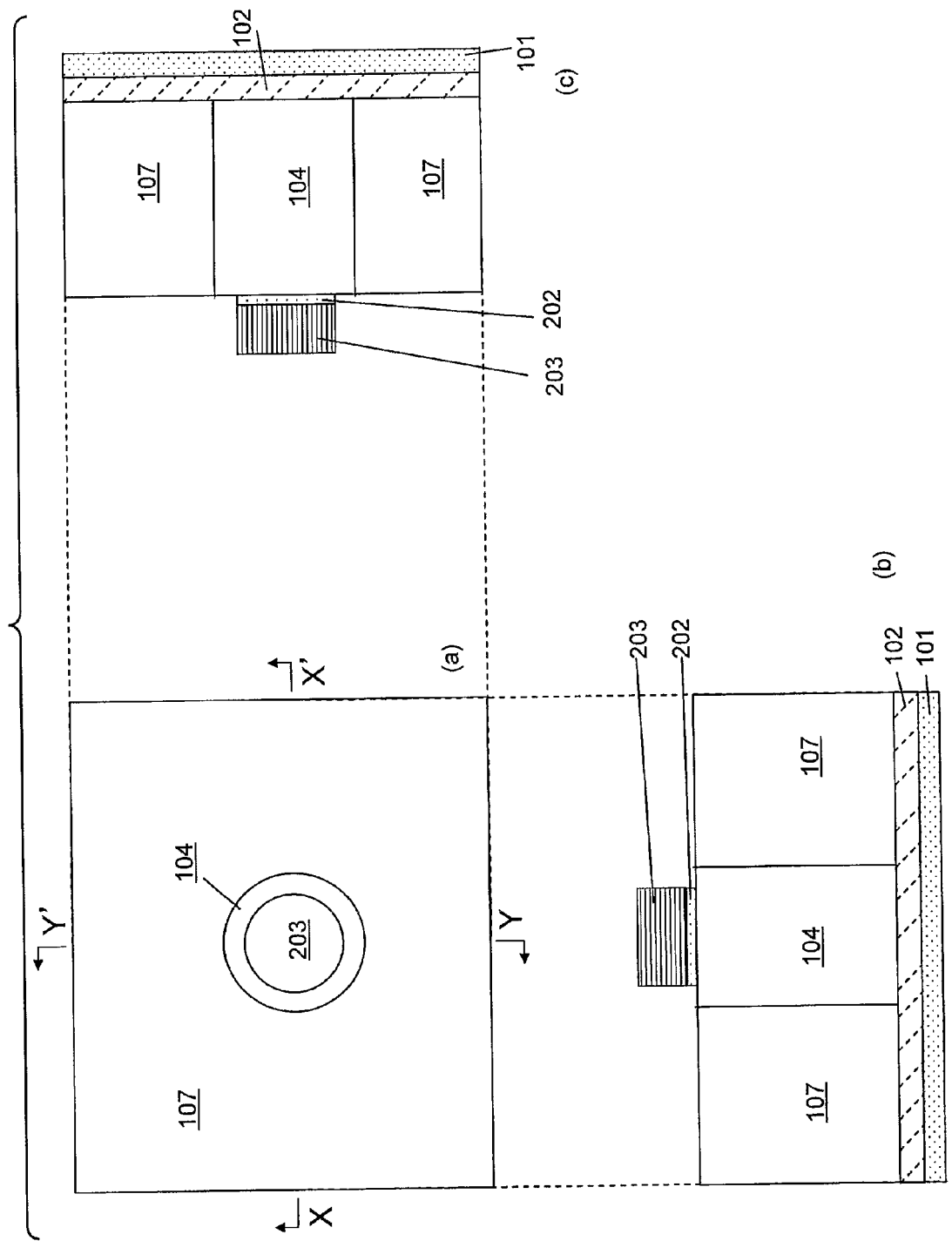

Referring to FIGS. 11(a) to 11(c), the resist 204 is stripped away.

Figure 12:
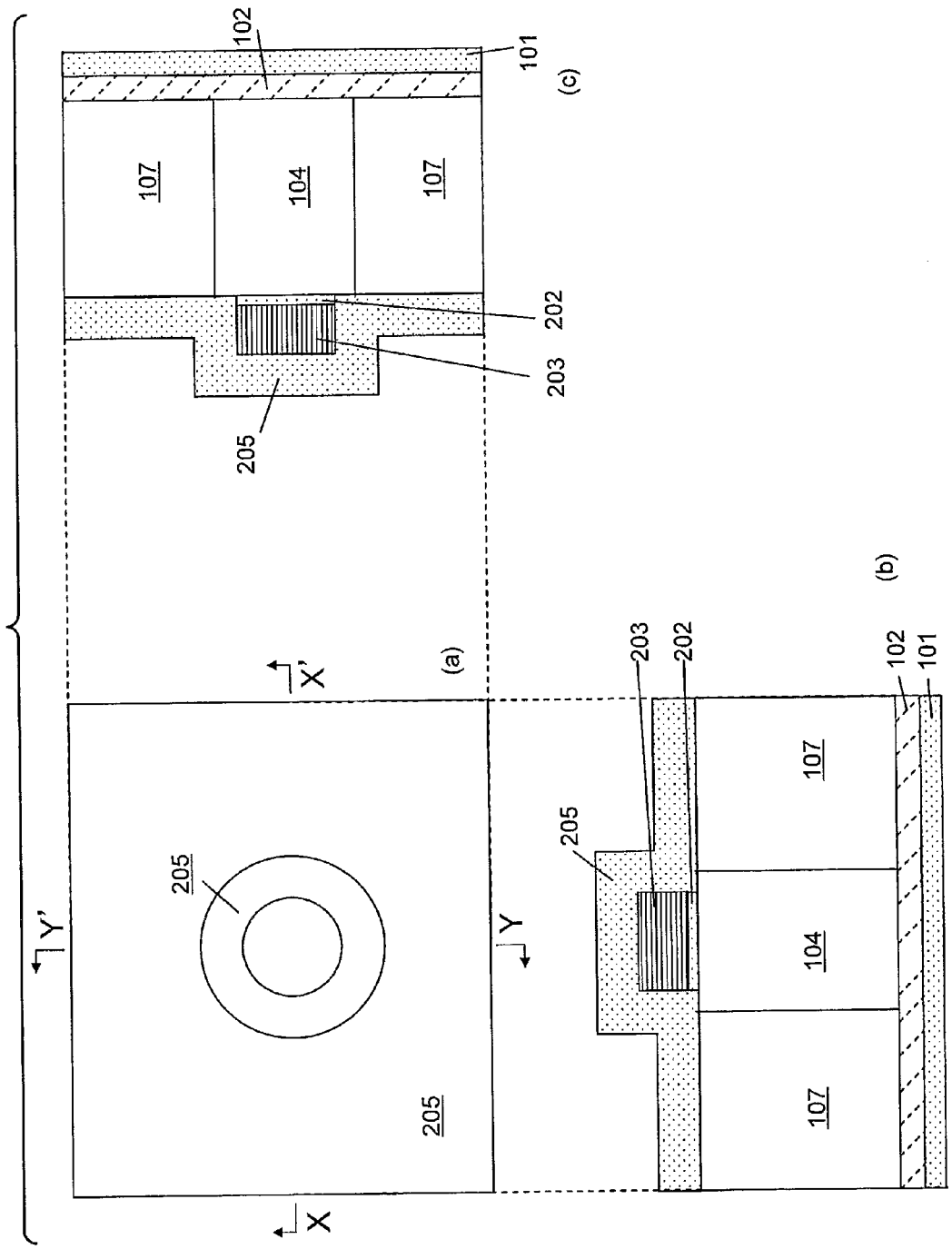

Referring to FIGS. 12(a) to 12(c), an oxide film 205 is deposited. Preferably, in this step, a film thickness of the oxide film 205 is set such that an oxide film-based sidewall to be formed by etching back the oxide film 205 in a next step has a width equal to a radius of the nitride film 205.

Figure 13:
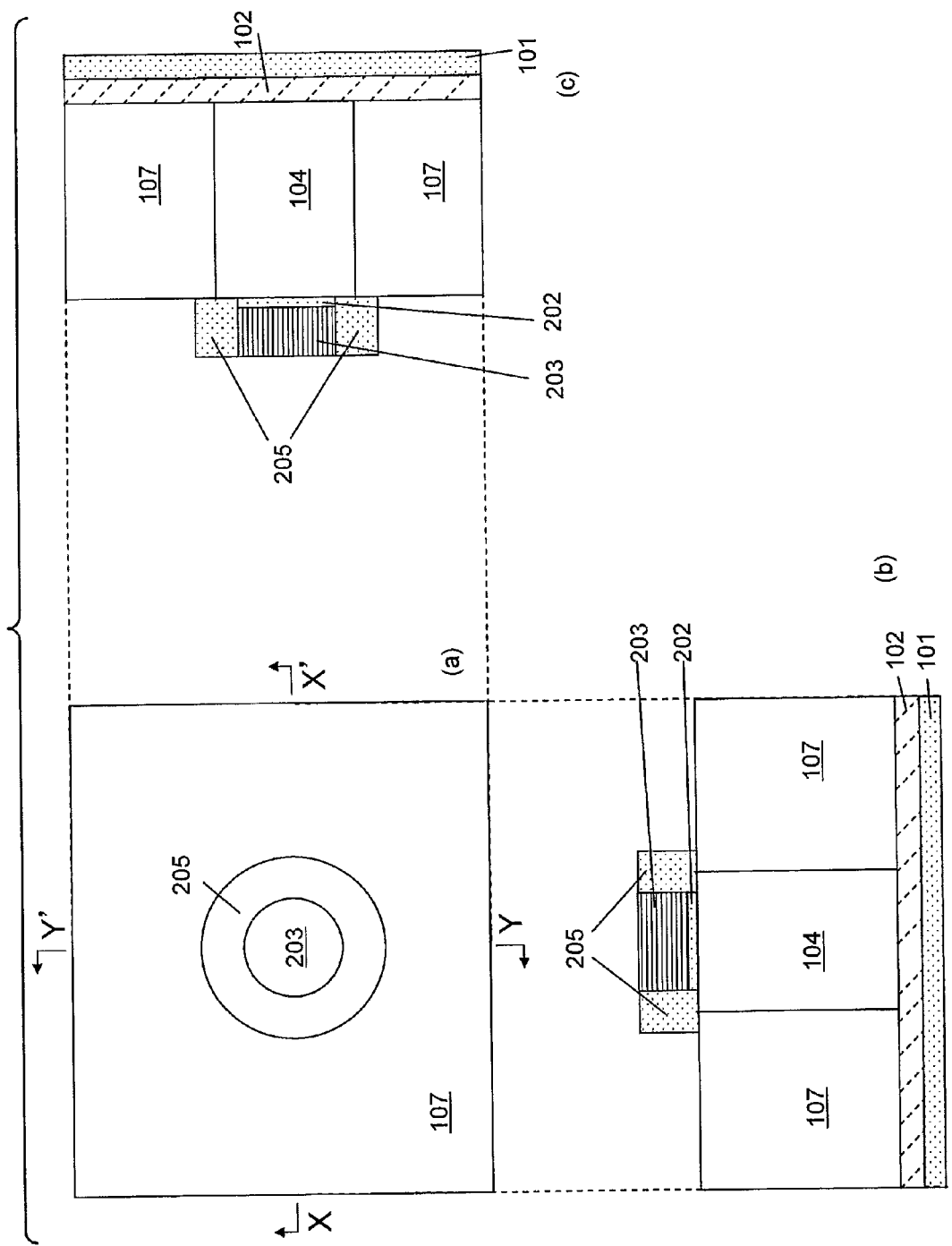

Referring to FIGS. 13(a) to 13(c), the oxide film 205 is etched to form an oxide film-based sidewall. This oxide film-based sidewall defines a position of a gate-forming region to be formed in a subsequent step.

Figure 14:
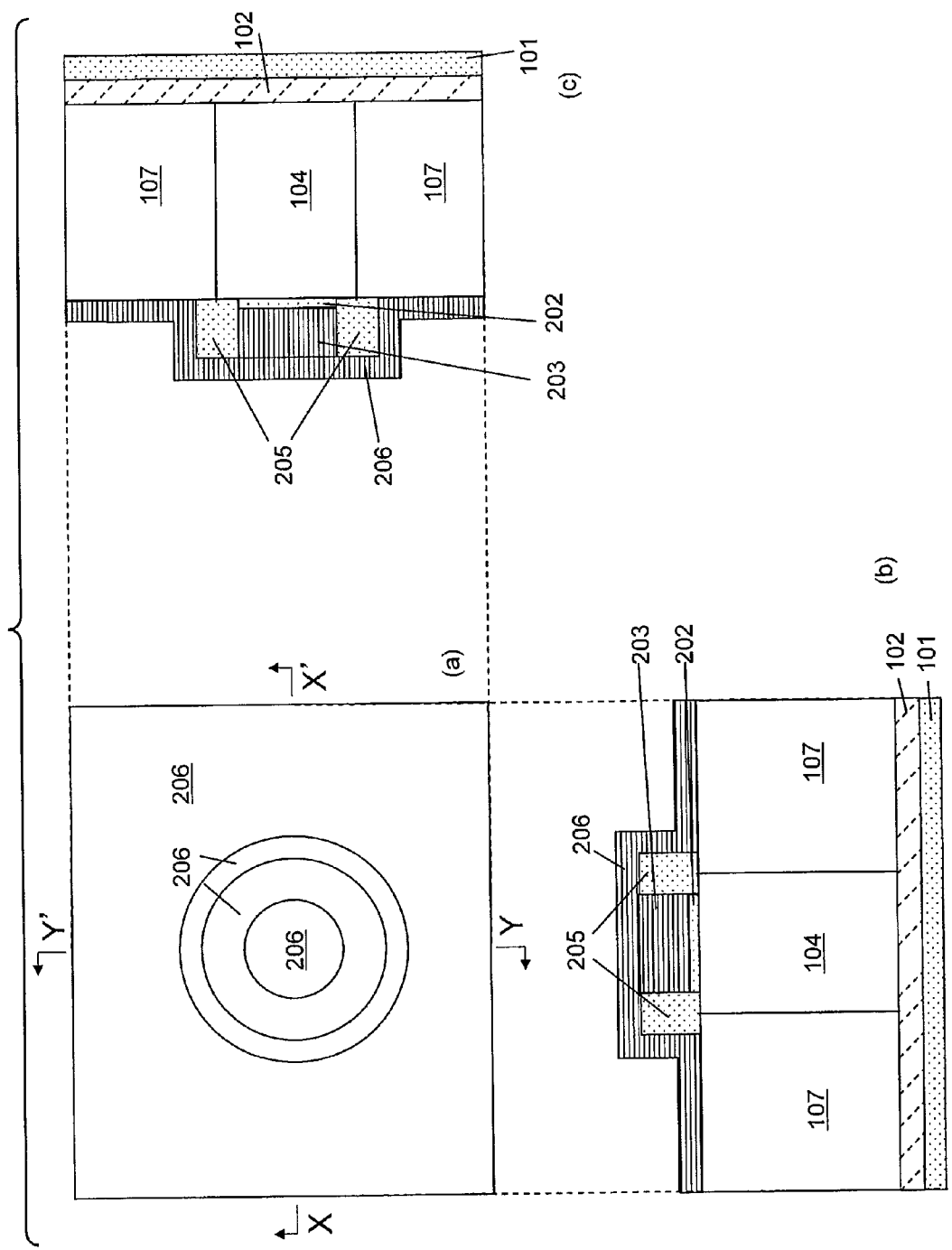

Referring to FIGS. 14(a) to 14(c), a nitride film 206 is deposited. Preferably, in this step, a film thickness of the nitride film 206 is set such that a nitride film-based sidewall to be formed by etching back the nitride film 206 in a next step has a width equal to a desired thickness of an after-mentioned tubular silicon layer.

Figure 15:
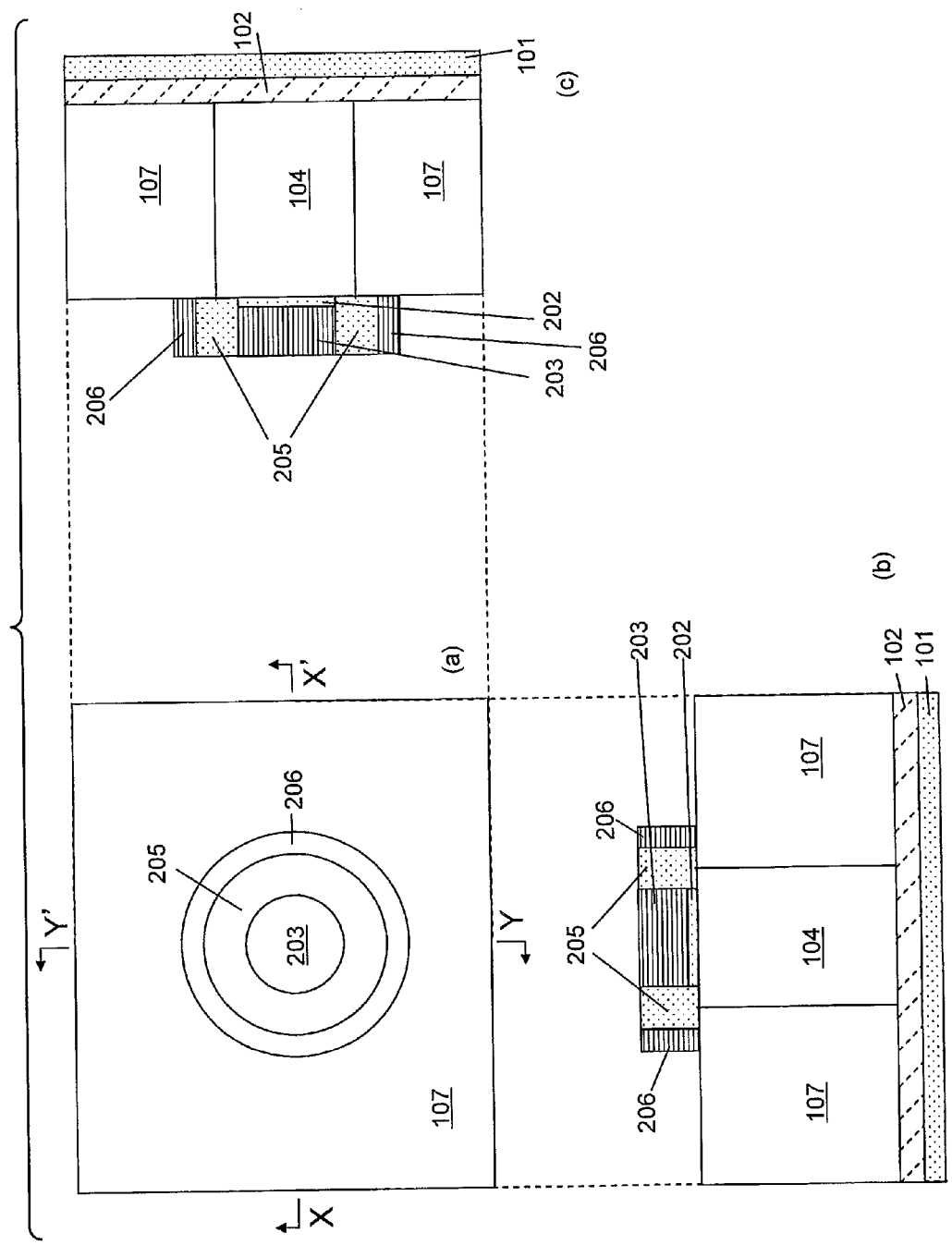

Referring to FIGS. 15(a) to 15(c), the nitride film 206 is etched to form a nitride film-based sidewall. This nitride film-based sidewall defines a position of the tubular silicon layer to be formed in a subsequent step.

Figure 16:
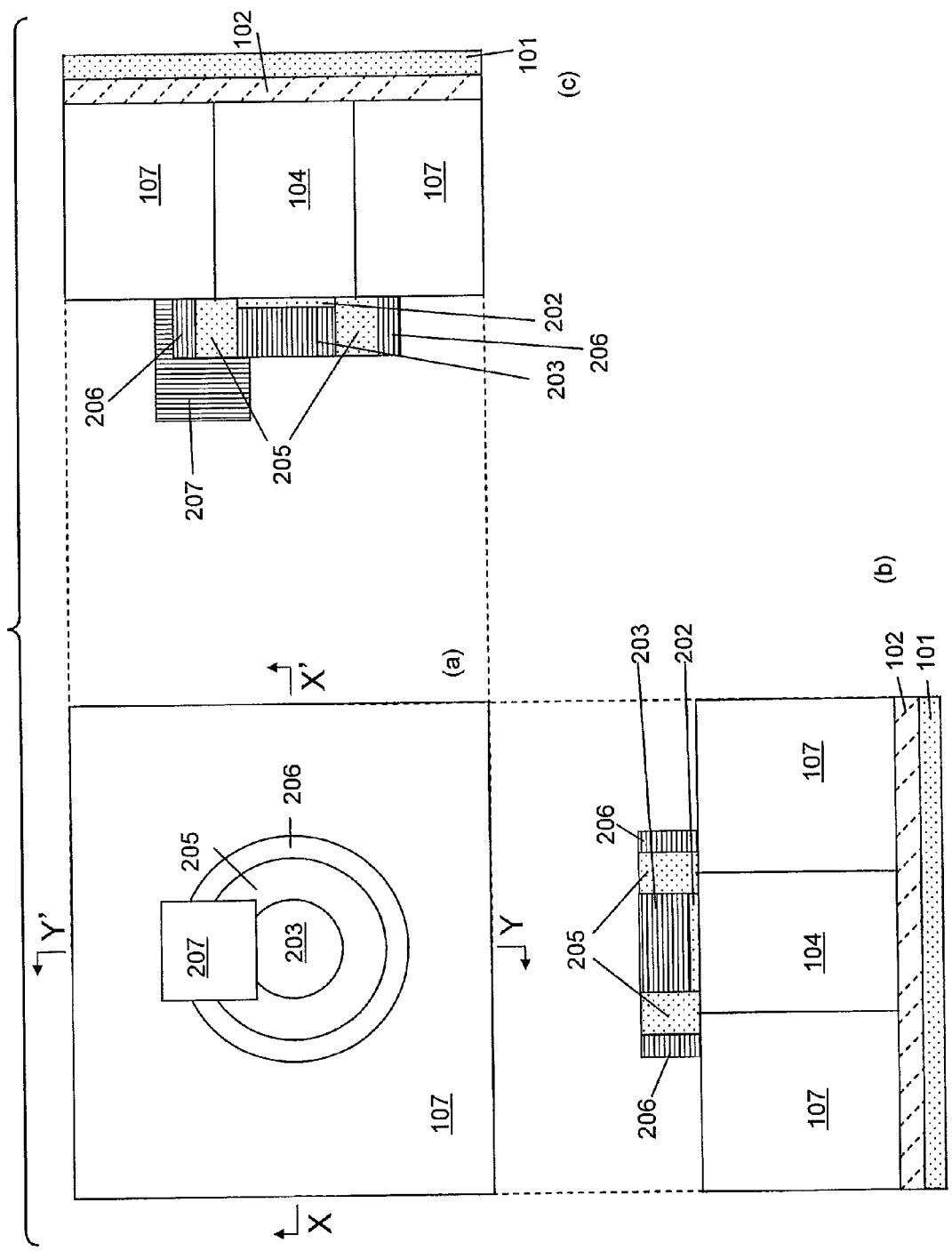

Referring to FIGS. 16(a) to 16(c), a resist 207 for forming an output terminal region is formed.

Figure 17:
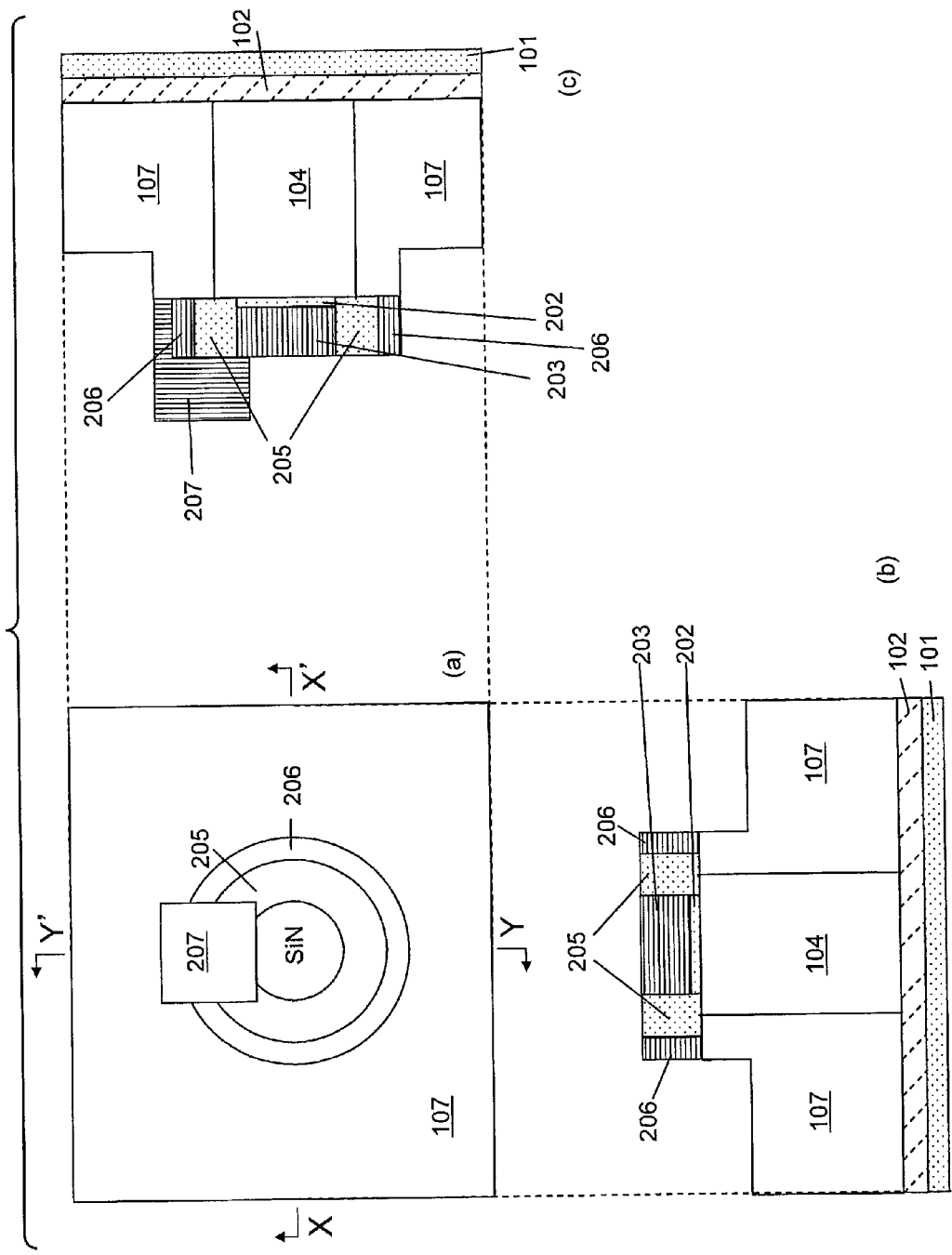

Referring to FIGS. 17(a) to 17(c), the n-type or non-doped silicon layer 107 is etched to form an output terminal region.

Figure 18:
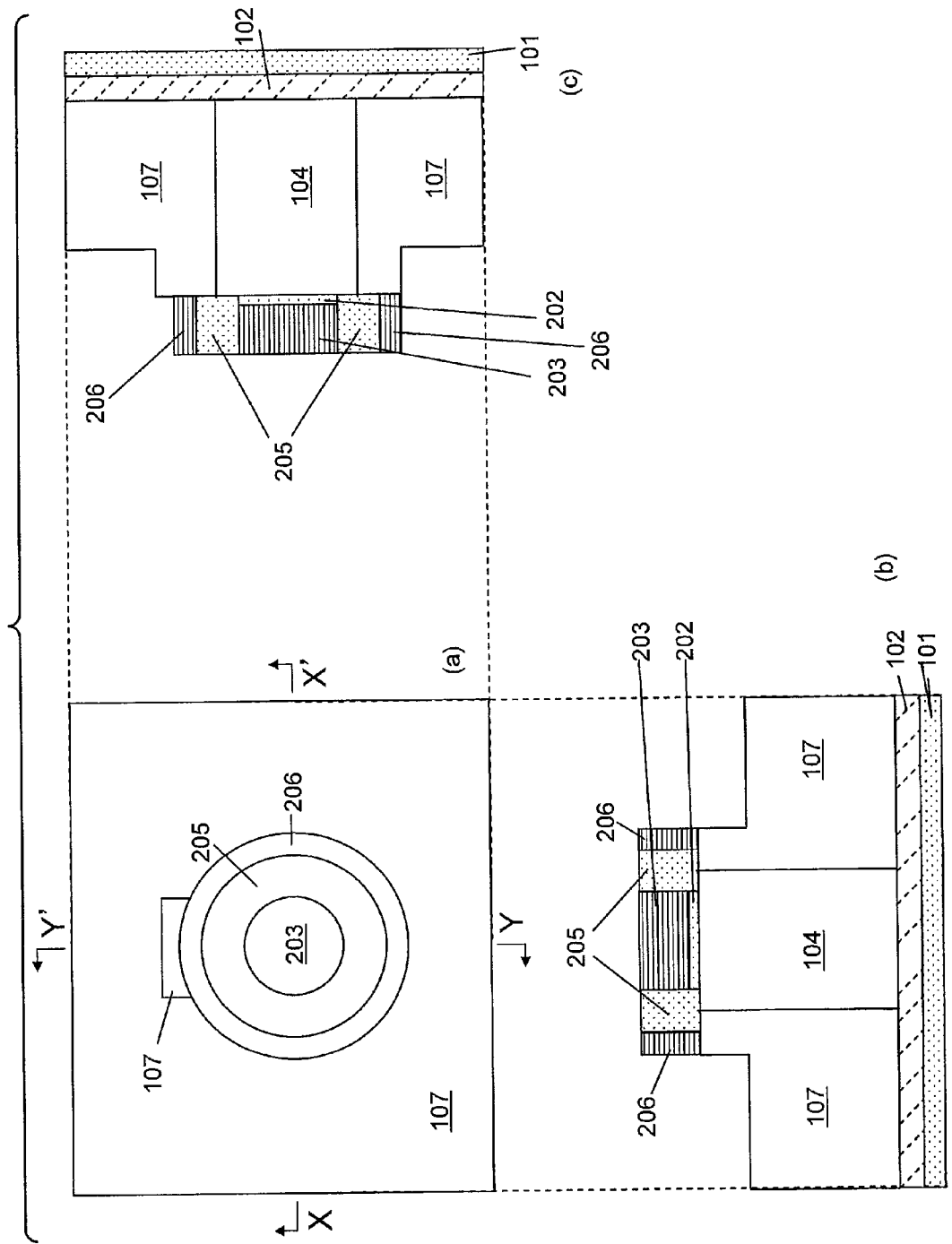

Referring to FIGS. 18(a) to 18(c), the resist 207 is stripped away.

Figure 19:
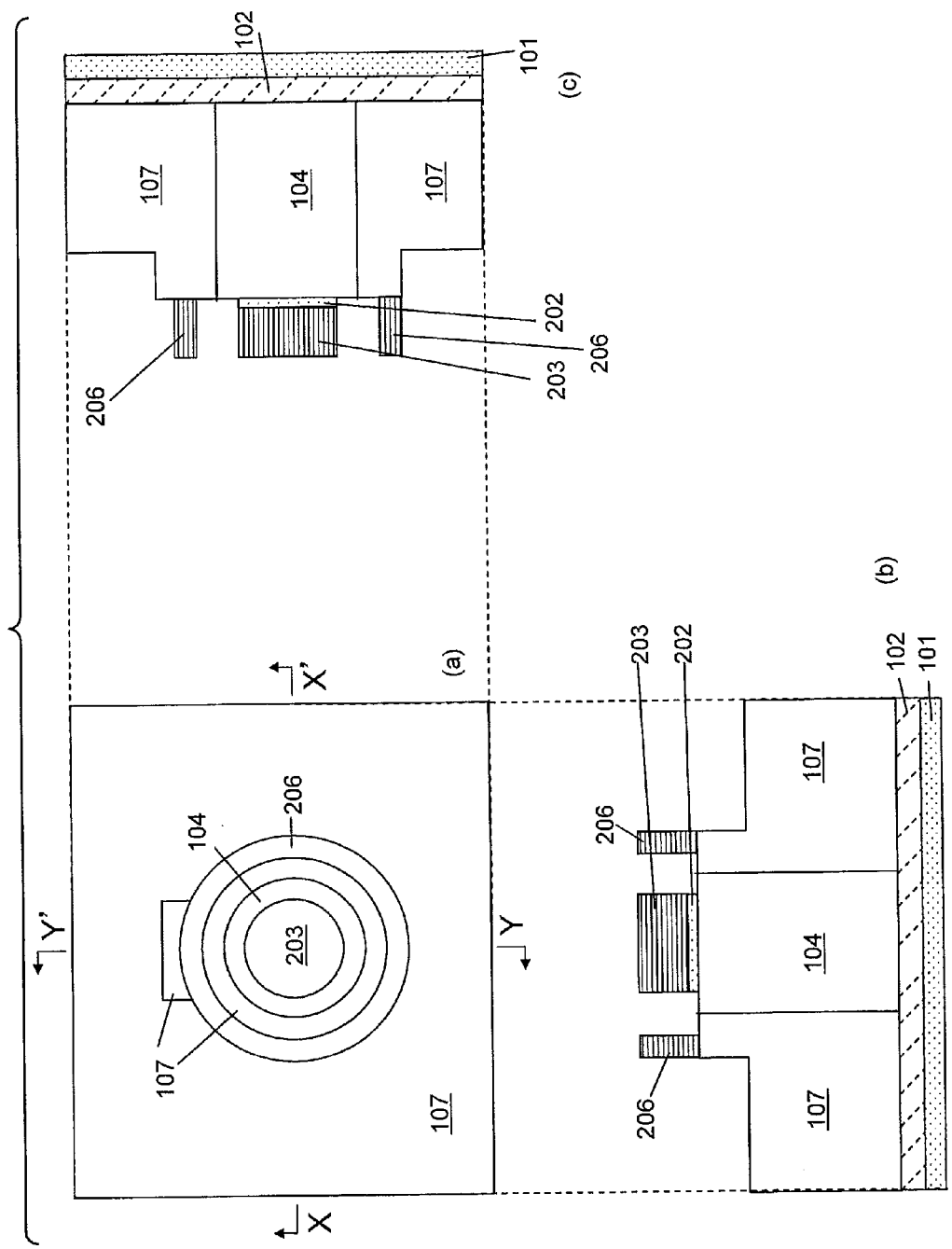

Referring to FIGS. 19(a) to 19(c), the oxide film-based sidewall 205 is etched away.

Figure 20:
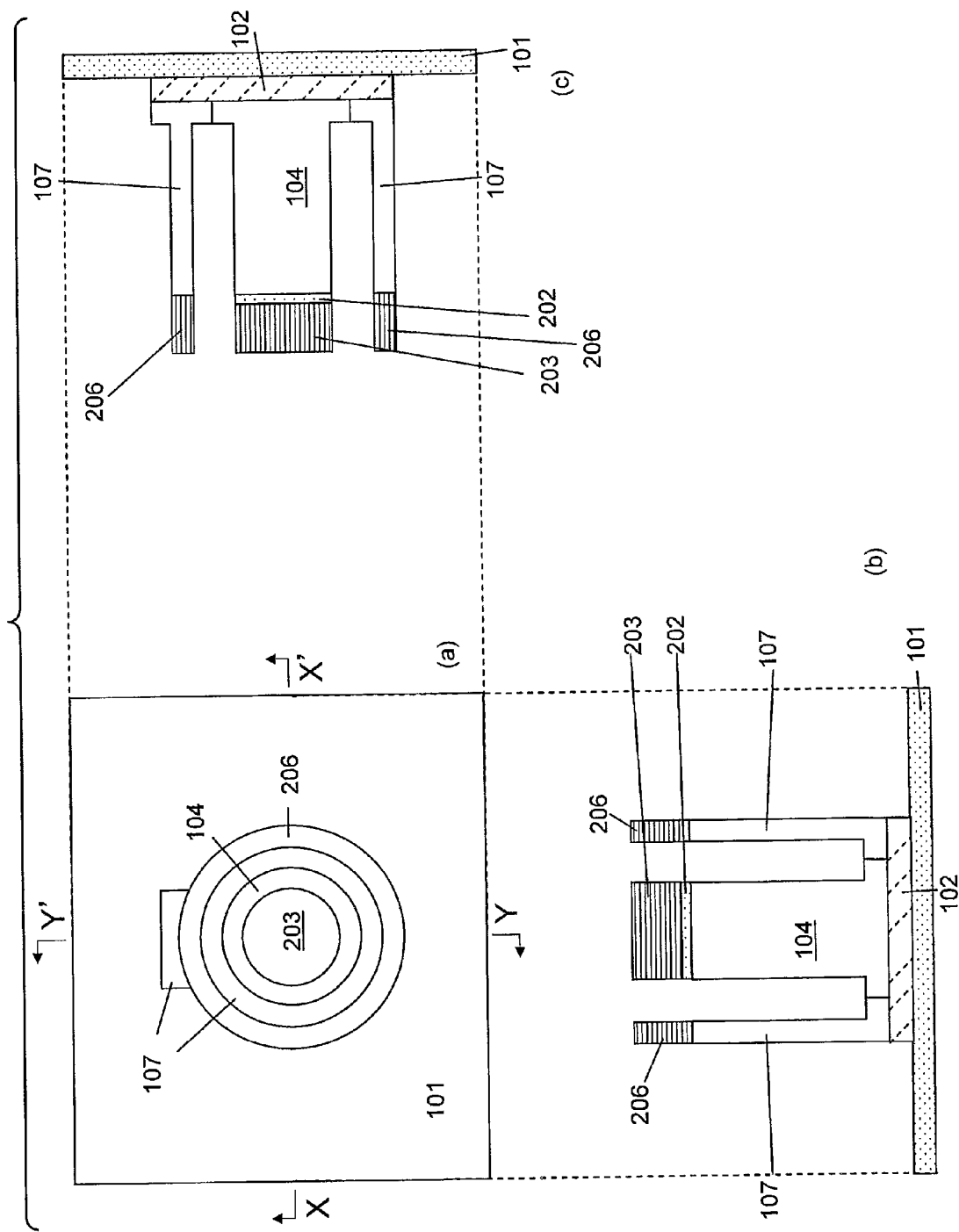

Referring to FIGS. 20(a) to 20(c), the p-type or non-doped silicon layer 104 and the n-type or non-doped silicon layer 107 are etched to form an island-shaped silicon layer 104 and a tubular silicon layer 107.

Figure 21:
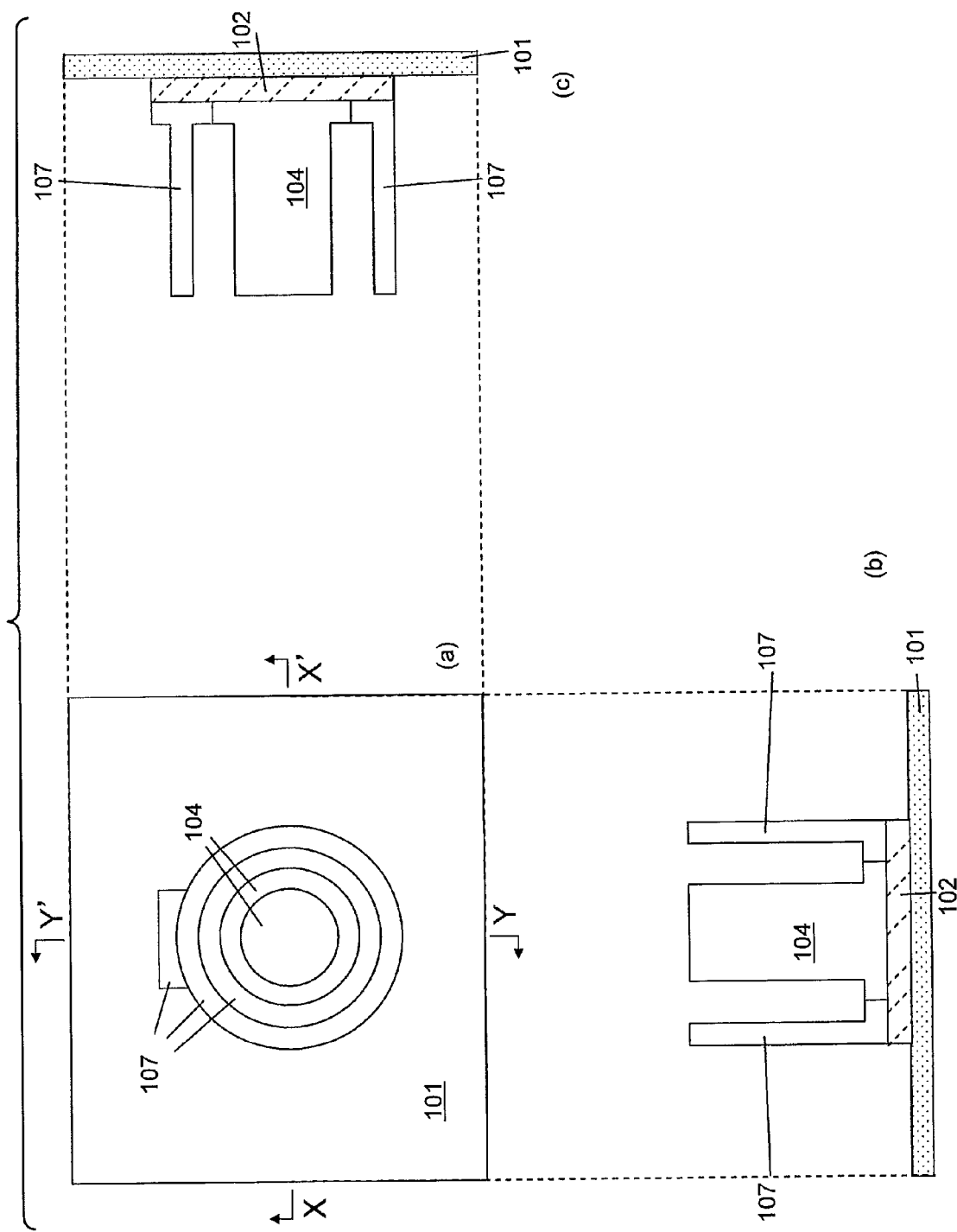

Referring to FIGS. 21(a) to 21(c), the nitride film 203, the nitride film-based sidewall 206 and the oxide film 202 are stripped away.

Figure 22:
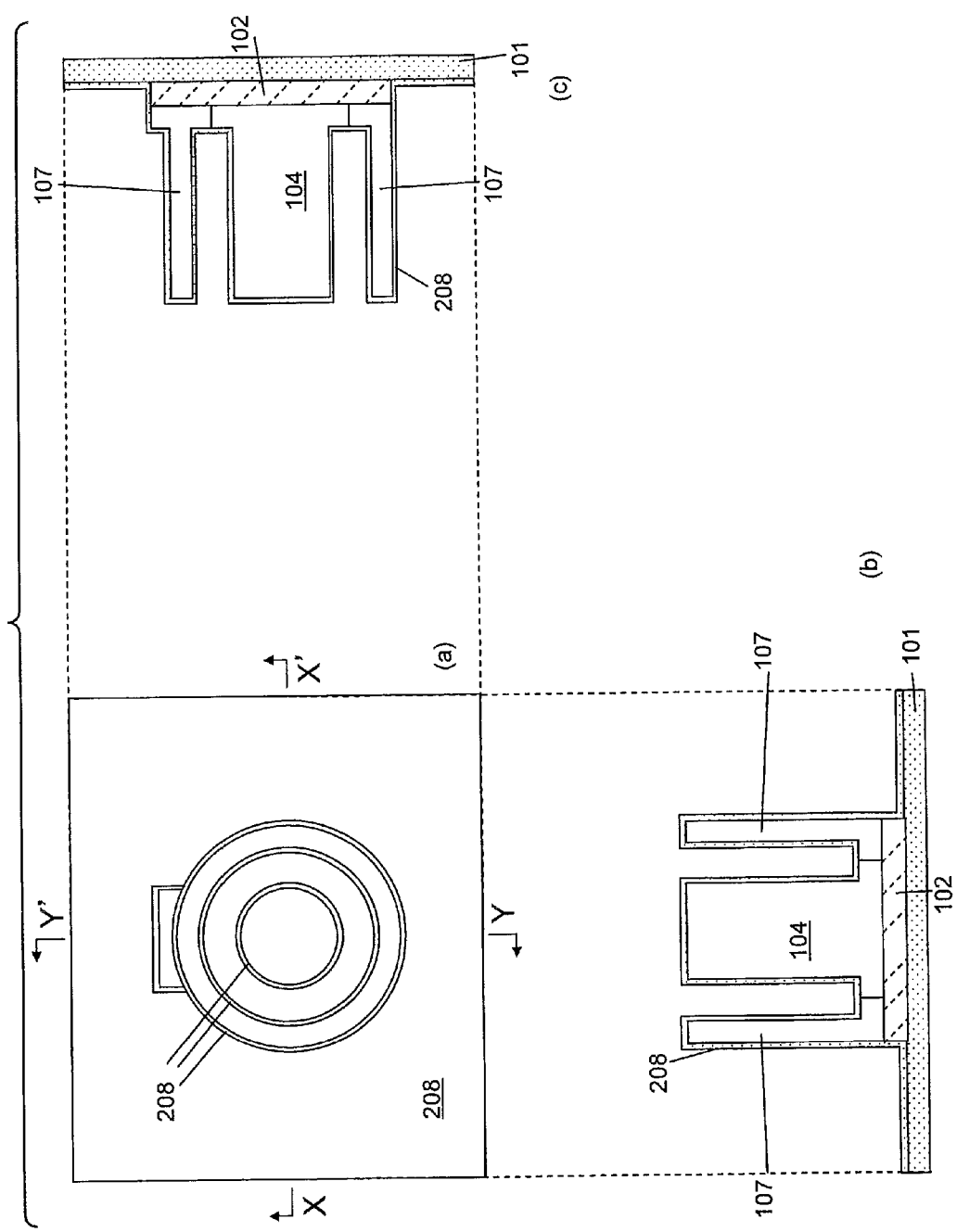

Referring to FIGS. 22(a) to 22(c), an oxide film 208 is deposited.

Figure 23:
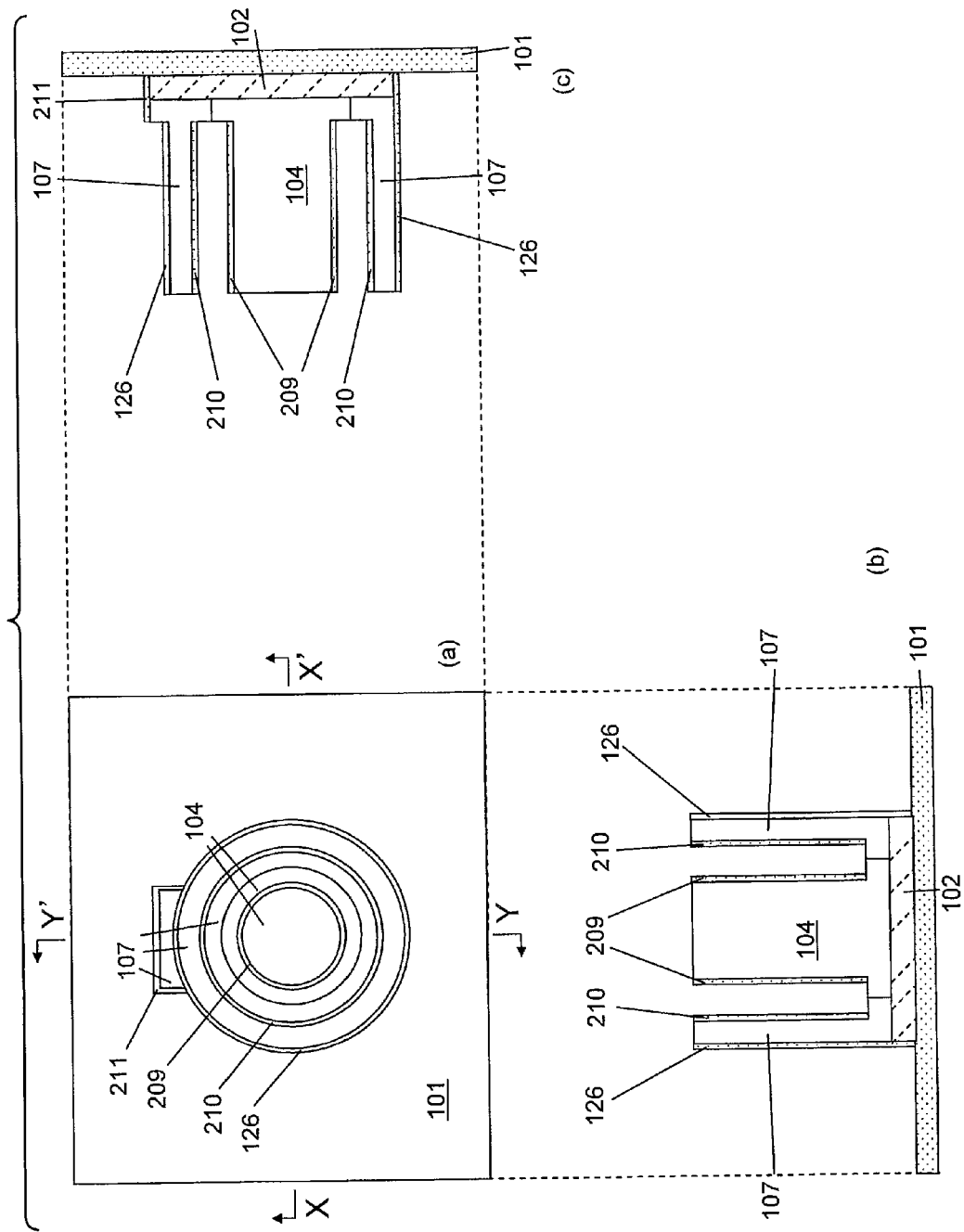

Referring to FIGS. 23(a) to 23(c), the oxide film 208 is etched to form oxide film-based sidewalls 126, 210, 209, 211 for protecting channels during ion implantation in a subsequent step.

Figure 24:
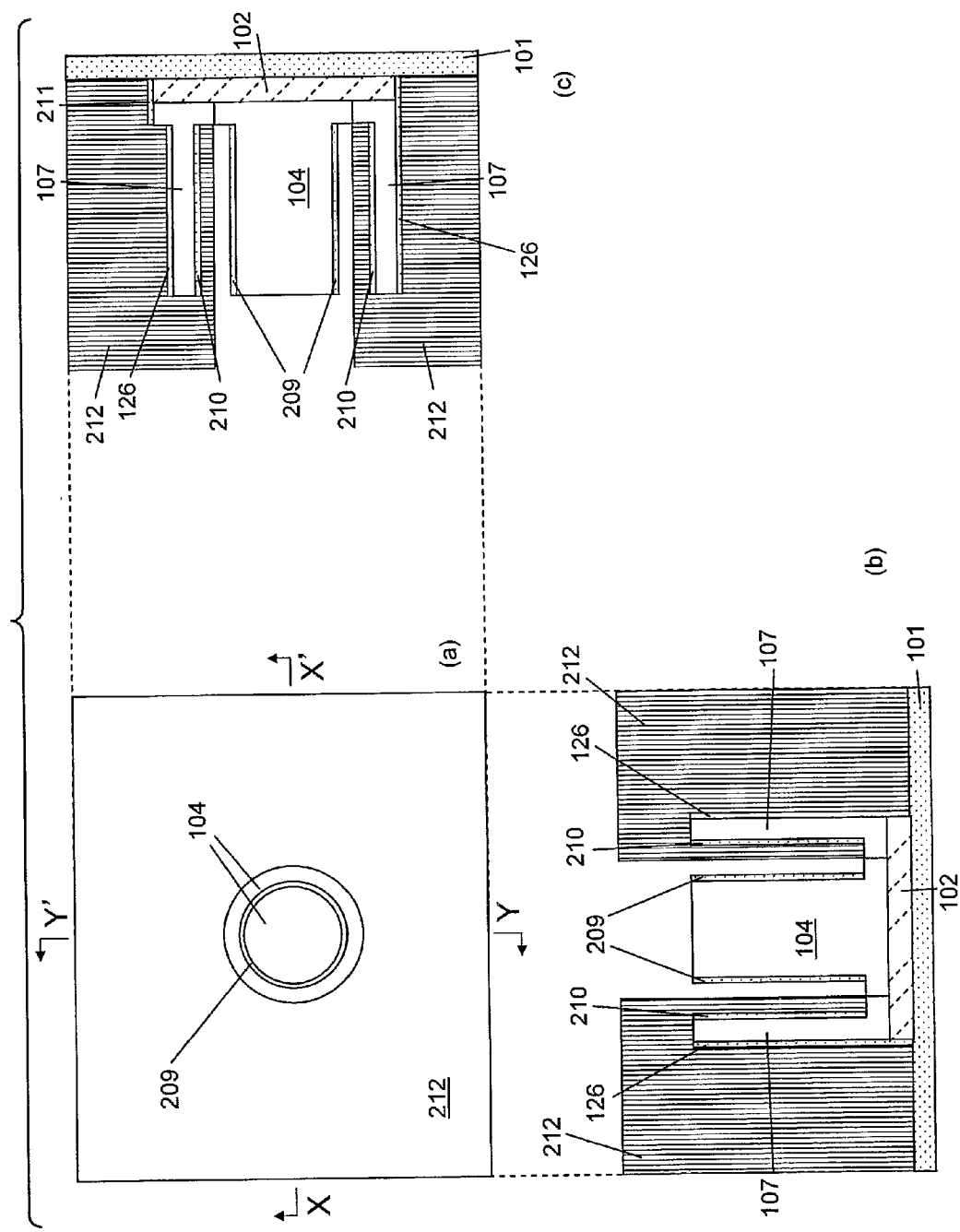

Referring to FIGS. 24(a) to 24(c), a resist 212 for forming first and second n+-type silicon layers is formed.

Figure 25:
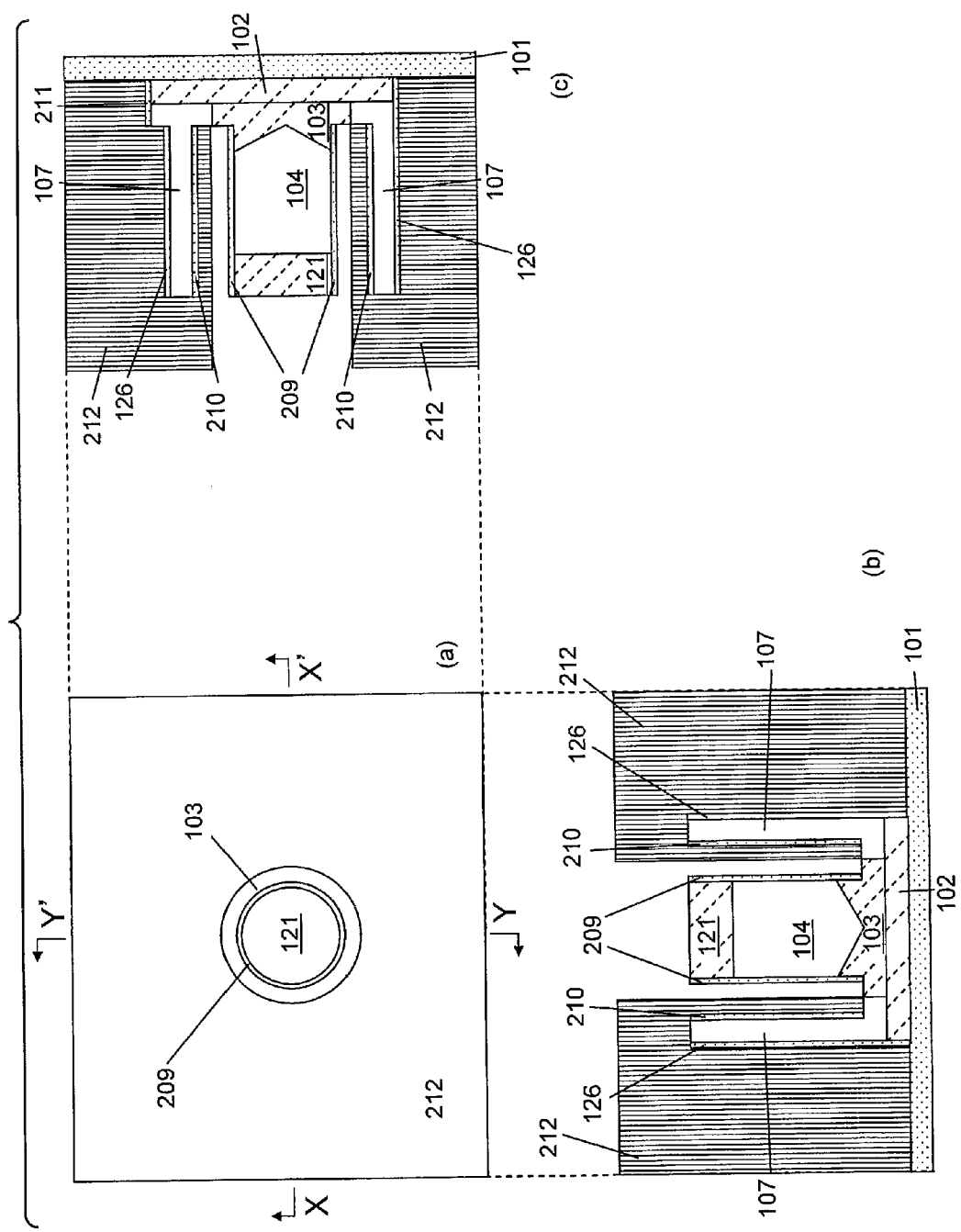

Referring to FIGS. 25(a) to 25(c), arsenic (As) is implanted into the island-shaped silicon layer 104 to form a first n+-type silicon layer 121 and a second n+-type silicon layer 103 in an upper portion and a lower portion thereof, respectively.

Figure 26:
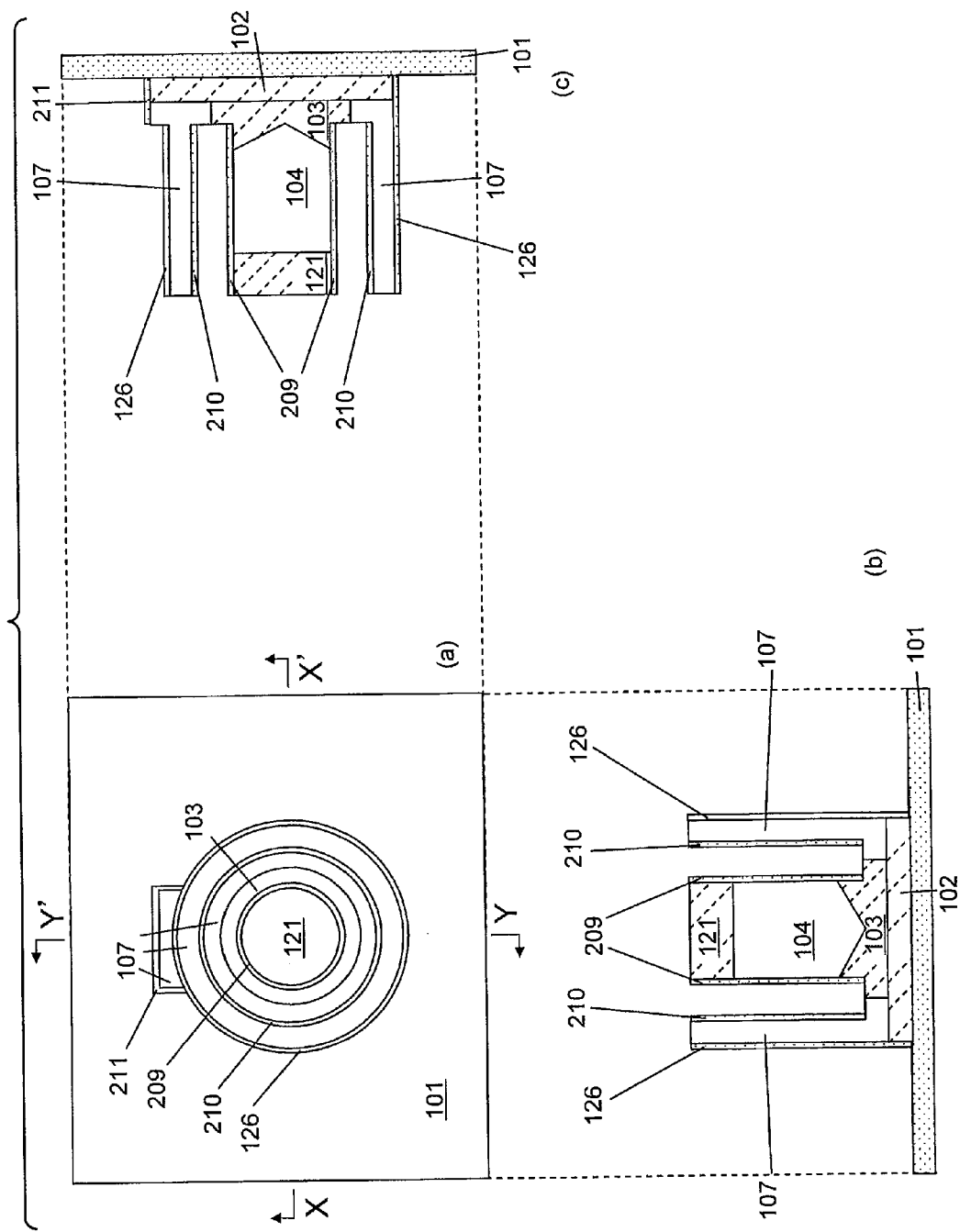

Referring to FIGS. 26(a) to 26(c), the resist 212 is stripped away.

Figure 27:
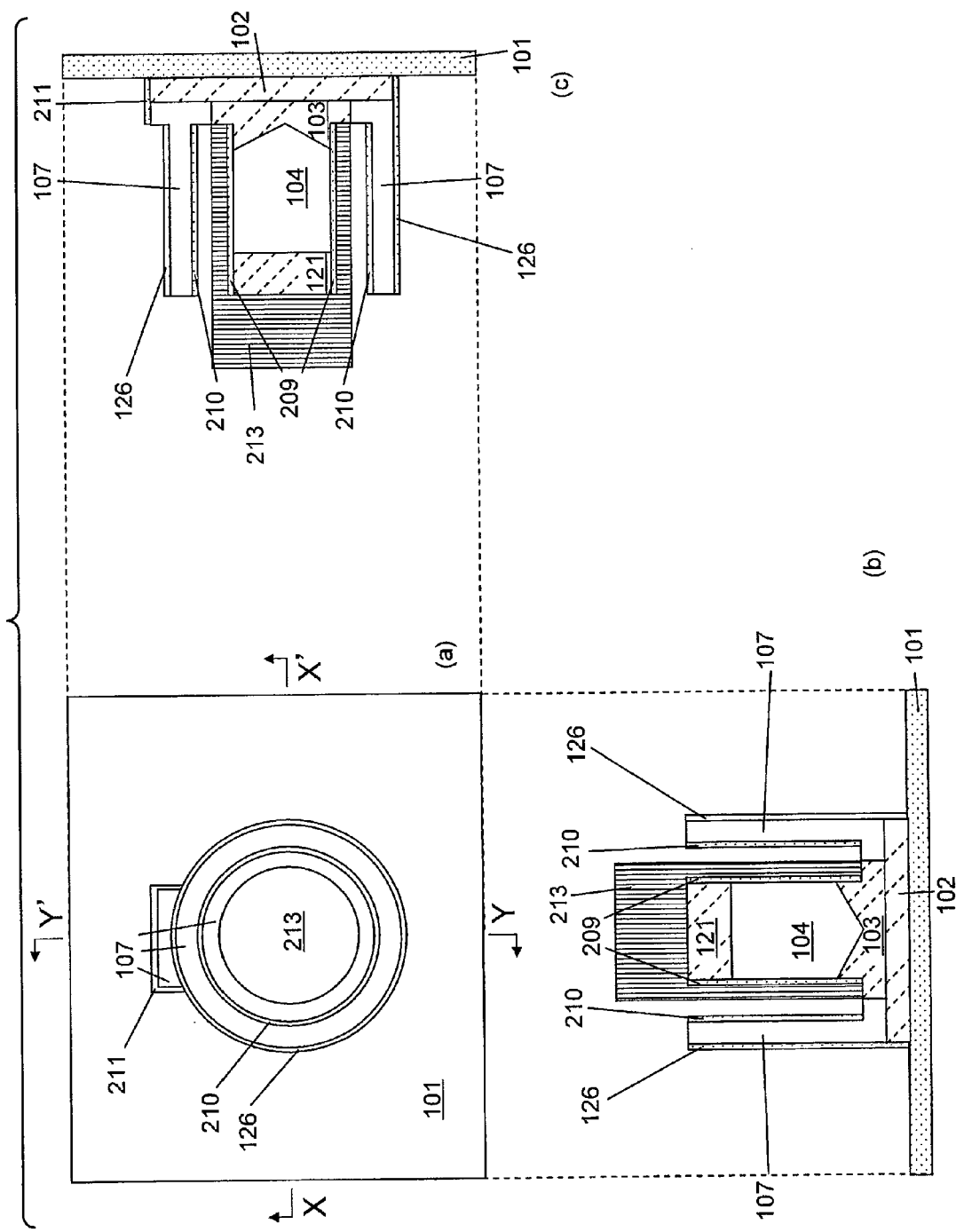

Referring to FIGS. 27(a) to 27(c), a resist 213 for forming first and second p+-type silicon layers is formed.

Figure 28:
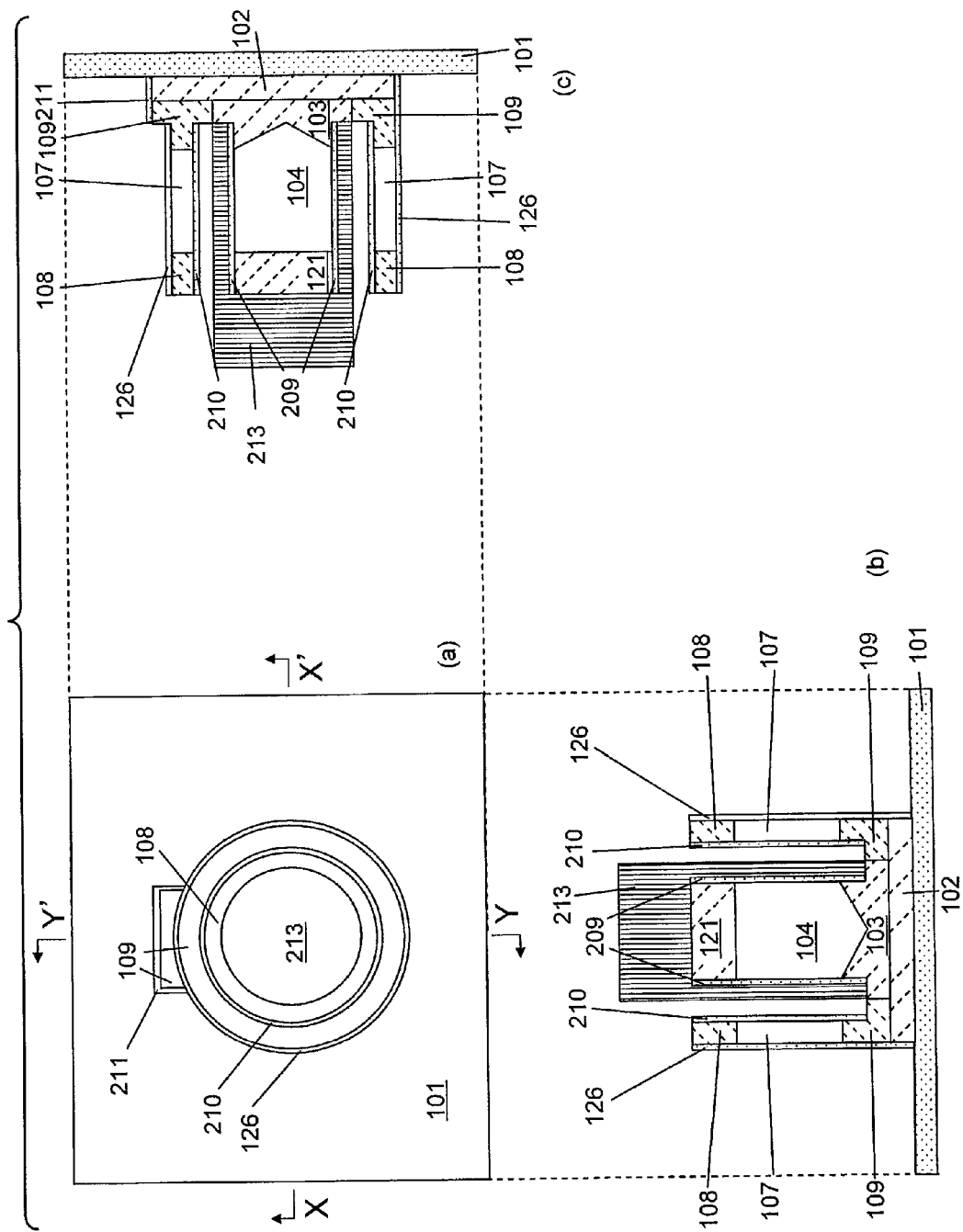

Referring to FIGS. 28(a) to 28(c), boron (B) is implanted into the tubular silicon layer 107 to form a first p+-type silicon layer 108 and a second p+-type silicon layer 109 in an upper portion and a lower portion thereof, respectively.

Figure 29:
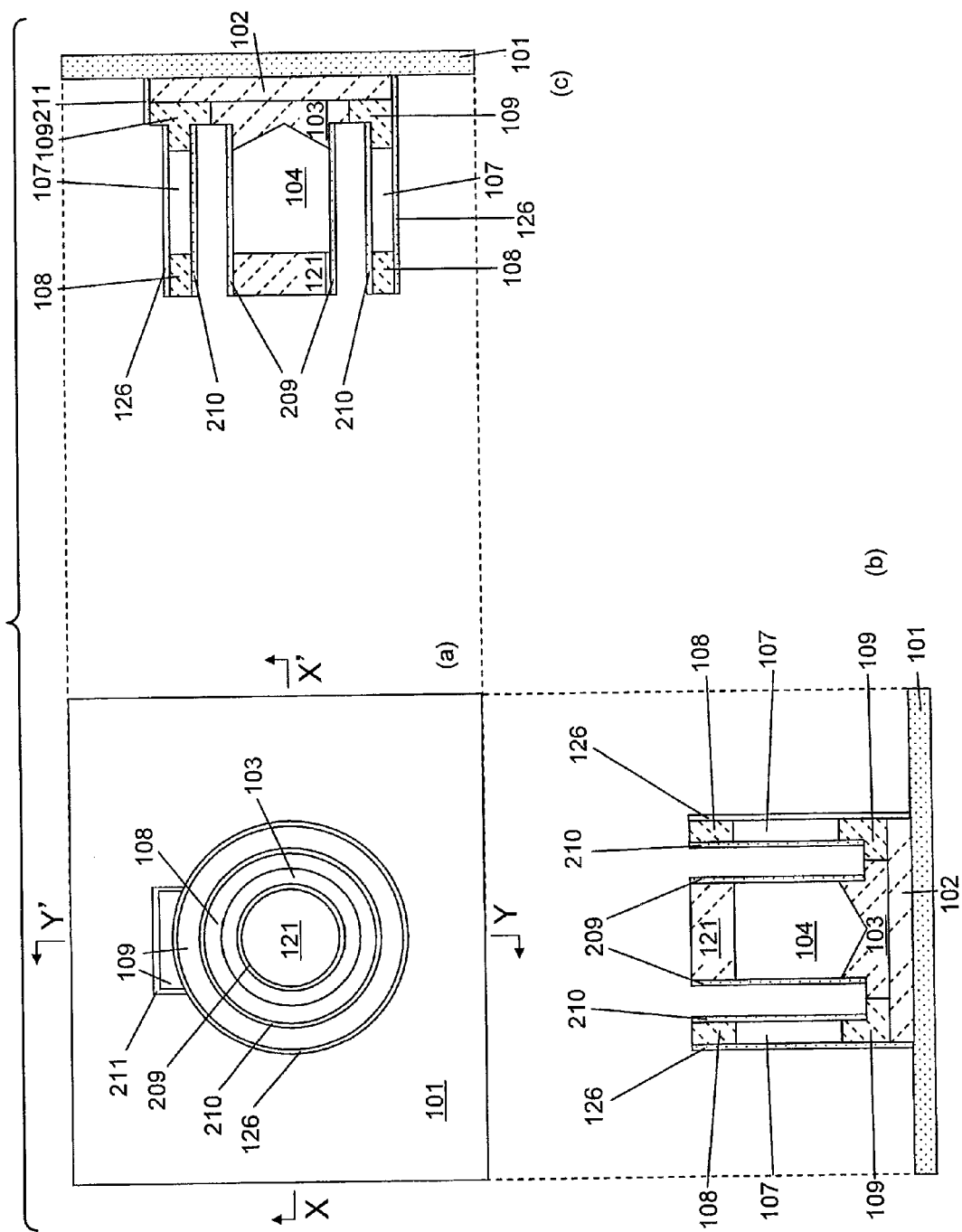

Referring to FIGS. 29(a) to 29(c), the resist 213 is stripped away, and then a heat treatment is performed.

Figure 30:
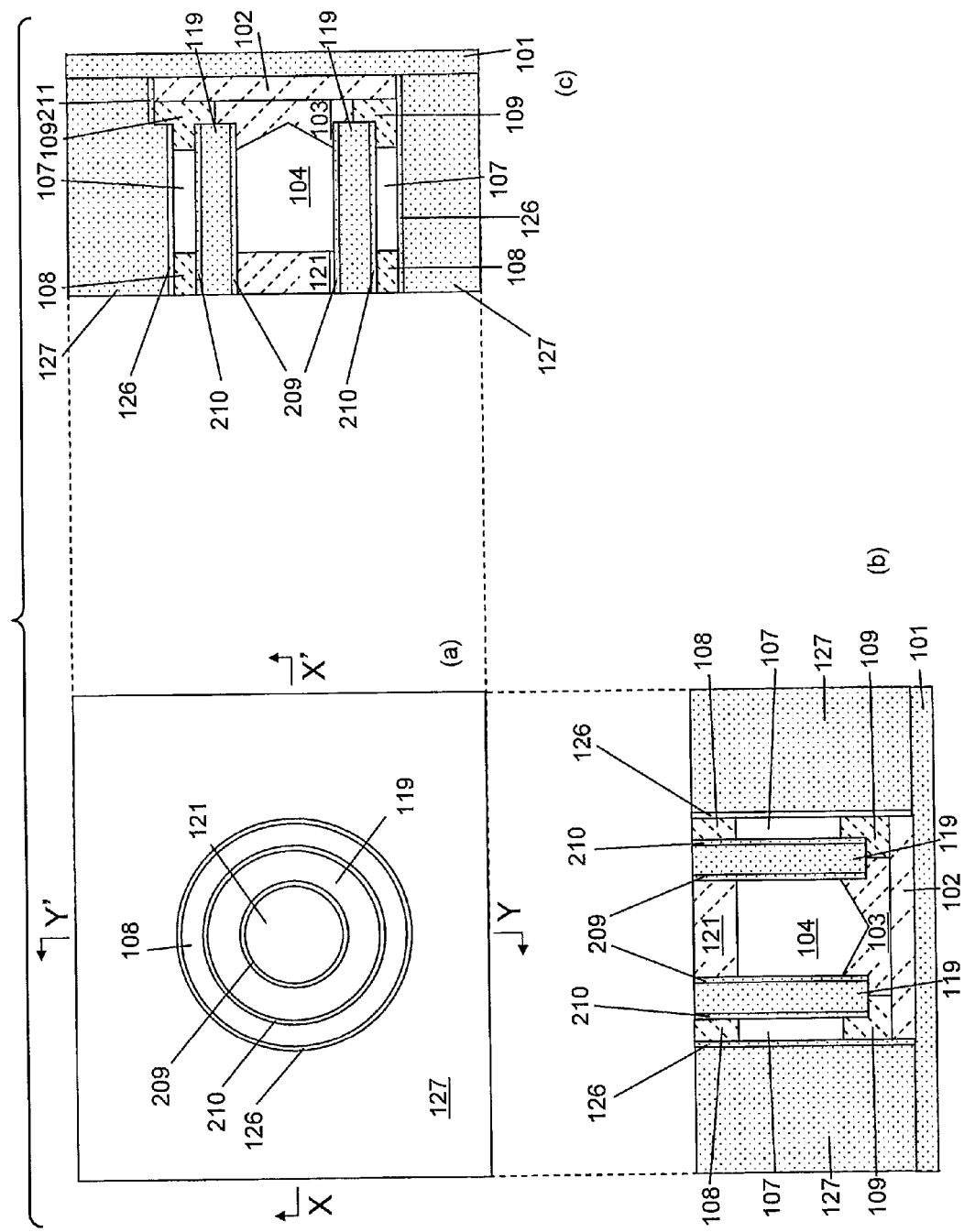

Referring to FIGS. 30(a) to 30(c), an oxide film is deposited, and then subjected to flattening and etching-back to expose the first n+-type silicon layer 121 and the first p+-type silicon layer 108. During this step, an oxide film 119 is formed on an inward side of the tubular silicon layer (i.e., in a gate-forming region).

Figure 31:
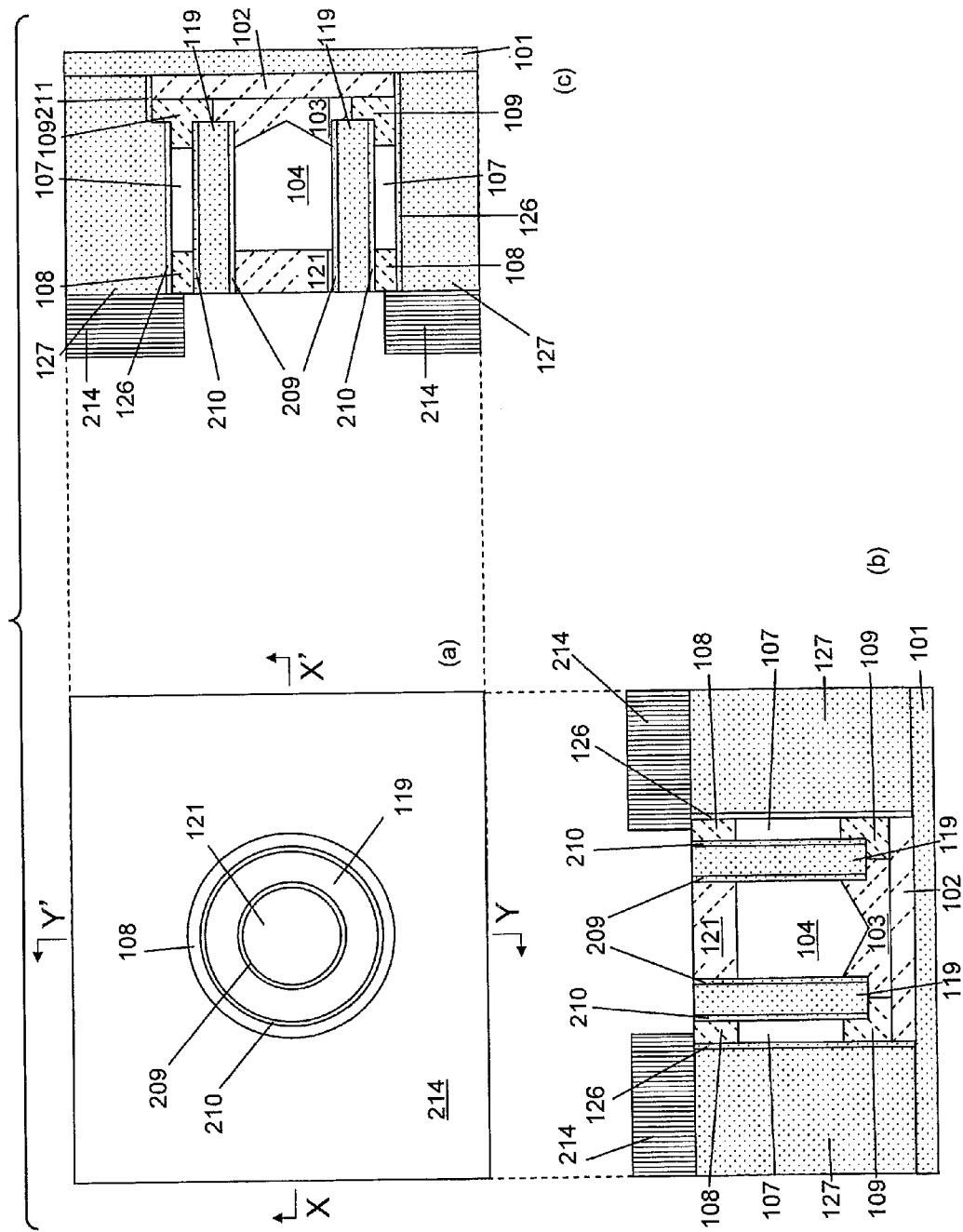

Referring to FIGS. 31(a) to 31(c), a resist 214 for etching the oxide film in the gate-forming region is formed.

Figure 32:
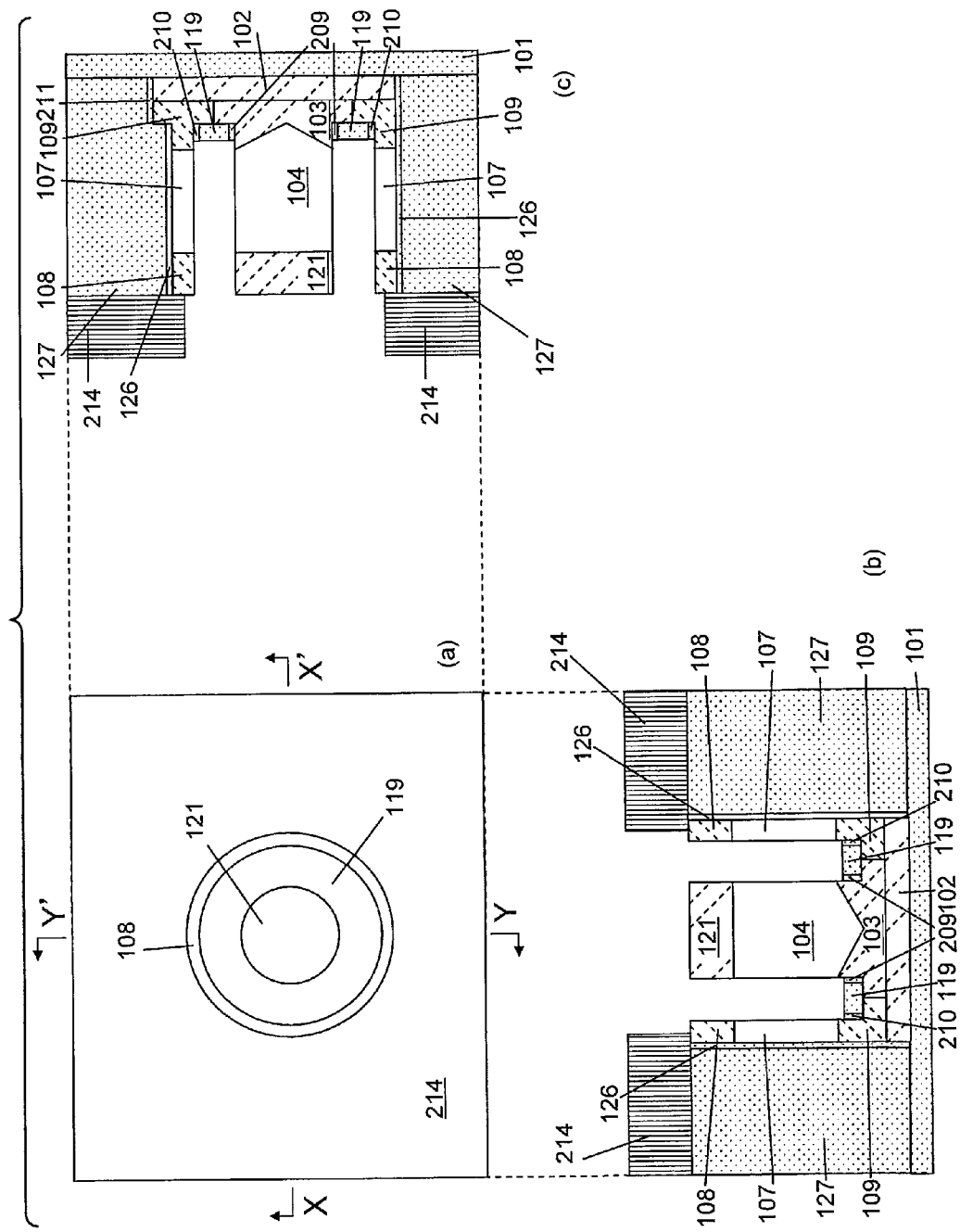

Referring to FIGS. 32(a) to 32(c), the oxide film 119 in the gate-forming region is etched.

Figure 33:
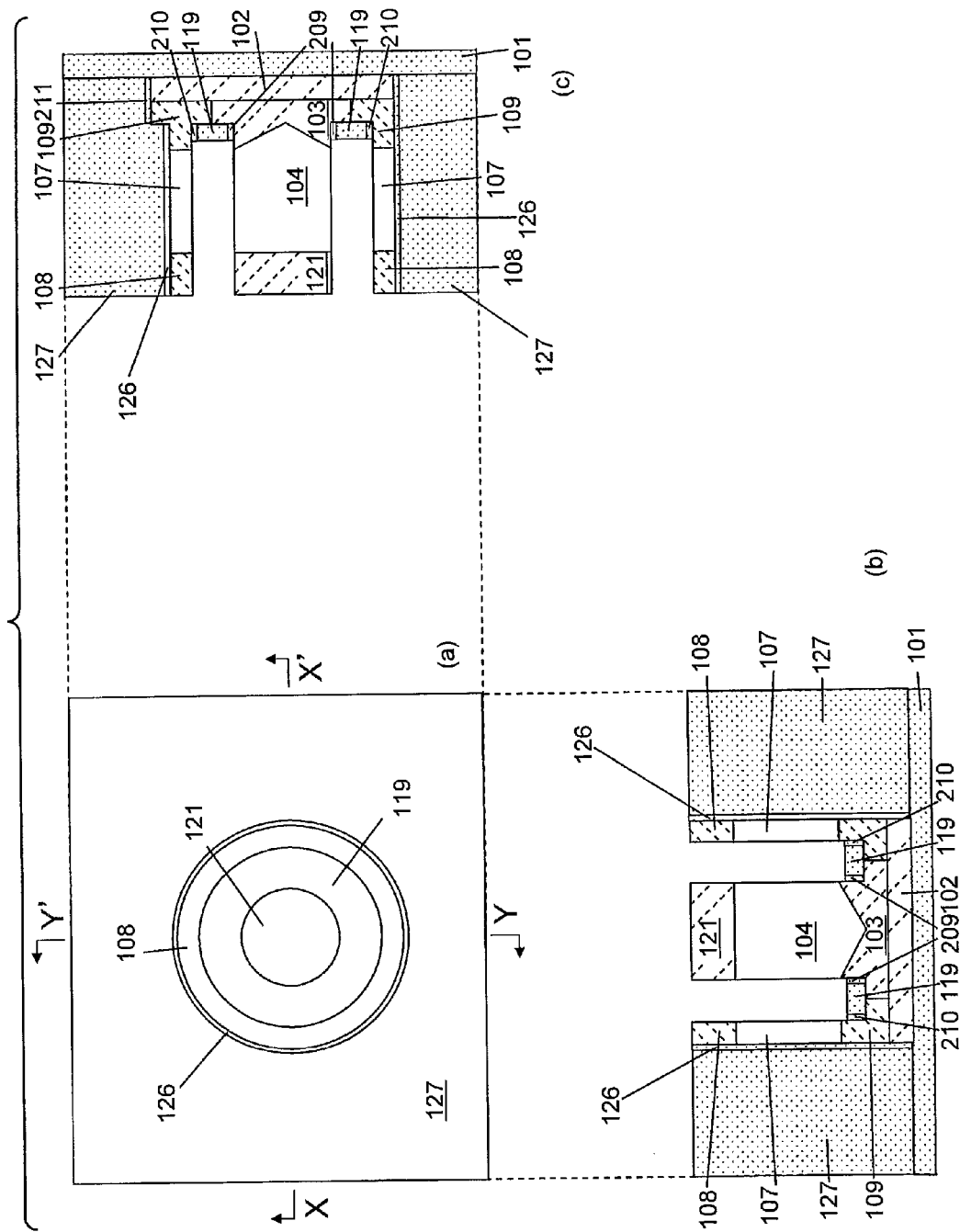

Referring to FIGS. 33(a) to 33(c), the resist 214 is stripped away.

Figure 34:
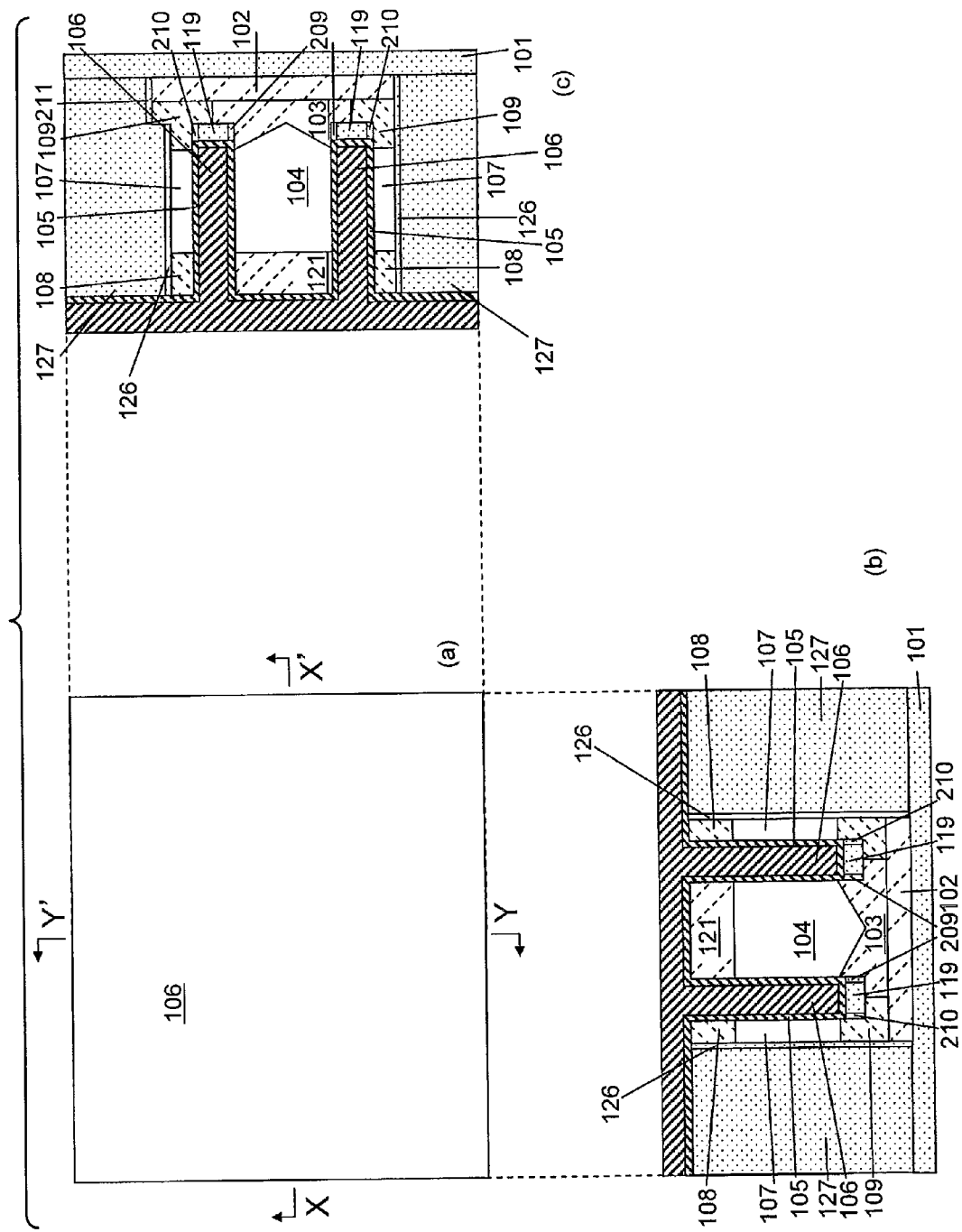

Referring to FIGS. 34(a) to 34(c), a high-k (high-dielectric constant) film 105, such as a hafnium oxide film, to be formed as first and second gate dielectric films, is deposited. Subsequently, a metal film 106, such as a titanium nitride film or a tantalum nitride film, to be formed as a gate electrode, is deposited and then flattened.

Referring to FIGS. 35(a) to 35(c), a nitride film 128 is deposited.

Referring to FIGS. 36(a) to 36(c), a resist 215 for forming a gate pad is formed.

Referring to FIGS. 37(a) to 37(c), the nitride film 128 is etched.

Referring to FIGS. 38(a) to 38(c), the resist 215 is stripped away.

Referring to FIGS. 39(a) to 39(c), the metal film is etched to form a gate electrode 106.

Referring to FIGS. 40(a) to 40(c), a nitride film 115 is deposited.

Referring to FIGS. 41(a) to 41(c), the nitride film 115 is etched to form a nitride film-based sidewall 115.

Referring to FIGS. 42(a) to 42(c), the high-k film is etched to form first and second gate dielectric films 105.

Referring to FIGS. 43(a) to 43(c), a resist 216 for etching the oxide film 127 is formed.

Referring to FIGS. 44(a) to 44(c), the oxide film 127 is dry-etched.

Referring to FIGS. 45(a) to 45(c), the resist 216 is stripped away.

Referring to FIGS. 46(a) to 46(c), the oxide film 127 is wet-etched to expose the second p+-type silicon layer 109.

Referring to FIGS. 47(a) to 47(c), a nitride film 120 is deposited.

Referring to FIGS. 46(a) to 46(c), the oxide film 127 is wet-etched to expose the second p+-type silicon layer 109.

Referring to FIGS. 47(a) to 47(c), a nitride film 120 is deposited.

Referring to FIGS. 48(a) to 48(c), the nitride film 120 is etched to form a nitride film-based sidewall.

Referring to FIGS. 49(a) to 49(c), the oxide film 127 is wet-etched to expose the third n+-type silicon layer 102.

Referring to FIGS. 50(a) to 50(c), a metal, such as nickel (Ni) or cobalt (Co), is deposited. Subsequently, the metal film is subjected to a heat treatment, and then an unreacted metal film is removed, so that a first silicon-metal compound layer 110, a second silicon-metal compound layer 112, and a third silicon-metal compound layer 111, are formed, respectively, in a part of sidewalls of the second p+-type silicon layer 109 and the third n+-type silicon layer 102, an upper portion of the first n+-type silicon layer 121, and an upper portion of the first p+-type silicon layer 108.

Referring to FIGS. 51(a) to 51(c), an oxide film 118 is formed as an interlayer film.

Referring to FIGS. 52(a) to 52(c), a contact hole 218, a contact hole 217, and a contact hole 219, are formed, respectively, on the second silicon-metal compound layer 112, the third silicon-metal compound layer 111, and the gate electrode 106.

Referring to FIGS. 53(a) to 53(c), a contact hole 220 is formed to expose the first silicon-metal compound layer 110.

Referring to FIGS. 54(a) to 54(c), a metal, such as tungsten, is deposited to form four contacts 113, 114, 122, 124.

Referring to FIGS. 55(a) to 55(c), an input terminal 123, an output terminal 125, a Vss power supply line 116 and a Vdd power supply line 117 are formed.

What is claimed is:
1. A method of producing the semiconductor device comprising:
   providing a semiconductor device including:
      an island-shaped silicon layer;
      a first gate dielectric film surrounding the island-shaped silicon layer;
      a gate electrode surrounding the first gate dielectric film;
      a second gate dielectric film surrounding the gate electrode;
      a tubular silicon layer surrounding the second gate dielectric film;
      a first n+-type diffusion layer disposed on a top of the island-shaped silicon layer;
      a second n+-type diffusion layer disposed underneath the island-shaped silicon layer;
      a first p+-type diffusion layer disposed on a top of the tubular silicon layer;
      a second p+-type diffusion layer disposed underneath the tubular silicon layer and directly contacting the second n+-type diffusion layer;
      a third n+-type diffusion layer directly contacting a bottom of the second n+-type diffusion layer and a bottom of the second p+-type diffusion layer; and
      a silicon-metal compound layer directly contacting a part where the second p+-type diffusion layer contacts the third n+-type diffusion layer,
   the method further comprising
      etching single-crystal silicon to form the island-shaped silicon layer and the tubular silicon layer.

2. A method of producing the semiconductor device comprising:
provinding a semiconductor device including:
an island-shaped silicon layer;
a first gate dielectric film surrounding the island-shaped silicon layer;
a gate electrode surrounding the first gate dielectric film;
a second gate dielectric film surrounding the gate electrode;
a tubular silicon layer surrounding the second gate dielectric film;
a first n+-type diffusion layer disposed on a top of the island-shaped silicon layer;
a second n+-type diffusion layer disposed underneath the island-shaped silicon layer;
a first p+-type diffusion layer disposed on a top of the tubular silicon layer;
a second p+-type diffusion layer disposed underneath the tubular silicon layer and directly contacting the second n+-type diffusion layer;
a third n+-type diffusion layer directly contacting a bottom of the second n+-type diffusion layer and a bottom of the second p+-type diffusion layer; and
a silicon-metal compound layer directly contacting a part where the second p+-type diffusion layer contacts the third n+-type diffusion layer,
the method further comprising:
depositing an oxide film on a silicon layer;
depositing a nitride film on the oxide film;
forming a resist for forming the island-shaped silicon layer;
etching the nitride film and the oxide film to form a nitride film-based hard mask for forming the island-shaped silicon layer;
stripping away the resist;
depositing an oxide film;
etching the oxide film to form an oxide film-based sidewall which defines a position of a gate-forming region to be subsequently formed;
depositing an nitride film; and
etching the nitride film to form a nitride film-based sidewall which defines a position of the tubular silicon layer to be subsequently formed.

3. The method as defined in claim 2, further comprising:
after the step of etching the nitride film, forming a resist for forming an output terminal region;
etching the silicon layer to form an output terminal region;
stripping away the resist;
etching away the oxide film-based sidewall; and
etching the silicon layer to form the island-shaped silicon layer and the tubular silicon layer.

4. A method of producing the semiconductor device comprising:
providing a semiconductor device including:
an island-shaped silicon layer;
a first gate dielectric film surrounding the island-shaped silicon layer;
a gate electrode surrounding the first gate dielectric film;
a second gate dielectric film surrounding the gate electrode;
a tubular silicon layer surrounding the second gate dielectric film;
a first n+-type diffusion layer disposed on a top of the island-shaped silicon layer;
a second n+-type diffusion layer disposed underneath the island-shaped silicon layer;
a first p+-type diffusion layer disposed on a top of the tubular silicon layer;
a second p+-type diffusion layer disposed underneath the tubular silicon layer and directly contacting the second n+-type diffusion layer;
a third n+-type diffusion layer directly contacting a bottom of the second n+-type diffusion layer and a bottom of the second p+-type diffusion layer; and
a silicon-metal compound layer directly contacting a part where the second p+-type diffusion layer contacts the third n+-type diffusion layer,
the method further comprising:
implanting impurity into a part directly contacting the bottom of the second n+-type diffusion layer and the bottom of the second p+-type diffusion layer; and
activating the implanted impurity to form the third n+-type diffusion.

5. A method of producing the semiconductor device comprising:
providing a semiconductor device including:
an island-shaped silicon layer;
a first gate dielectric film surrounding the island-shaped silicon layer;
a gate electrode surrounding the first gate dielectric film;
a second gate dielectric film surrounding the gate electrode; a tubular silicon layer surrounding the second gate dielectric film;
a first n+-type diffusion layer disposed on a top of the island-shaped silicon layer;
a second n+-type diffusion layer disposed underneath the island-shaped silicon layer;
a first p+-type diffusion layer disposed on a top of the tubular silicon layer;
a second p+-type diffusion layer disposed underneath the tubular silicon layer and directly contacting the second n+-type diffusion layer;
a third n+-type diffusion layer directly contacting a bottom of the second n+-type diffusion layer and a bottom of the second p+-type diffusion layer; and
a silicon-metal compound layer directly contacting a part where the second p+-type diffusion layer contacts with the third n+-type diffusion layer,
the method further comprising:
implanting impurity into a part in direct contact with an underneath of the island-shaped silicon layer and a top of the third n+-type diffusion layer;
activating the implanted impurity; and
forming the second n+-type diffusion layer underneath the island-shaped silicon layer so as to directly contact the top of the third n+-type diffusion layer.

6. A method of producing the semiconductor device which comprises:
providing a semiconductor device including:
an island-shaped silicon layer;
a first gate dielectric film surrounding the island-shaped silicon layer;
a gate electrode surrounding the first gate dielectric film;
a second gate dielectric film surrounding the gate electrode;
a tubular silicon layer surrounding the second gate dielectric film;
a first n+-type diffusion layer disposed on a top of the island-shaped silicon layer;
a second n+-type diffusion layer disposed underneath the island-shaped silicon layer;
a first p+-type diffusion layer disposed on a top of the tubular silicon layer;

a second p+-type diffusion layer disposed underneath the tubular silicon layer and directly contacting the second n+-type diffusion layer;

a third n+-type diffusion layer directly contacting a bottom of the second n+-type diffusion layer and a bottom of the second p+-type diffusion layer; and a silicon-metal compound layer directly contacting a part where the second p+-type diffusion layer contacts the third n+-type diffusion layer, the method further comprising:

forming the second p+-type diffusion layer underneath the tubular silicon layer by implanting impurity so as to directly contact the second n+-type diffusion layer and a top of the third n+-type diffusion layer.

7. A method of producing the semiconductor device which comprises:

providing a semiconductor device including:

an island-shaped silicon layer;

a first gate dielectric film surrounding the island-shaped silicon layer;

a gate electrode surrounding the first gate dielectric film;

a second gate dielectric film surrounding the gate electrode;

a tubular silicon layer surrounding the second gate dielectric film;

a first n+-type diffusion layer disposed on a top of the island-shaped silicon layer;

a second n+-type diffusion layer disposed underneath the island-shaped silicon layer;

a first p+-type diffusion layer disposed on a top of the tubular silicon layer;

a second p+-type diffusion layer disposed underneath the tubular silicon layer and directly contacting the second n+-type diffusion layer;

a third n+-type diffusion layer directly contacting a bottom of the second n+-type diffusion layer and a bottom of the second p+-type diffusion layer; and a silicon-metal compound layer directly contacting a part where the second p+-type diffusion layer contacts the third n+-type diffusion layer, the method further comprising:

depositing an oxide film and then flattening the oxide film;

forming a resist for etching the oxide film of a part where the gate electrode is formed;

etching a part of the oxide film where the gate electrode is formed;

stripping away the resist;

depositing the first and second gate dielectric films comprising a high-k film;

depositing a metal film, and then flattening the metal film;

depositing a nitride film;

forming a resist for forming the gate electrode;

etching the nitride film;

stripping away the resist; and etching the metal film to form the gate electrode.

8. A method of producing the semiconductor device which comprises:

providing a semiconductor device including:

an island-shaped silicon layer;

a first gate dielectric film surrounding the island-shaped silicon layer;

a gate electrode surrounding the first gate dielectric film;

a second gate dielectric film surrounding the gate electrode;

a tubular silicon layer surrounding the second gate dielectric film;

a first n+-type diffusion layer disposed on top of the island-shaped silicon layer;

a second n+-type diffusion layer disposed underneath the island-shaped silicon layer;

a first p+-type diffusion layer disposed on top of the tubular silicon layer;

a second p+-type diffusion layer disposed underneath the tubular silicon layer and directly contacting the second n+-type diffusion layer;

a third n+-type diffusion layer directly contacting a bottom of the second n+-type diffusion layer and a bottom of the second p+-type diffusion layer; and a silicon-metal compound layer directly contacting a part where the second p+-type diffusion layer contacts the third n+-type diffusion layer, the method further comprising:

forming a dielectric film-based sidewall on a periphery of the tubular silicon layer surrounding the second gate dielectric film; and forming a silicon-metal compound layer so as to directly contact a part where the second p+-type diffusion layer contacts the third n+-type diffusion layer.

* * * * *